(12) United States Patent
Takeshita et al.

(10) Patent No.: US 8,338,075 B2
(45) Date of Patent: Dec. 25, 2012

(54) POSITIVE RESIST COMPOSITION AND METHOD OF FORMING RESIST PATTERN

(75) Inventors: Masaru Takeshita, Kawasaki (JP); Shinji Kumada, Kawasaki (JP); Yasuhiro Yoshii, Kawasaki (JP); Takeshi Iwai, Kawasaki (JP); Tsuyoshi Nakamura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 517 days.

(21) Appl. No.: 12/534,735

(22) Filed: Aug. 3, 2009

(65) Prior Publication Data

US 2010/0047724 A1    Feb. 25, 2010

(30) Foreign Application Priority Data

Aug. 4, 2008 (JP) ............... P2008-201159
Dec. 2, 2008 (JP) ............... P2008-308036
Feb. 20, 2009 (JP) ............... P2009-038662
Jul. 30, 2009 (JP) ............... P2009-178437

(51) Int. Cl.
  *G03F 7/004* (2006.01)
  *G03F 7/30* (2006.01)
(52) U.S. Cl. ............... 430/270.1; 430/312; 430/326; 430/910
(58) Field of Classification Search ............... 430/270.1, 430/312, 326, 910
  See application file for complete search history.

(56) References Cited

U.S. PATENT DOCUMENTS

| | | | |
|---|---|---|---|
| 4,394,437 A * | 7/1983 | Bergendahl et al. ......... | 430/312 |
| 5,945,517 A | 8/1999 | Nitta et al. | |
| 6,153,733 A | 11/2000 | Yukawa et al. | |
| 6,379,860 B1 * | 4/2002 | Fujimori et al. ........... | 430/270.1 |
| 7,074,543 B2 | 7/2006 | Iwai et al. | |
| 7,312,016 B2 * | 12/2007 | Koitabashi et al. ........ | 430/270.1 |
| 7,316,885 B2 * | 1/2008 | Hada et al. ................. | 430/270.1 |
| 7,776,511 B2 * | 8/2010 | Takeshita et al. .......... | 430/270.1 |
| 2005/0277052 A1 * | 12/2005 | Feiring et al. .............. | 430/270.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2005-325325 | 11/2005 |
| WO | WO 2004/074242 | 9/2004 |

OTHER PUBLICATIONS

Ebihara et al., Beyond $k_1$=0.25 lithography : 70nm L/S patterning using KrF scanners, Proceedings of SPIE, vol. 5256, 23rd Annual BACUS Symposium on Photomask Technology, pp. 985 to 994, (2003).

Borodovsky, Yan, "Marching to the beat of Moore's Law," Proceedings of SPIE, vol. 6153, pp. 615301-1 to 615301-19, (2006).

* cited by examiner

*Primary Examiner* — John Chu
(74) *Attorney, Agent, or Firm* — Knobbe Martens Olson & Bear LLP

(57) ABSTRACT

A positive resist composition including: a base component (A) which exhibits increased solubility in an alkali developing solution under the action of acid; and an acid-generator component (B) which generates acid upon exposure; dissolved in an organic solvent (S), the organic solvent (S) including an alcohol-based organic solvent having a boiling point of at least 150° C.; and a method of forming a resist pattern including: applying the positive resist composition on a substrate on which a first resist pattern is formed to form a second resist film; and subjecting the second resist film to selective exposure and alkali developing to form a resist pattern.

9 Claims, 2 Drawing Sheets

US 8,338,075 B2

POSITIVE RESIST COMPOSITION AND METHOD OF FORMING RESIST PATTERN

TECHNICAL FIELD

The present invention relates to a positive resist composition and a method of forming a resist pattern. Priority is claimed on Japanese Patent Application No. 2008-201159, filed Aug. 4, 2008, Japanese Patent Application No. 2008-308036, filed Dec. 2, 2008, Japanese Patent Application No. 2009-038662, filed Feb. 20, 2009, and Japanese Patent Application No. 2009-178437, filed Jul. 30, 2009, the contents of which are incorporated herein by reference.

BACKGROUND ART

In lithography techniques, for example, a resist film composed of a resist material is formed on a substrate, and the resist film is subjected to selective exposure to radiation such as a light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under the action of acid and an acid generator that generates acid upon exposure dissolved in an organic solvent. For example, a chemically amplified positive resist includes, as a base resin, a resin that exhibits increased solubility in an alkali developing solution under the action of acid, and an acid generator, dissolved in an organic solvent. In the formation of a resist pattern, when acid is generated from the acid generator upon exposure, the exposed portions become soluble in an alkali developing solution.

Until recently, polyhydroxystyrene (PHS) or derivative resins thereof in which the hydroxyl groups are protected with acid dissociable, dissolution inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1).

Further, resist compositions in which the aforementioned acrylic resins are dissolved in an organic solvent, such as propylene glycol monomethyl ether acetate (PGMEA), propylene glycol monomethyl ether (PGME), cyclohexanone, 2-heptanone and ethyl lactate (EL) are now widely used as resists that use ArF excimer laser lithography.

In the meantime, as the miniaturization of resist patterns has progressed in recent years, a double patterning process has been proposed, as one of the lithography techniques in order to further improve the resolution, in which a resist pattern is formed by conducting a patterning process twice or more (for example, refer to Non-Patent Documents 1 and 2).

According to the double patterning process, for example, a first resist pattern is formed on a substrate by forming a resist film using a first resist composition and patterning the resist film, followed by formation of a resist film using a second resist composition on the substrate on which the first resist pattern is formed, and patterning of the resist film. As a result, a resist pattern can be formed with a higher level of resolution than that of the resist pattern formed through one single patterning process.

In the double patterning process, the first resist pattern is likely to be adversely affected during the application of the second resist composition. That is, problems such as the following arise. For example, a portion of, or all of the first resist pattern is dissolved by the solvent for the second resist composition, thereby causing thickness loss or the like, which deteriorates the shape of the resist pattern. Moreover, so-called mixing occurs in which the first resist pattern and the second resist composition dissolve within each other, making it impossible to form a resist pattern with an excellent shape.

It is thought that such problems can be solved by using a resist composition that uses an organic solvent in which the first resist pattern hardly dissolves, as the second resist composition. Accordingly, when using a positive resist composition as the first resist composition, a negative resist composition hitherto has been widely used as the second resist composition which has a low compatibility with the positive resist composition and which also uses an organic solvent, such as an alcohol-based organic solvent, thus providing excellent solubility for the resist materials.

DOCUMENTS OF THE RELATED ART

Patent Documents

[Patent Document 1] Japanese Unexamined Patent Application, First Publication No. 2003-241385

Non-Patent Documents

[Non-Patent Document 1] Proceedings of SPIE (U.S.), vol. 5256, pp. 985-994 (2003)
[Non-Patent Document 2] Proceedings of SPIE (U.S.), vol. 6153, pp. 1-19 (2006)

SUMMARY OF THE INVENTION

On the other hand, if a positive resist composition is used as the second resist composition as well as the first resist composition, the first resist pattern dissolves when a conventional positive resist composition is directly applied onto the first resist pattern. Therefore, it is necessary to protect the first resist pattern by using a freezing agent or the like, which results in the increased number of steps and poor workability as compared to the case where a negative resist composition is used.

As a countermeasure against such problems, the use of a positive resist composition as the second resist composition which uses an alcohol-based organic solvent has been considered.

However, when an alcohol-based organic solvent is used as an organic solvent for the conventional positive resist composition, resist materials such as the aforementioned acrylic resins exhibit unsatisfactory solubility in the solvent and precipitate over time, which results in poor storage stability of the positive resist composition.

The present invention takes the above circumstances into consideration, with an object of providing a positive resist composition in which a resist material exhibits excellent solubility, and a method of forming a resist pattern that uses the positive resist composition.

For solving the above-mentioned problems, the present invention employs the following aspects.

Specifically, a first aspect of the present invention is a positive resist composition including: a base component (A) which exhibits increased solubility in an alkali developing solution under the action of acid; and an acid-generator component (B) which generates acid upon exposure; dissolved in an organic solvent (S), wherein the organic solvent (S) includes an alcohol-based organic solvent having a boiling point of at least 150° C.

A second aspect of the present invention is a method of forming a resist pattern, including: applying a positive resist composition on a substrate to form a first resist film on the substrate; subjecting the first resist film to selective exposure and alkali developing to form a first resist pattern; applying the positive resist composition of the first aspect on the substrate on which the first resist pattern is formed to form a second resist film; and subjecting the second resist film to selective exposure and alkali developing to form a resist pattern.

In the present description and claims, the term "alkyl group" includes linear, branched or cyclic monovalent saturated hydrocarbon groups, unless otherwise specified.

The term "alkylene group" includes linear, branched or cyclic divalent saturated hydrocarbon groups, unless otherwise specified.

A "lower alkyl group" is an alkyl group of 1 to 5 carbon atoms.

A "halogenated alkyl group" is a group in which a part or all of the hydrogen atoms of an alkyl group are substituted with halogen atoms. Examples of halogen atoms include fluorine atoms, chlorine atoms, bromine atoms and iodine atoms.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

According to the positive resist composition of the present invention, resist materials exhibit excellent solubility.

Further, according to the method of forming a resist pattern that uses the positive resist composition of the present invention, a resist pattern having a high level of resolution and excellent shape can be formed with minimal adverse effects on the first resist pattern during the double patterning process. Furthermore, there is no need to use a freezing agent or the like, which results in improved workability.

PREFERRED EMBODIMENTS OF THE INVENTION

Positive Resist Composition

Figure 1:
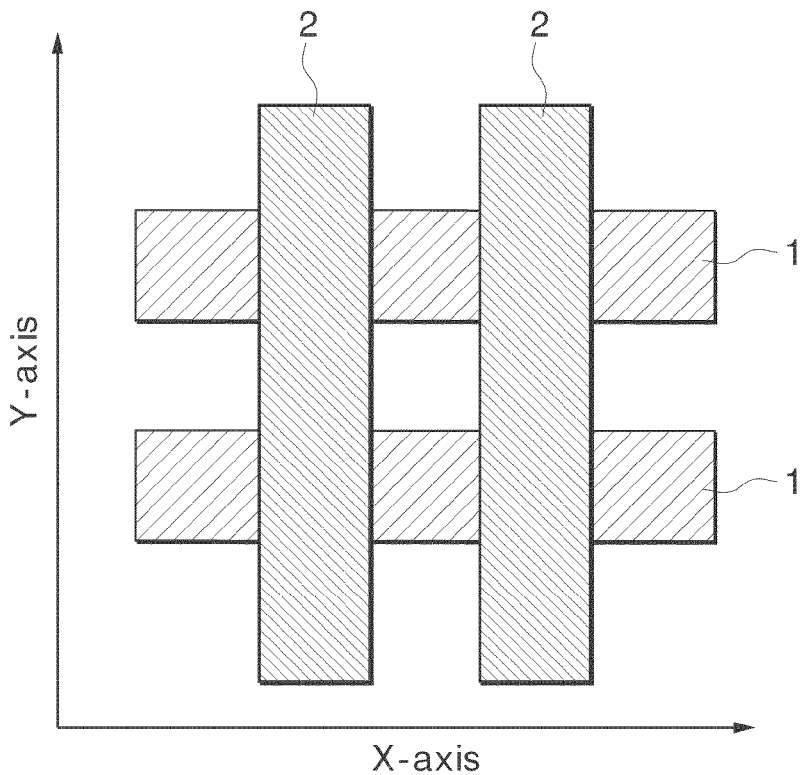
FIG. 1 is a schematic plan view showing an example of a crossline pattern formed by a double patterning process. The schematic diagram shows a line and space (L/S) pattern 2 in the vertical direction formed with the second positive resist composition by assuming that the first L/S pattern 1 does not exist.

The positive resist composition of the present invention includes a base component (A) (hereafter, referred to as "component (A)") which exhibits increased solubility in an alkali developing solution under the action of acid and an acid-generator component (B) (hereafter, referred to as "component (B)") which generates acid upon exposure, dissolved in an organic solvent (S) (hereafter, referred to as "component (S)"), wherein the organic solvent (S) includes an alcohol-based organic solvent having a boiling point of at least 150° C.

In the positive resist composition of the present invention, the component (A) is insoluble in an alkali developing solution prior to exposure, and when the acid generated from the component (B) by exposure acts upon the component (A), and the solubility of the entire component (A) in an alkali developing solution increases, the entire component (A) changes from an alkali-insoluble state to an alkali-soluble state. Therefore, in the formation of a resist pattern, by conducting selective exposure of a resist film formed by using the positive resist composition onto a substrate, the exposed portions become alkali-soluble, whereas the unexposed portions remain alkali-insoluble, and hence, a resist pattern can be formed by alkali developing.

<Component (A)>

In the positive resist composition of the present invention, the component (A) may be a resin component (A1) which exhibits increased solubility in an alkali developing solution under the action of acid (hereafter, frequently referred to as "component (A1)"), a low molecular weight compound (A2)

which exhibits increased solubility in an alkali developing solution under the action of acid (hereafter, frequently referred to as "component (A2)"), or a mixture of the component (A1) and the component (A2).

Of these, the component (A) preferably includes the component (A1).

[Component (A1)]

As the component (A1), a resin component (base resin) typically used as a base component for a chemically amplified resist composition can be used alone, or two or more of such resin components can be mixed together.

In the present invention, it is preferable that the component (A1) include a structural unit derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

In the acrylate ester, specific examples of the lower alkyl group for the substituent at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated lower alkyl group include groups in which part or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group, and more preferably a hydrogen atom, a lower alkyl group or a fluorinated lower alkyl group, be bonded to the α-position of the acrylate ester. In terms of industrial availability, a hydrogen atom or a methyl group is particularly desirable.

In the positive resist composition of the present invention, it is particularly desirable that the component (A1) include a structural unit (a1) derived from an acrylate ester containing an acid dissociable, dissolution inhibiting group.

Further, it is preferable that the component (A1) further include a structural unit (a2) derived from an acrylate ester containing a lactone-containing cyclic group, as well as the structural unit (a1).

Moreover, it is preferable that the component (A1) further include a structural unit (a0-1) represented by general formula (a0-1) shown below, as well as the structural unit (a1), or the structural unit (a1) and the structural unit (a2).

Furthermore, it is preferable that the component (A1) further include a structural unit (a0-2) represented by general formula (a0-2) shown below, as well as the structural unit (a1), the structural units (a1) and (a2), the structural units (a1) and (a0-1), or the structural units (a1), (a2) and (a0-1).

Also, the component (A1) may further include a structural unit other than the above-mentioned structural units (a1), (a2), (a0-1) and (a0-2), as well as the structural unit (a1).

Structural Unit (a1)

The structural unit (a1) is a structural unit derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by the action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity.

The "aliphatic branched, acid dissociable, dissolution inhibiting group" is not limited to be constituted of only carbon and hydrogen (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include a lower alkyl group of 1 to 5 carbon atoms, a lower alkoxy group of 1 to 5 carbon atoms, a fluorine atom, a fluorinated lower alkyl group of 1 to 5 carbon atoms which is substituted by a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be mentioned. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cyclic alkyl group can be mentioned. Specific examples include a 2-methyl-2-adamantyl group and a 2-ethyl-2-adamantyl group. Alternatively, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, such as the groups bonded to the carbonyloxy group (—C(O)—O—) in the structural units represented by general formulas (a1"-1) to (a1"-6) shown below, may also be mentioned.

[Chemical Formula 1.]

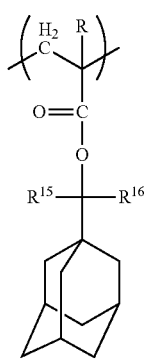

(a1"-1)

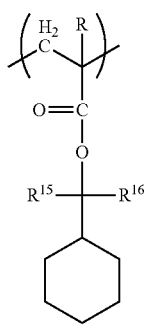

(a1"-2)

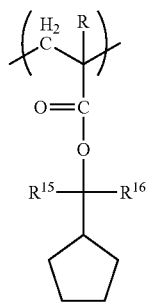

(a1"-3)

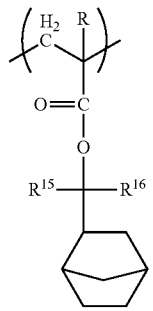

(a1"-4)

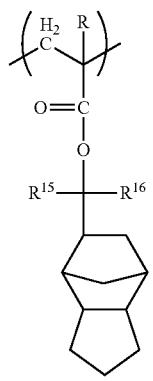

(a1"-5)

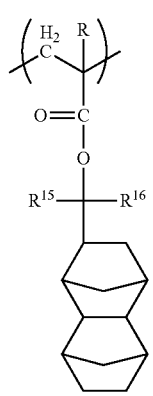

(a1"-6)

wherein R represents a hydrogen atom, a lower alkyl group or a halogenated lower alkyl group; and $R^{15}$ and $R^{16}$ each represents an alkyl group (which may be linear or branched, and preferably has 1 to 5 carbon atoms).

In general formulas (a1"-1) to (a1"-6) above, the lower alkyl group or halogenated lower alkyl group for R is the same as the lower alkyl group or halogenated lower alkyl group which may be bonded to the α-position of the aforementioned acrylate ester.

An "acetal-type acid dissociable, dissolution inhibiting group" generally substitutes a hydrogen atom at the terminal of an alkali-soluble group such as a carboxyl group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 2.]

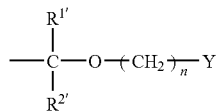

(p1)

wherein $R^{1'}$ and $R^{2'}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same as the lower alkyl groups for R above can be mentioned. As the lower alkyl group for $R^{1'}$ and $R^{2'}$, a methyl group or an ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) be a group represented by general formula (p1-1) shown below.

[Chemical Formula 3.]

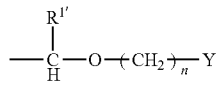

(p1-1)

wherein $R^{1'}$, n and Y are as defined above.

As the lower alkyl group for Y, the same as the lower alkyl groups for R above can be mentioned.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be mentioned.

Further, as the acetal-type, acid dissociable, dissolution inhibiting group, groups represented by general formula (p2) shown below can also be mentioned.

[Chemical Formula 4.]

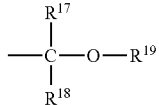

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be mentioned. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 5.]

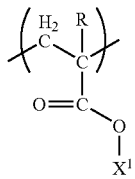

(a1-0-1)

wherein R represents a hydrogen atom, a lower alkyl group or a halogenated lower alkyl group; and $X^1$ represents an acid dissociable, dissolution inhibiting group.

[Chemical Formula 6.]

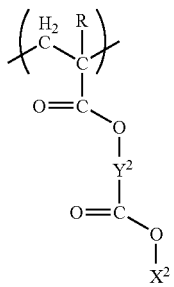

(a1-0-2)

wherein R represents a hydrogen atom, a lower alkyl group or a halogenated lower alkyl group; $X^2$ represents an acid dissociable, dissolution inhibiting group; and $Y^2$ represents a divalent linking group.

In general formula (a1-0-1) shown above, the lower alkyl group and halogenated lower alkyl group for R are the same as the lower alkyl group and halogenated lower alkyl group which may be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

As the divalent linking group for $Y^2$, an alkylene group, a divalent aliphatic cyclic group, a divalent linking group containing a hetero atom, or a combination of these groups can be used.

As the aliphatic cyclic group, the same groups as those mentioned above in connection with the explanation of the "aliphatic cyclic group" can be used, with the exception that two hydrogen atoms have been removed therefrom.

When $Y^2$ represents an alkylene group, it preferably has 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, for example, —O—, —C(=O)—O—, —C(=O)—, —O—C(=O)—O—, —C(=O)—NH—, —NH—, —NR$^{04}$— (wherein R$^{04}$ represents an alkyl group, an acyl group or the like), —NH—C(=O)—, =N—, —S—, —S(=O)$_2$—, —S(=O)$_2$—O—, or -A-O—B— (wherein each of A and B independently represents a divalent hydrocarbon group which may have a substituent, and O is an oxygen atom) can be used.

In the group —NR$^{04}$— for $Y^2$, R$^{04}$ preferably has 1 to 10 carbon atoms, more preferably 1 to 8 carbon atoms, and most preferably 1 to 5 carbon atoms.

When $Y^2$ is "A-O—B", each of A and B independently represents a divalent hydrocarbon group which may have a substituent. When a hydrocarbon "has a substituent", it means that a part or all of the hydrogen atoms within the hydrocarbon group are substituted with groups or atoms other than hydrogen atoms.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$; alkylethylene groups such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated lower alkyl group of 1 to 5 carbon atoms which is substituted by a fluorine atom, and an oxygen atom (=O).

As examples of the aliphatic hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

As A, a linear aliphatic hydrocarbon group is preferable, more preferably a linear alkylene group, still more preferably a linear alkylene group of 2 to 5 carbon atoms, and most preferably a methylene group or an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and most preferably a methyl group.

As the divalent linking group for $Y^2$, an alkylene group, a divalent aliphatic cyclic group or a divalent linking group containing an alkylene group and hetero atom are more preferable, and a divalent linking group containing an alkylene group and hetero atom is particularly desirable.

Specific examples of the structural unit (a1) include structural units represented by general formulas (a1-1) to (a1-4) shown below.

[Chemical Formula 7.]

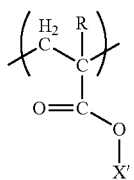
(a1-1)

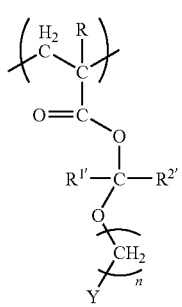
(a1-2)

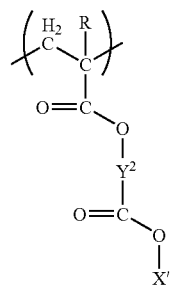
(a1-3)

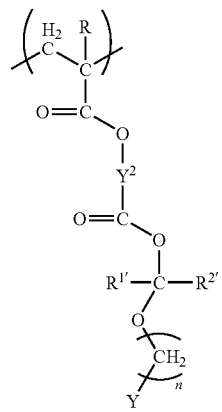
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents a divalent linking group; R is as defined above; and each of $R^{1'}$ and $R^{2'}$ independently represents a hydrogen atom or a lower alkyl group of 1 to 5 carbon atoms.

In the above formulas, examples of the tertiary alkyl ester-type acid dissociable, dissolution inhibiting group for X' include the same tertiary alkyl ester-type acid dissociable, dissolution inhibiting groups as those described above for $X^1$.

As $R^{1'}$, $R^{2'}$, n and Y the same as $R^{1'}$, $R^{2'}$, n and Y defined for general formula (p1) described above in connection with the "acetal-type acid dissociable, dissolution inhibiting group" may be used.

As $Y^2$, the same as $Y^2$ defined for general formula (a1-0-2) above may be used.

Specific examples of structural units represented by general formula (a1-1) to (a1-4) are shown below.

[Chemical Formula 8.]

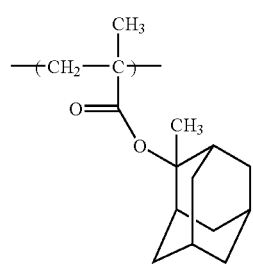
(a1-1-1)

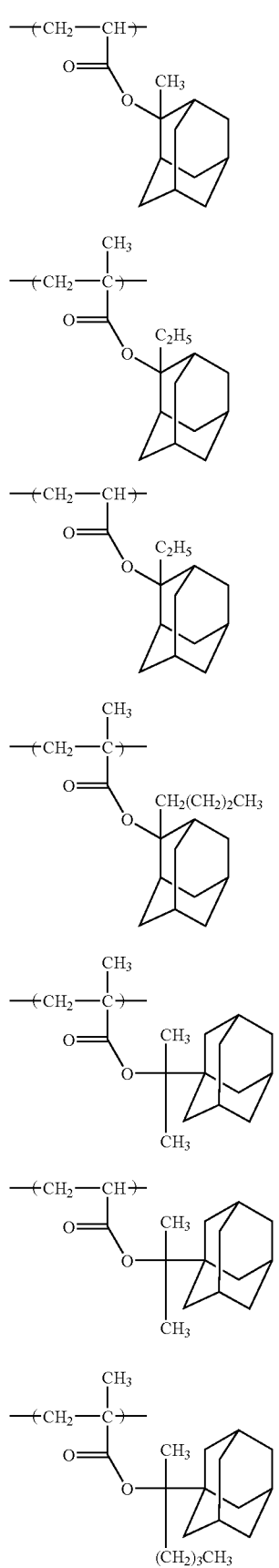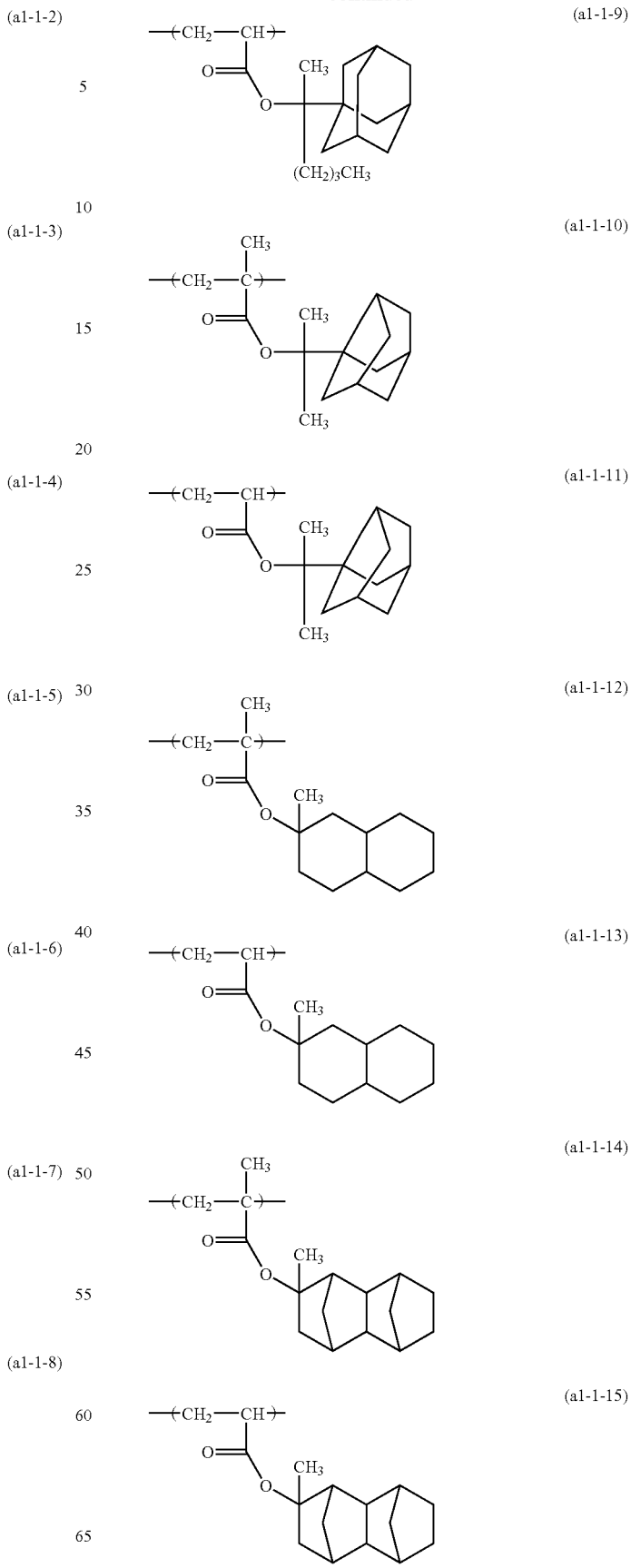

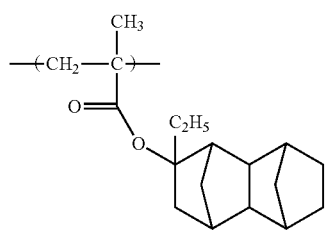
(a1-1-16)
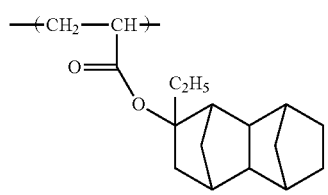
(a1-1-17)
[Chemical Formula 9.]
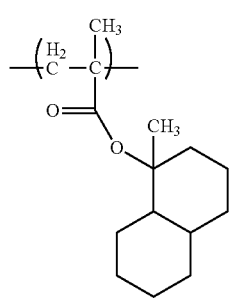
(a1-1-18)
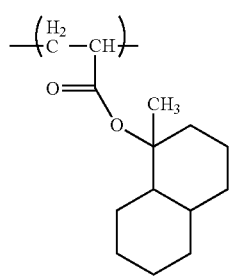
(a1-1-19)
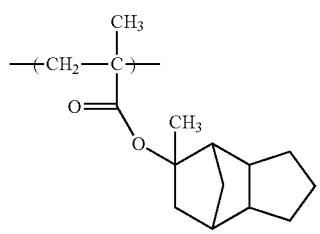
(a1-1-20)
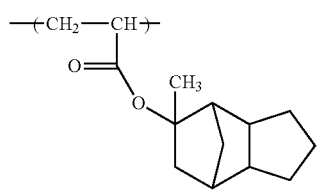
(a1-1-21)
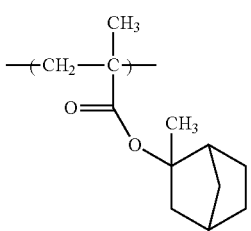
(a1-1-22)
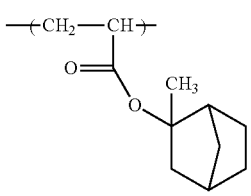
(a1-1-23)
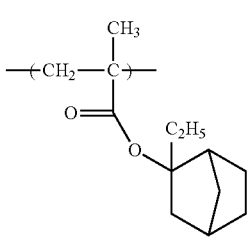
(a1-1-24)
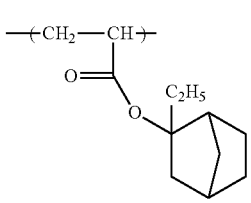
(a1-1-25)
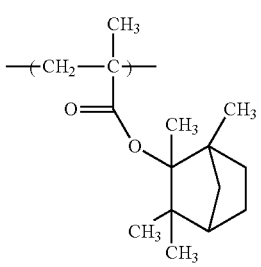
(a1-1-26)
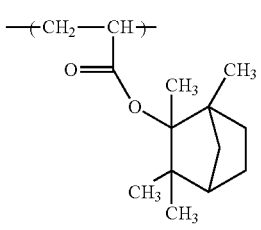
(a1-1-27)
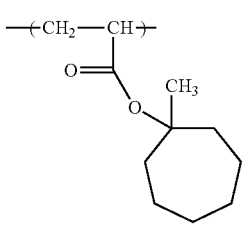
(a1-1-28)

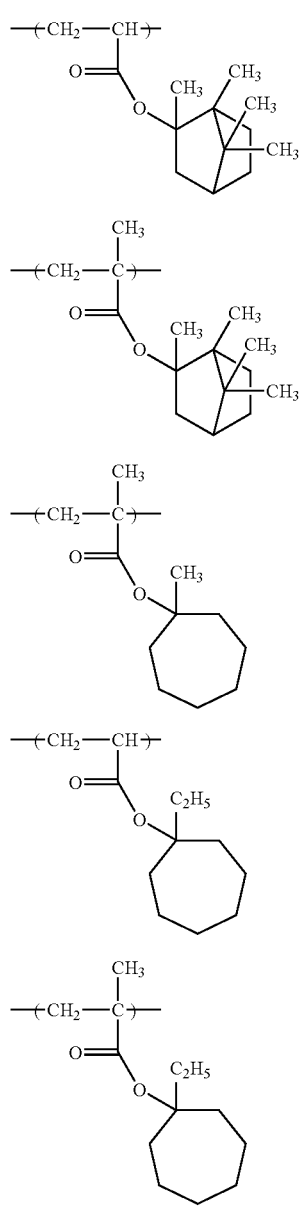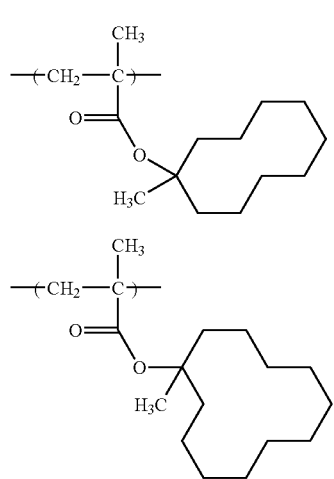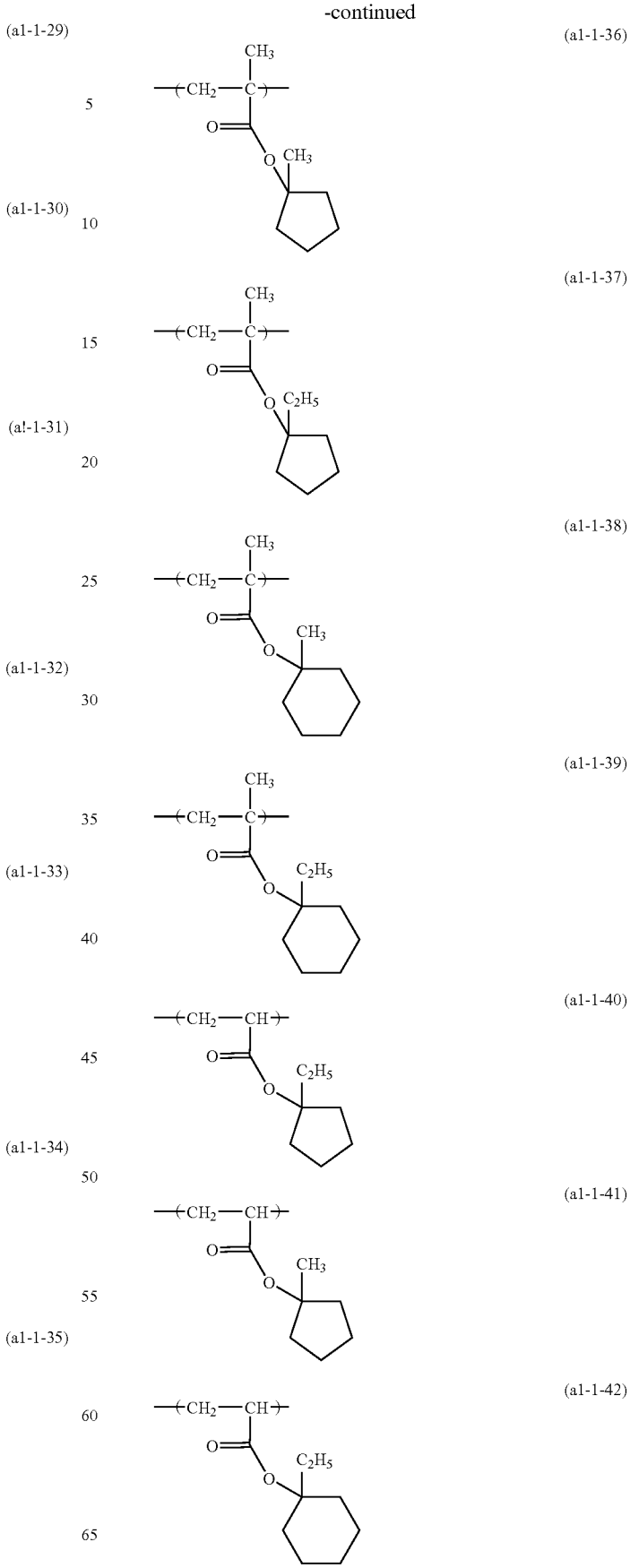

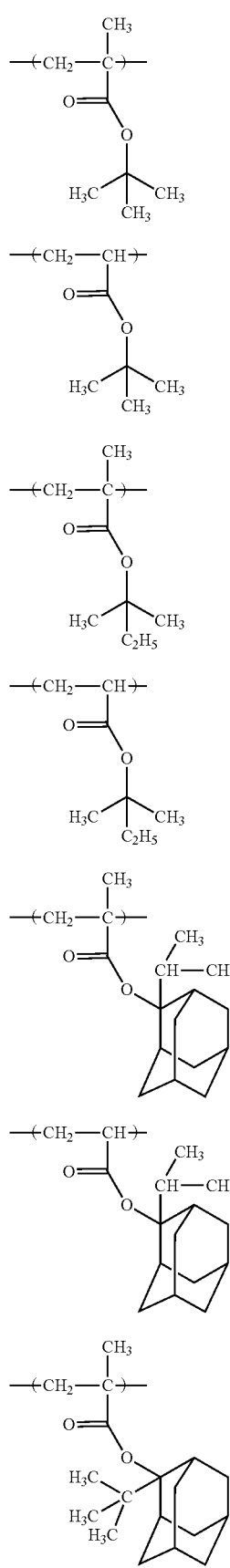
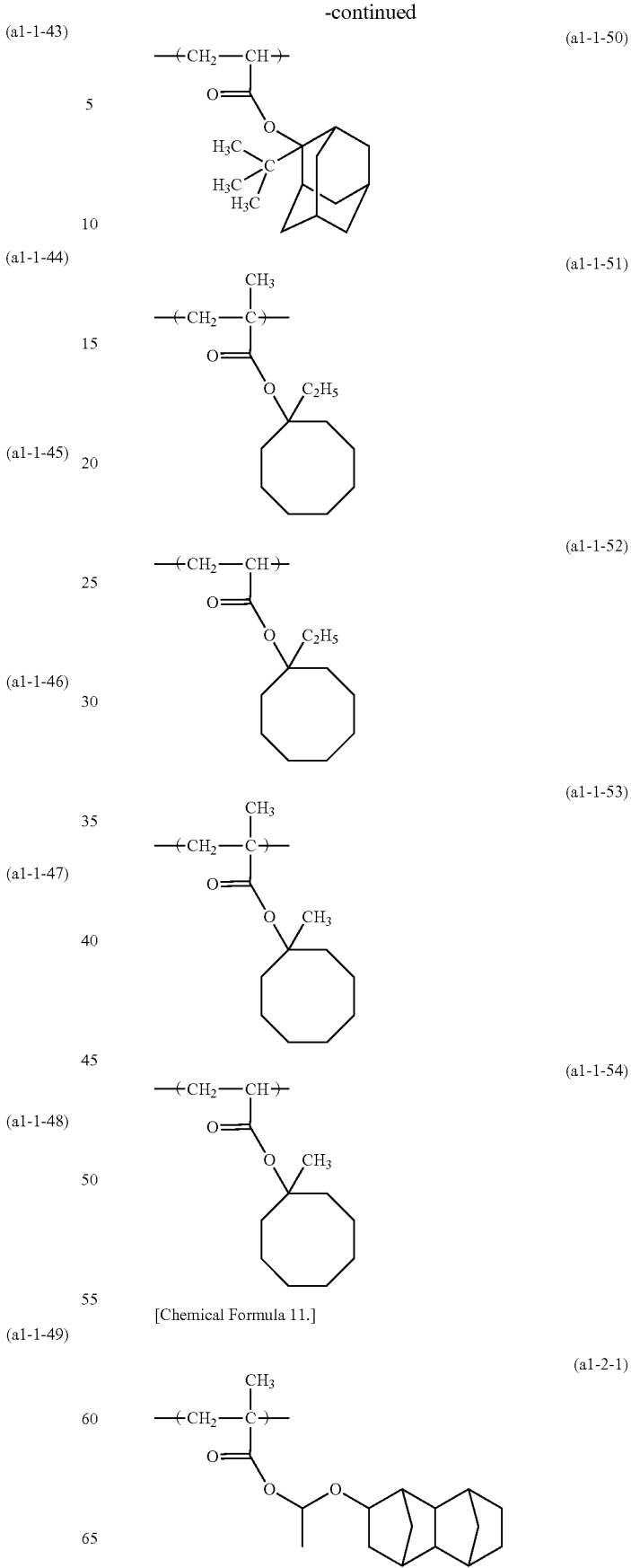
[Chemical Formula 11.]

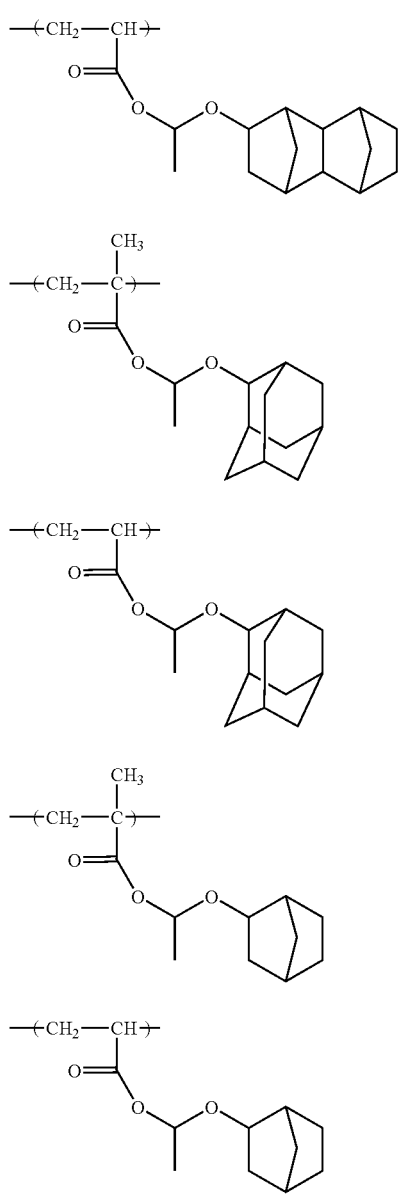
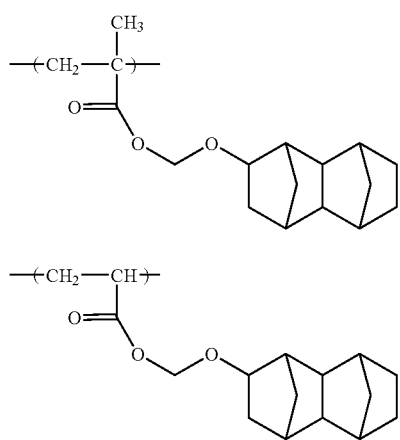
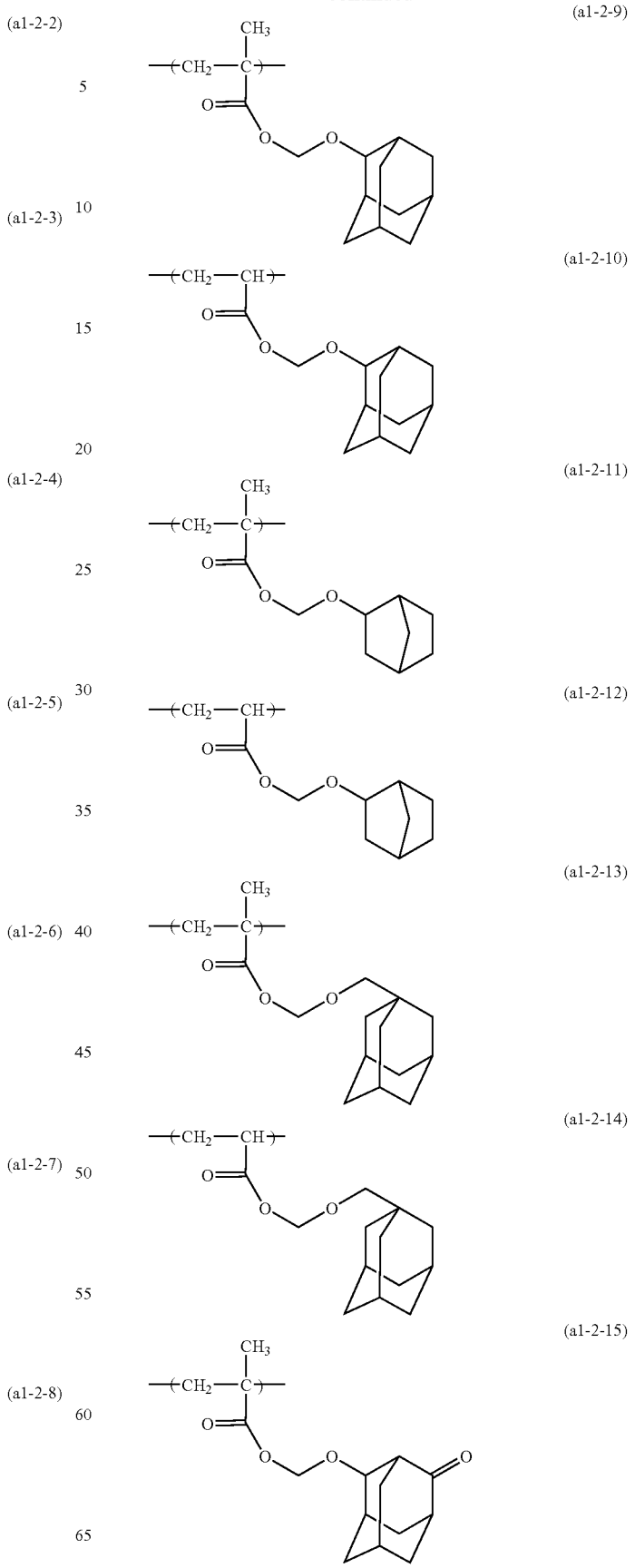

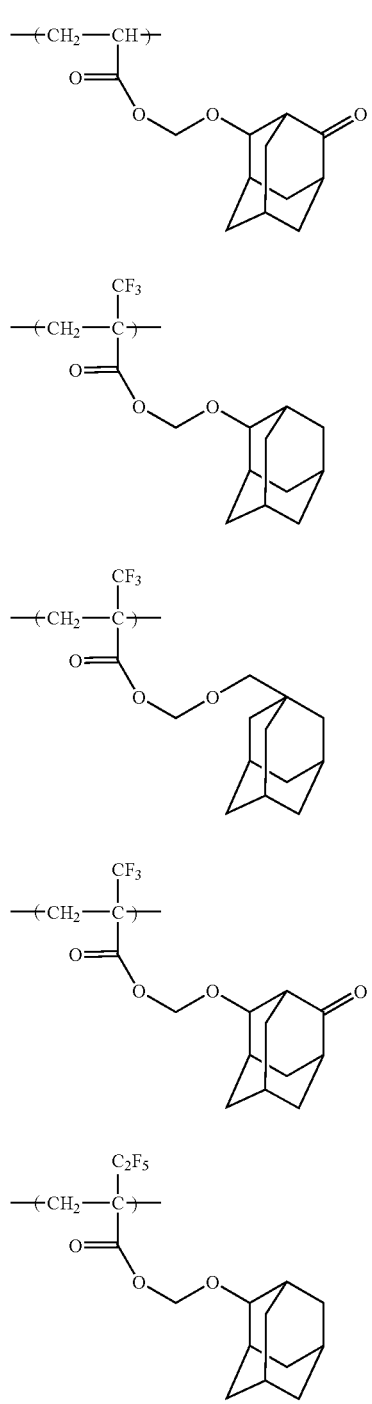
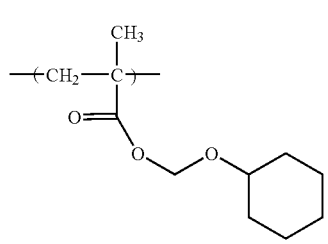
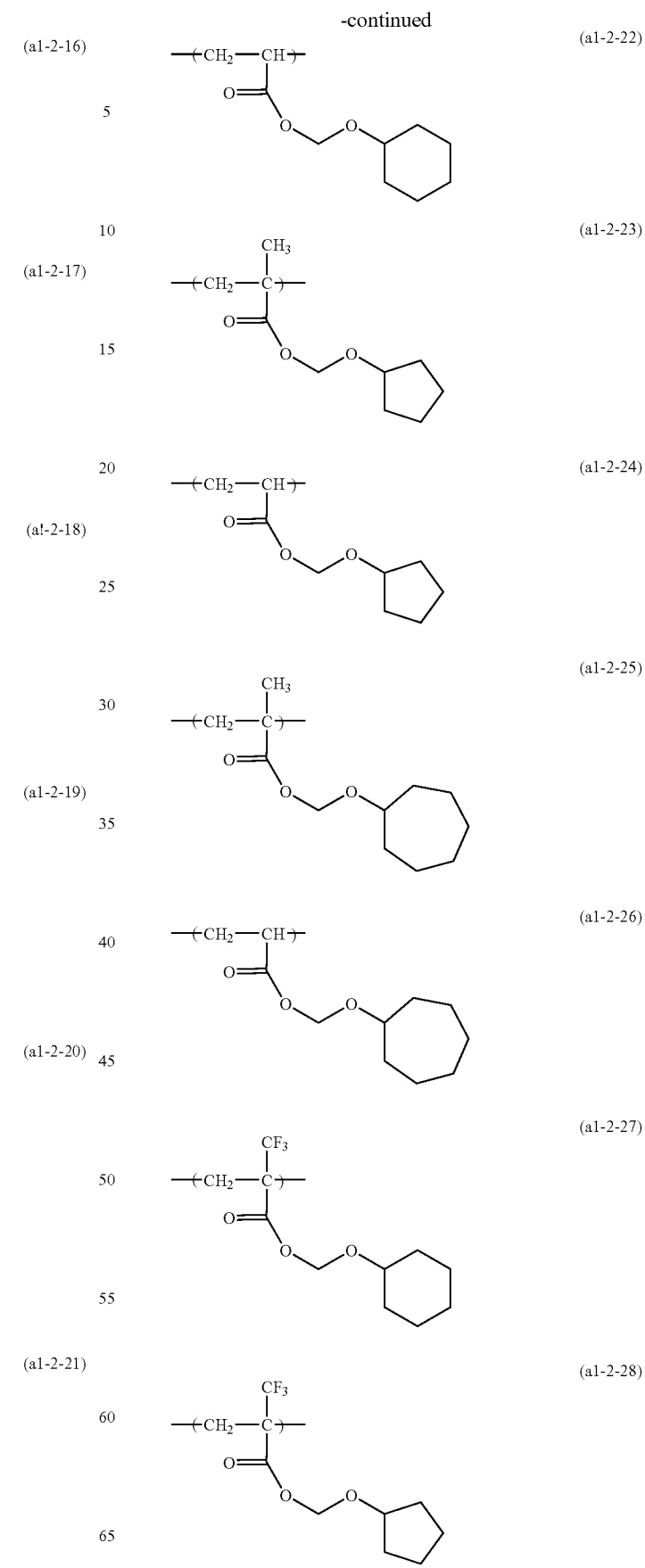

(a1-2-29)
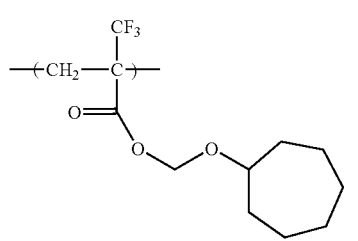
(a1-2-30)
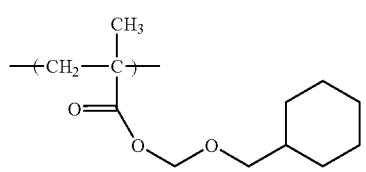
(a1-2-31)
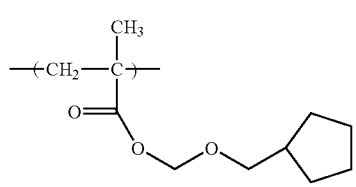
[Chemcial Formula 14.]
(a1-2-32)
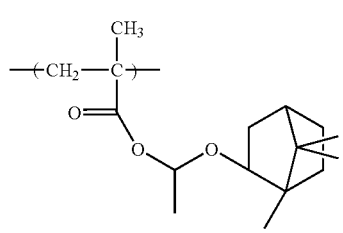
(a1-2-33)
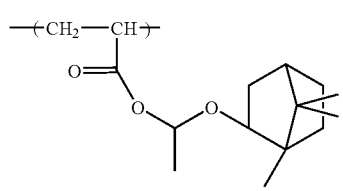
(a1-2-34)
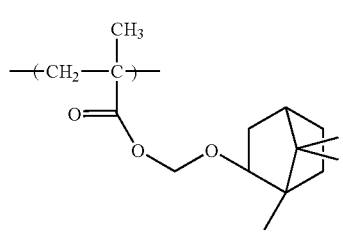
(a1-2-35)
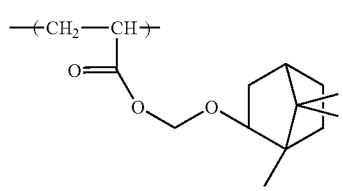
(a1-2-36)
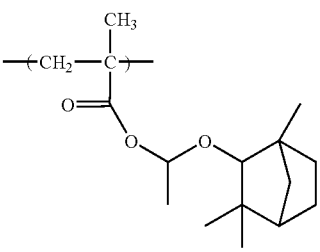
(a1-2-37)
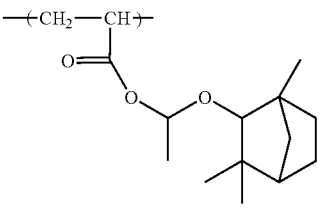
(a1-2-38)
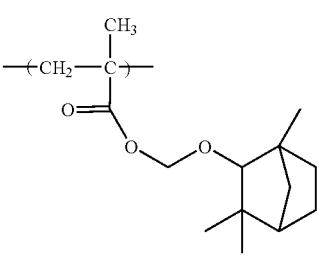
(a1-2-39)
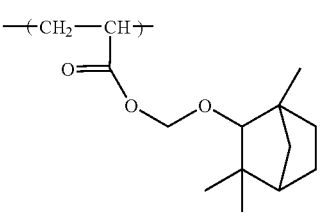
[Chemical Formula 15.]
(a1-3-1)
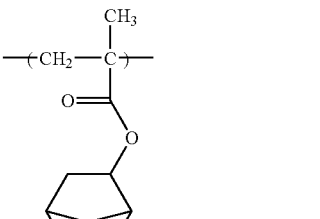
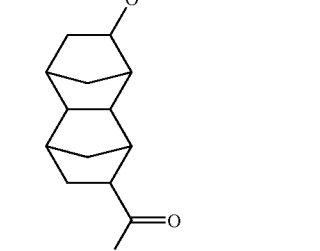
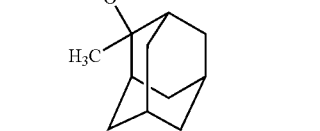

(a1-3-2)
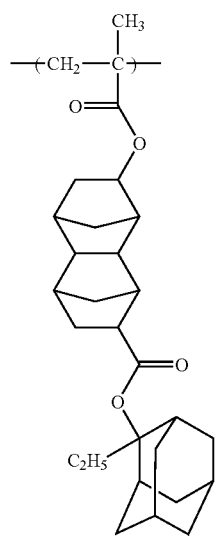
(a1-3-3)
(a1-3-4)
(a1-3-5)
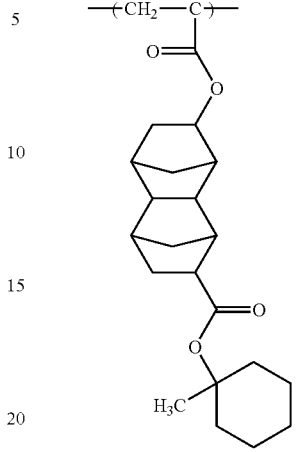
(a1-3-6)
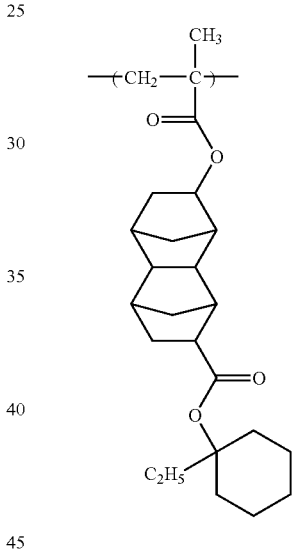
(a1-3-7)
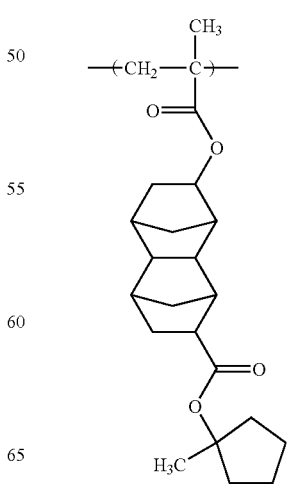

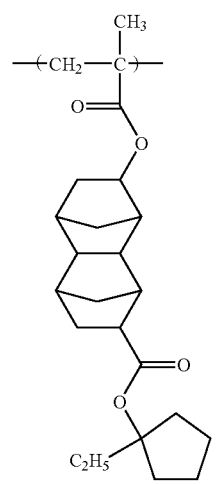 (a1-3-8)
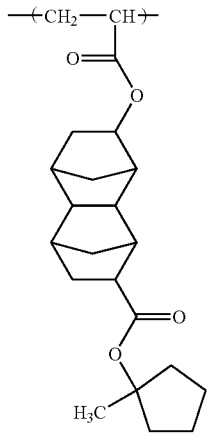 (a1-3-11)
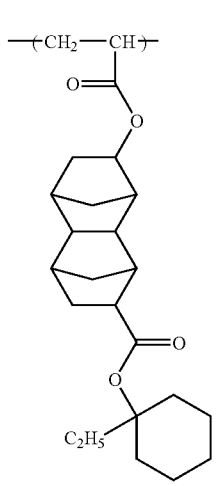 (a1-3-9)
(a1-3-12)
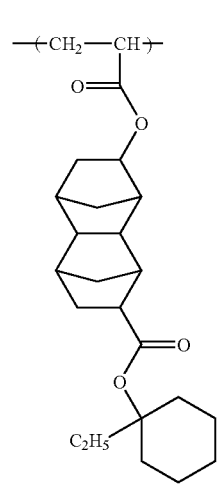 (a1-3-10)
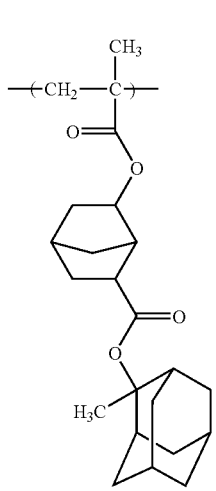 (a1-3-13)

(a1-3-14)
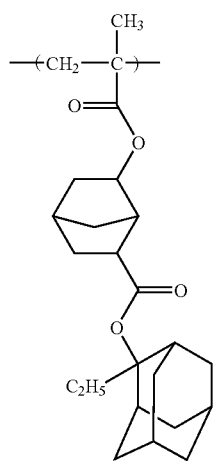
(a1-3-15)
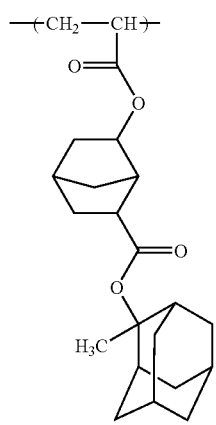
(a1-3-16)
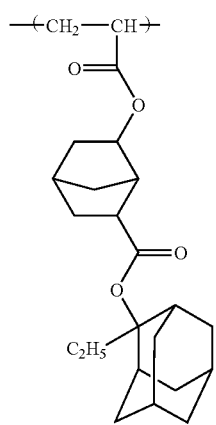
(a1-3-17)
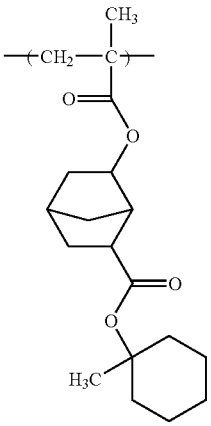
(a1-3-18)
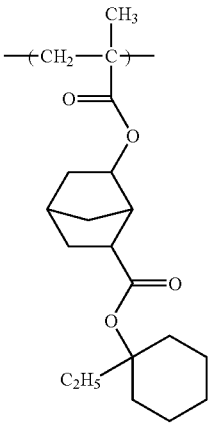
[Chemical Formula 16.]
(a1-3-19)
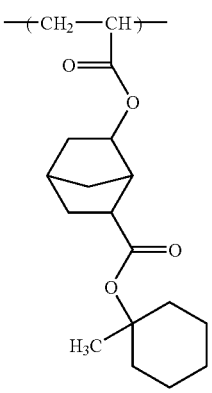
(a1-3-20)
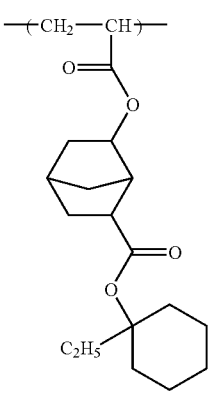

(a1-3-21) 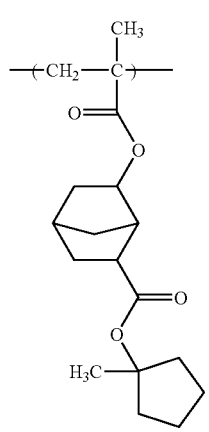
(a1-3-22) 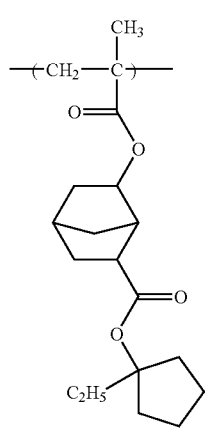
(a1-3-23) 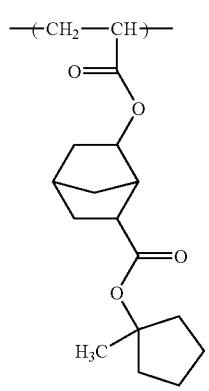
(a1-3-24) 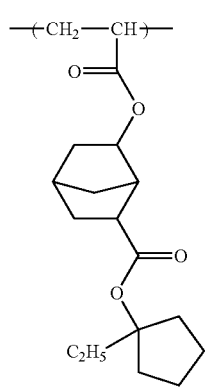
[Chemical Formula 17.]
(a1-3-25) 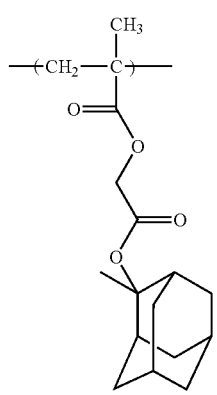
(a1-3-26) 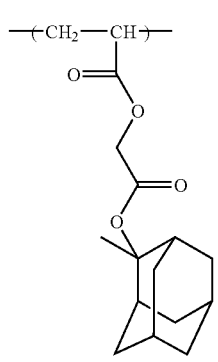
(a1-3-27) 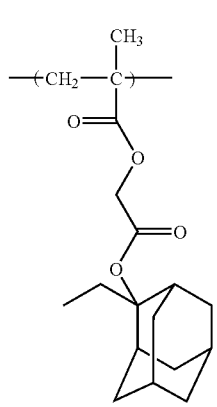
(a1-3-28) 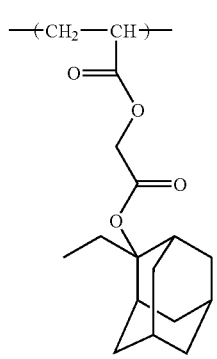

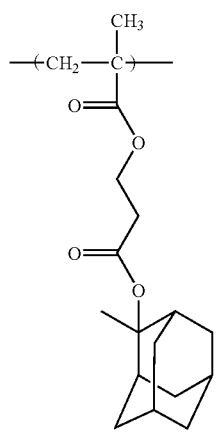 (a1-3-29)
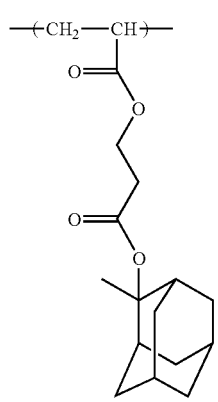 (a1-3-30)
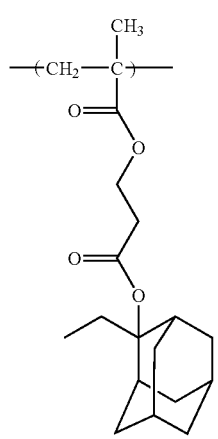 (a1-3-31)
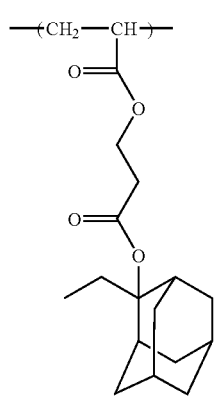 (a1-3-32)
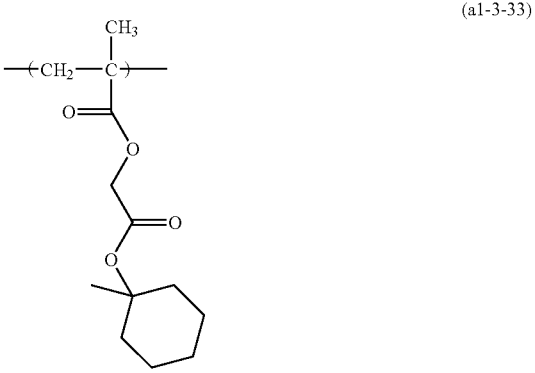 (a1-3-33)
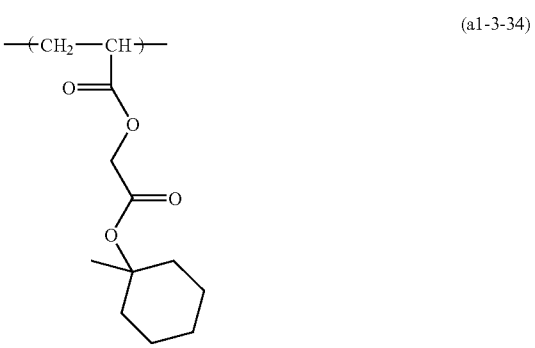 (a1-3-34)
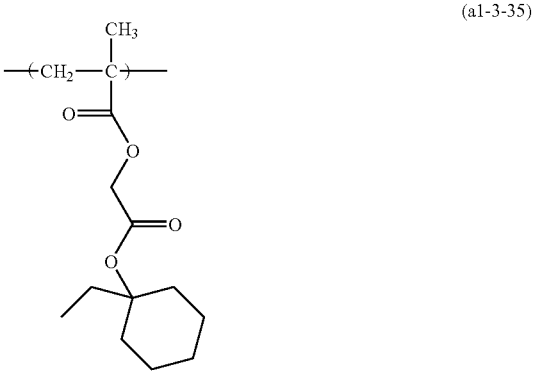 (a1-3-35)
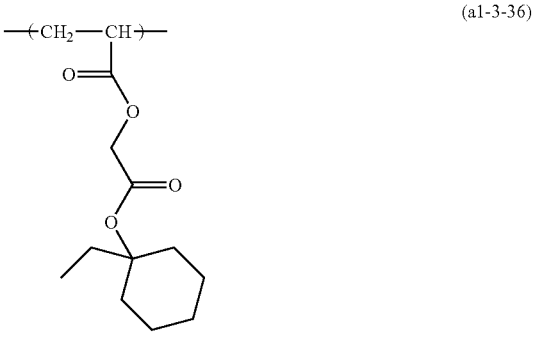 (a1-3-36)

[Chemical Formula 18.]
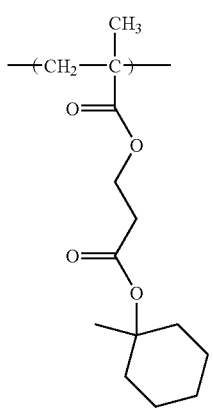 (a1-3-37)
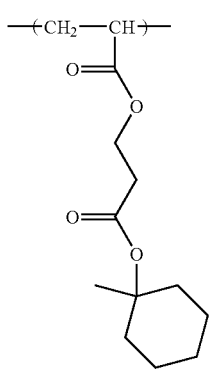 (a1-3-38)
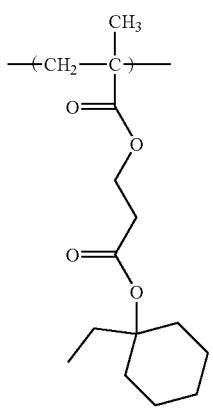 (a1-3-39)
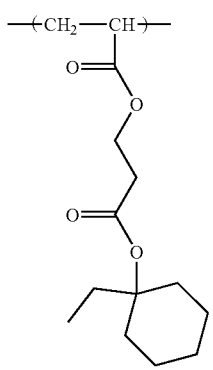 (a1-3-40)
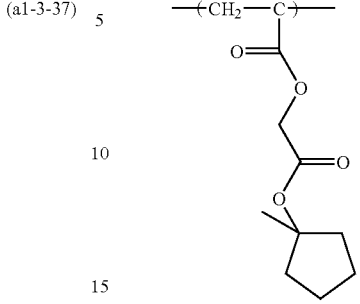 (a1-3-41)
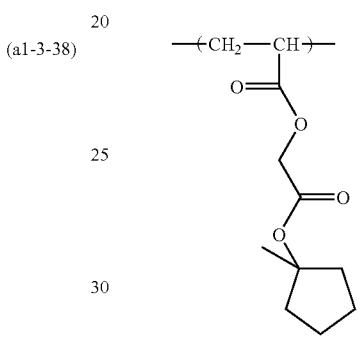 (a1-3-42)
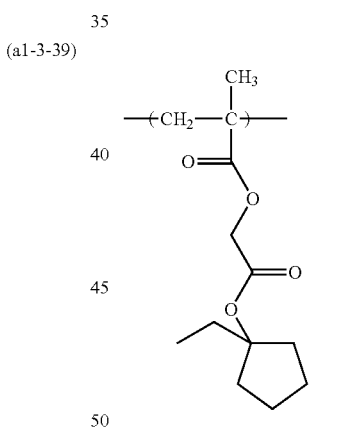 (a1-3-43)
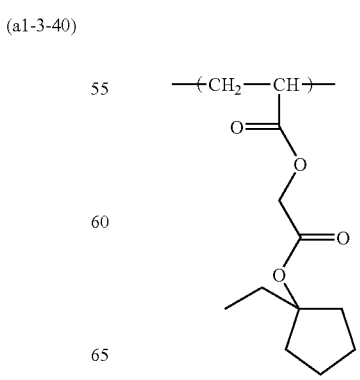 (a1-3-44)

(a1-3-45)
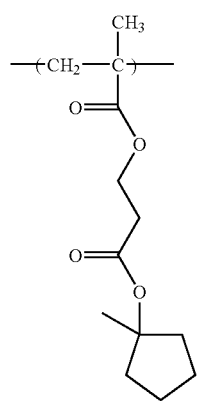
(a1-3-46)
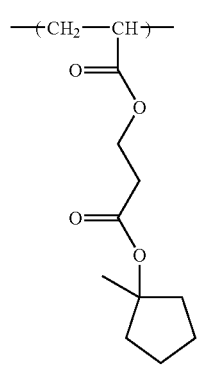
(a1-3-47)
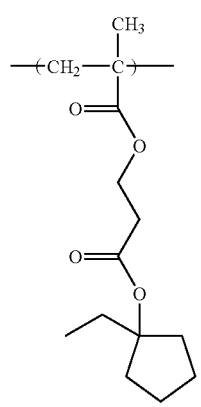
(a1-3-48)
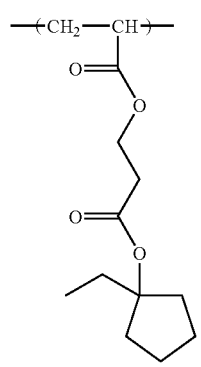
[Chemical Formula 19.]
(a1-3-49)
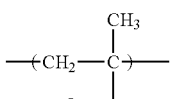
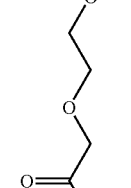
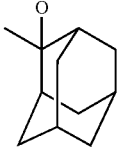
(a1-3-50)
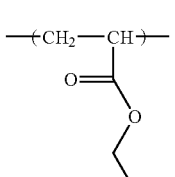
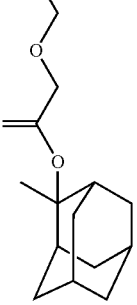
(a1-3-51)
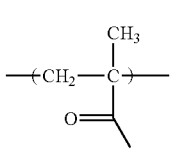
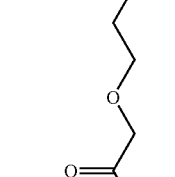
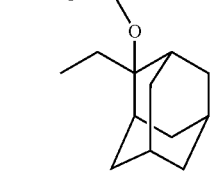

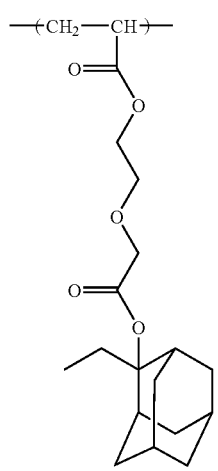 (a1-3-52)
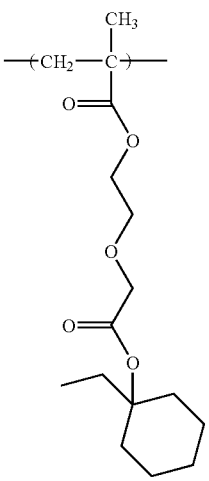 (a1-3-55)
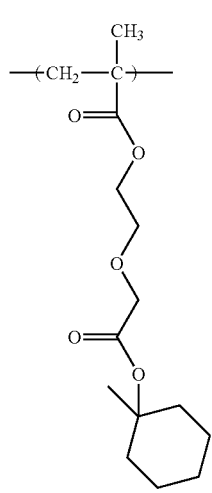 (a1-3-53)
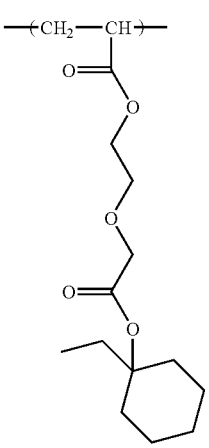 (a1-3-56)
[Chemical Formula 20.]
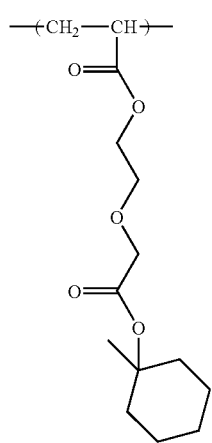 (a1-3-54)
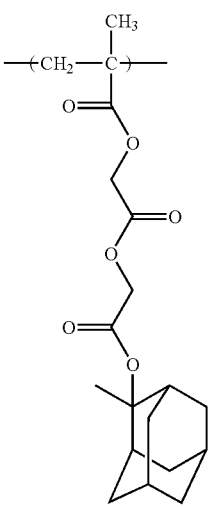 (a1-3-57)

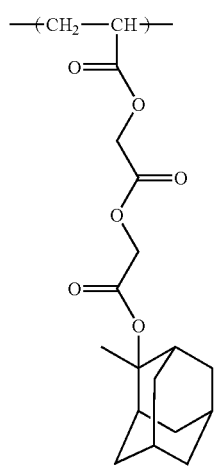
(a1-3-58)
[Chemical Formula 21.]
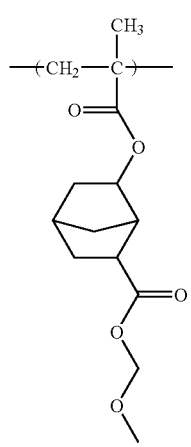
(a1-4-1)
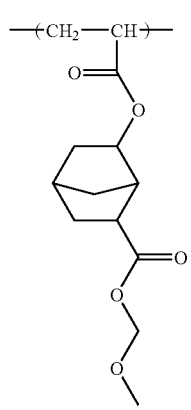
(a1-4-2)
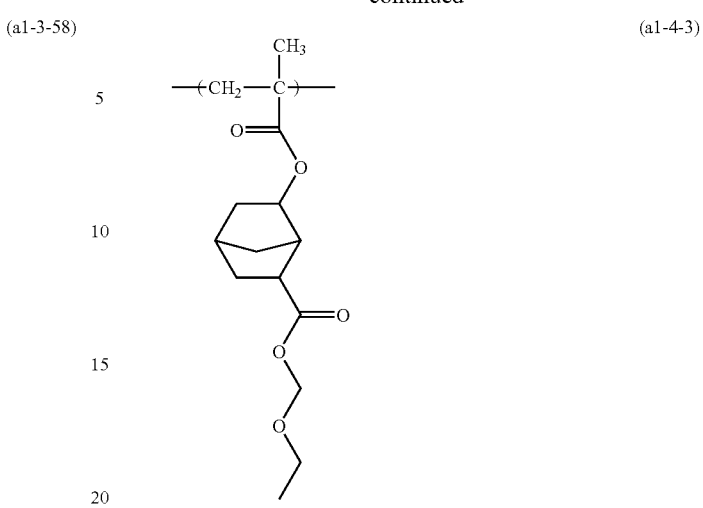
(a1-4-3)
(a1-4-4)
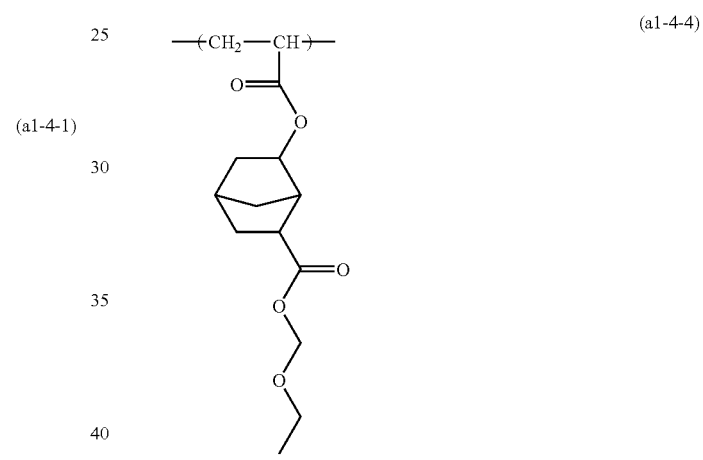
(a1-4-5)
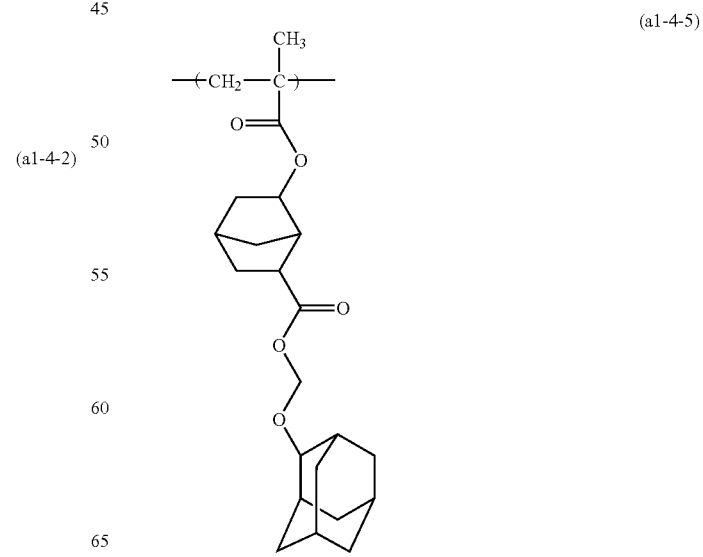

(a1-4-6)
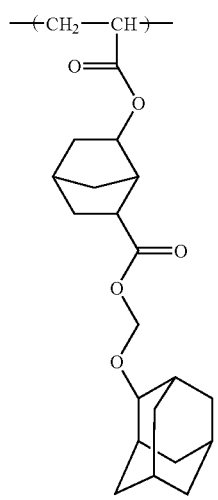
(a1-4-7)
(a1-4-8)
(a1-4-9)
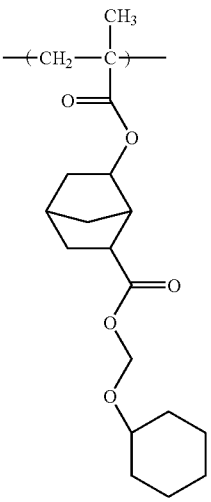
(a1-4-10)
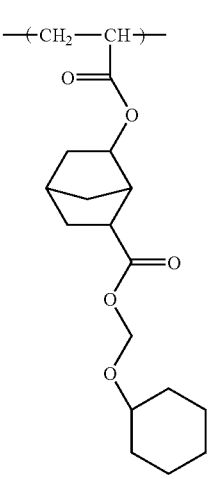
(a1-4-11)
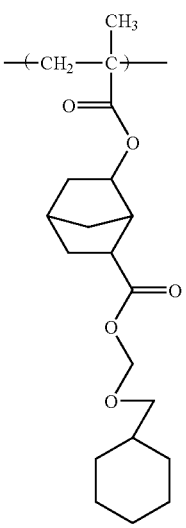

(a1-4-12) 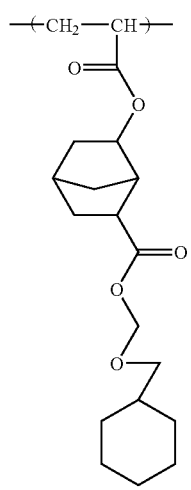
(a1-4-13) 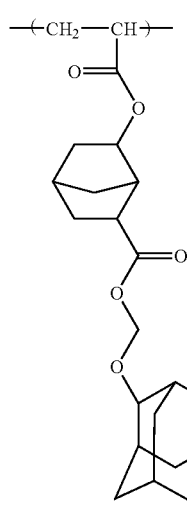
(a1-4-14) 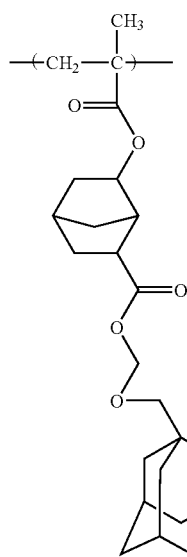
(a1-4-15) 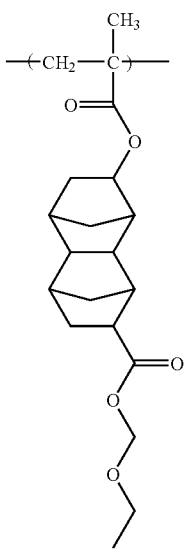
(a1-4-16) 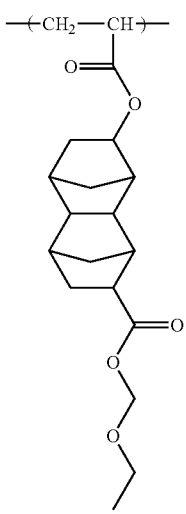
(a1-4-17)

-continued
[Chemical Formula 22.]
(a1-4-18)
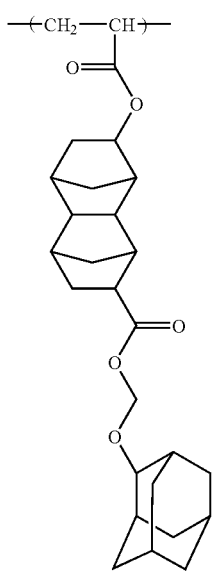
(a1-4-19)
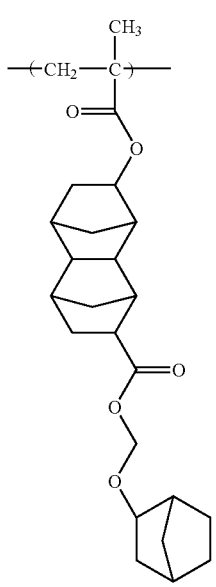
(a1-4-20)
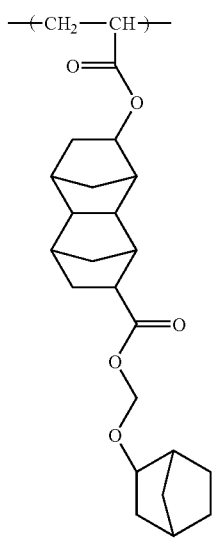
(a1-4-21)
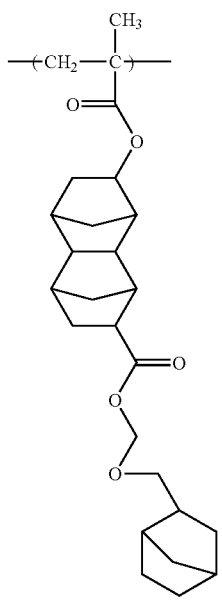
(a1-4-22)
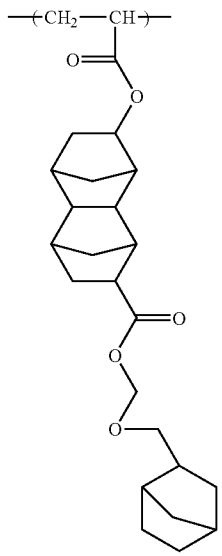

53
-continued
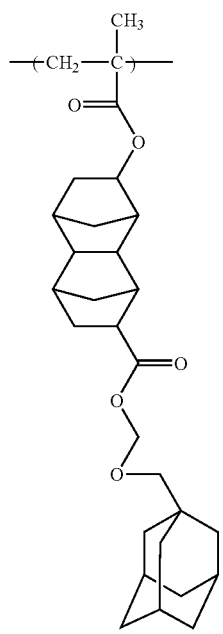
(a1-4-23)
54
-continued
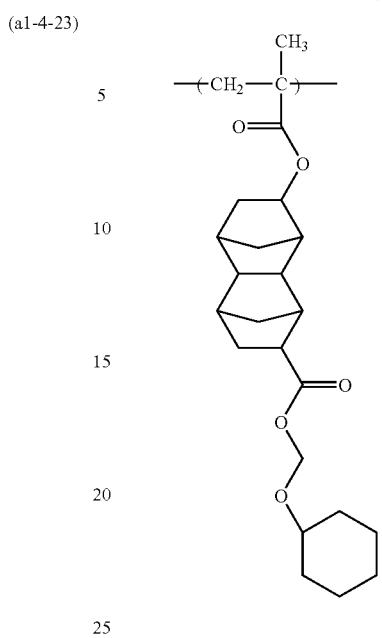
(a1-4-25)
(a1-4-24)
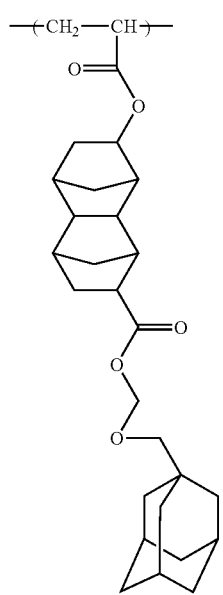
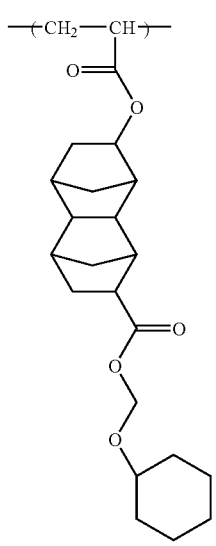
(a1-4-26)

(a1-4-27)

(a1-4-28)

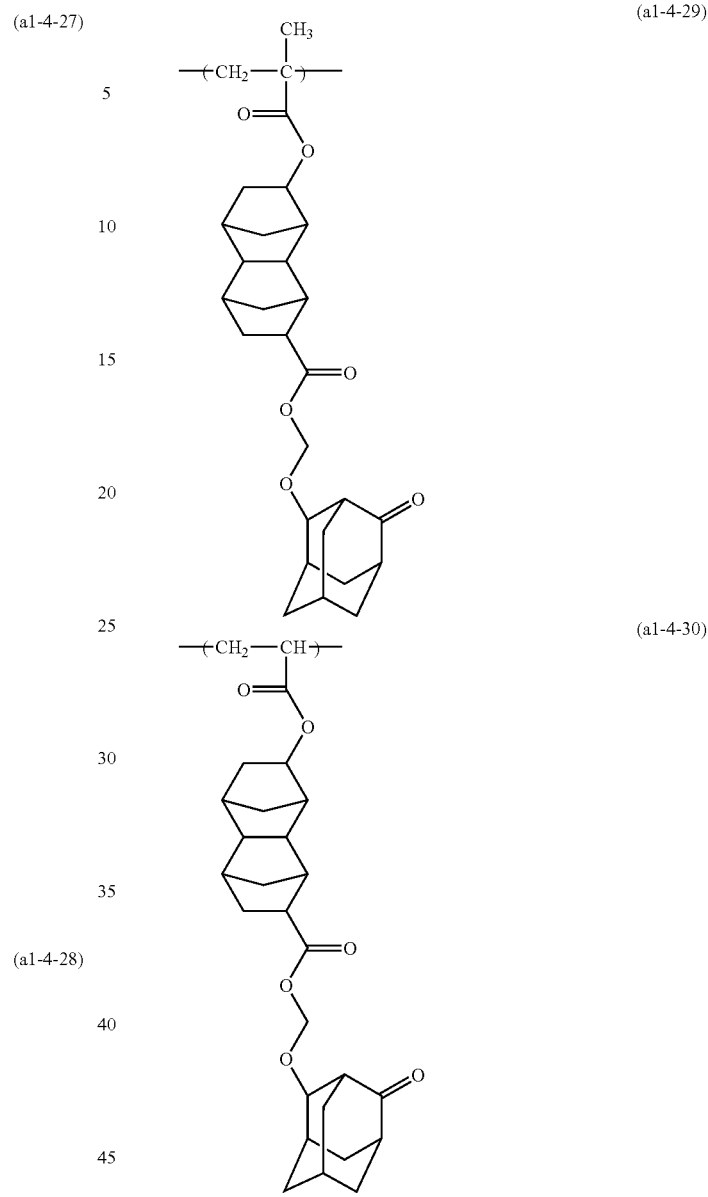

(a1-4-29)

(a1-4-30)

As the structural unit (a1), one type of structural unit may be used alone, or two or more types of structural units may be used in combination.

Among these, structural units represented by general formula (a1-1), (a1-2) or (a1-3) are preferable. More specifically, at least one structural unit selected from the group consisting of structural units represented by formulas (a1-1-1) to (a1-1-7), (a1-1-36) to (a1-1-42), (a1-1-47) to (a1-1-50), (a1-1-51) to (a1-1-54), (a1-2-3), (a1-2-4), (a1-2-9), (a1-2-10), (a1-2-13), (a1-2-14), (a1-2-17), (a1-2-18), (a1-2-20), (a1-2-21) to (a1-2-31), (a1-3-49) to (a1-3-56) and (a1-3-57) to (a1-3-58) is more preferable.

Further, as the structural unit (a1), structural units represented by general formula (a1-1-01) shown below which includes the structural units represented by formulas (a1-1-1) to (a1-1-5), structural units represented by general formula (a1-1-02) shown below which includes the structural units represented by formulas (a1-1-36) to (a1-1-42) and (a1-1-51) to (a1-1-54), structural units represented by general formula (a1-1-03) shown below which includes the structural units represented by formulas (a1-1-47) to (a1-1-50), structural units represented by general formula (a1-1-04) shown below, structural units represented by general formula (a1-2-01) shown below which includes the structural units represented by formulas (a1-2-3), (a1-2-4), (a1-2-9), (a1-2-10), (a1-2-13), (a1-2-14), (a1-2-17), (a1-2-18) and (a1-2-20), structural units represented by general formula (a1-2-02) shown below which includes the structural units represented by formulas (a1-2-21) to (a1-2-31), structural units represented by general formula (a1-3-01) shown below which include the structural units represented by formulas (a1-3-57) to (a1-3-58), structural units represented by general formula (a1-3-02) shown below, structural units represented by general formula (a1-3-03) shown below which includes the structural units represented by formulas (a1-3-49) to (a1-3-52), and structural units represented by general formula (a1-3-04) shown below which includes the structural units represented by formulas (a1-3-53) to (a1-3-56) are also preferable.

[Chemical Formula 23.]

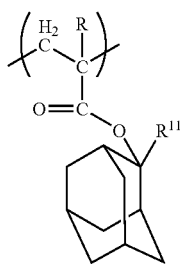
(a1-1-01)

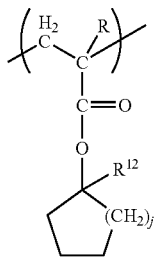
(a1-1-02)

In formula (a1-1-01), R represents a hydrogen atom, a lower alkyl group or a halogenated lower alkyl group; and $R^{11}$ represents a lower alkyl group; and in formula (a1-1-02), R is the same as defined above; $R^{12}$ represents a lower alkyl group; and j represents an integer of 1 to 6.

In general formula (a1-1-01), R is the same as defined above.

The lower alkyl group for $R^{11}$ is the same as the lower alkyl group for R above. $R^{11}$ is preferably a methyl group or an ethyl group, and most preferably an methyl group.

In general formula (a1-1-02), R is the same as defined above.

The lower alkyl group for $R^{12}$ is the same as the lower alkyl group for R above. $R^{12}$ is preferably a methyl group or an ethyl group, and most preferably an ethyl group.

j is preferably 1 or 2, and most preferably 2.

[Chemical Formula 24.]

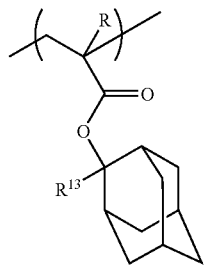
(a1-1-03)

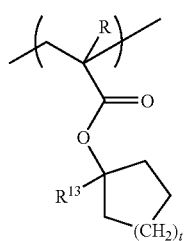
(a1-1-04)

In formula (a1-1-03), R is the same as defined above; and $R^{13}$ represents a branched alkyl group of 3 or more carbon atoms; and in formula (a1-1-04), R and $R^{13}$ are the same as defined for R and $R^{13}$ in general formula (a1-1-03); and t represents an integer of 1 to 6.

In general formula (a1-1-03), R is the same as defined above.

$R^{13}$ represents a branched alkyl group of 3 or more carbon atoms, and preferably has 3 to 10 carbon atoms, and more preferably 3 to 5 carbon atoms. Specific examples of $R^{13}$ include an isopropyl group, an isobutyl group, a tert-butyl group, an isopentyl group, and a neopentyl group, and an isopropyl group or a tert-butyl group is preferable, and a tert-butyl group is particularly desirable.

In general formula (a1-1-04), R and $R^{13}$ are the same as R and $R^{13}$ in general formula (a1-1-03).

t represents an integer of 1 to 6, and is preferably an integer of 1 to 4, and more preferably an integer of 1 or 2.

[Chemical Formula 25.]

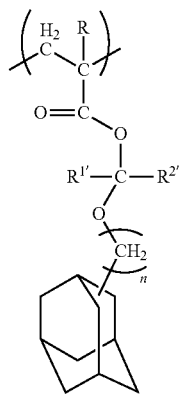
(a1-2-01)

(a1-2-02)

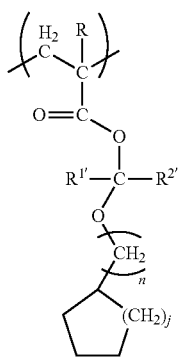

In formula (a1-2-01), R is the same as defined above; and $R^{1'}$, $R^{2'}$ and n are respectively the same as defined above; and in formula (a1-2-02), R, $R^{1'}$, $R^{2'}$ and n are respectively the same as R, $R^{1'}$, $R^{2'}$ and n in formula (a1-2-01); and j represents an integer of 1 to 6.

In general formula (a1-2-01), R is the same as defined above.

$R^{1'}$ and $R^{2'}$ each preferably independently represents a hydrogen atom, a methyl group, or an ethyl group, and more preferably a hydrogen atom or a methyl group, and it is particularly desirable that at least one of $R^{1'}$ and $R^{2'}$ be a hydrogen atom.

n is preferably an integer of 0 to 2, more preferably 0 or 1, and most preferably 0.

In general formula (a1-2-02), R, $R^{1'}$, $R^{2'}$ and n are respectively the same as R, $R^{1'}$, $R^{2'}$ and n in general formula (a1-2-01).

j is preferably 1 or 2, and most preferably 2.

[Chemical Formula 26.]

(a1-3-01)

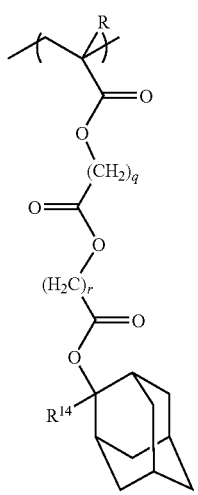

(a1-3-02)

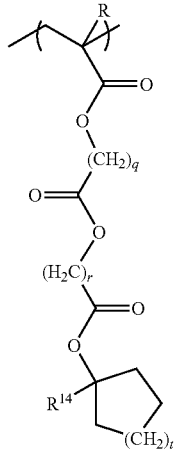

(a1-3-03)

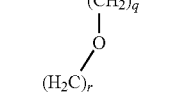

(a1-3-04)

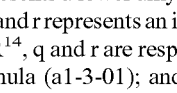

In formula (a1-3-01), R is the same as defined above; $R^{14}$ represents a lower alkyl group; q represents an integer of 1 to 10; and r represents an integer of 1 to 10; in formula (a1-3-02), R, $R^{14}$, q and r are respectively the same as R, $R^{14}$, q and r in formula (a1-3-01); and t represents an integer of 1 to 6; in formula (a1-3-03), R, $R^{14}$, q and r are respectively the same as R, $R^{14}$, q and r in formula (a1-3-01); and in formula (a1-3-04), R, $R^{14}$, q, r and t are respectively the same as R, $R^{14}$, q, r and t in formula (a1-3-02).

In general formulas (a1-3-01) and (a1-3-03), R is the same as defined above.

The lower alkyl group for $R^{14}$ is the same as the lower alkyl group for R above. $R^{14}$ is preferably a methyl group or an ethyl group, and more preferably a methyl group.

q represents an integer of 1 to 10, and is preferably an integer of 1 to 5, and particularly preferably an integer of 1 or 2.

r represents an integer of 1 to 10, and is preferably an integer of 1 to 5, and most preferably an integer of 1 or 2.

In general formulas (a1-3-02) and (a1-3-04), R, $R^{14}$, q and r are respectively the same as R, $R^{14}$, q and r in formula (a1-3-01).

t represents an integer of 1 to 6, and is preferably an integer of 1 to 4, and more preferably an integer of 1 or 2.

In the component (A1), the amount of the structural unit (a1) based on the combined total of all structural units constituting the component (A1) is preferably 10 to 80 mol %, more preferably 20 to 70 mol %, and still more preferably 25 to 65 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

The monomers for deriving the structural units represented by general formulas (a1-3-01) to (a1-3-04) above (hereafter, these monomers are collectively referred to as "monomers W") can be produced by a production method shown below.
Production Method of Monomer W:

A compound represented by general formula (X-2) shown below (hereafter, referred to as "compound (X-2)") is added to a compound represented by general formula (X-1) shown below (hereafter referred to as "compound (X-1)") dissolved in a reaction solvent, in the presence of a base, and a reaction is effected to obtain a compound represented by general formula (X-3) shown below (hereafter, referred to as "compound (X-3)"). Then, a compound represented by general formula (X-4) shown below is added to the resulting solution having the compound (X-3) dissolved therein, in the presence of a base, and a reaction is effected to thereby obtain a monomer W.

The compound (X-2) can be obtained, for, example, by reacting a compound represented by formula $X^{11}$—B—C(=O)—OH with a compound represented by formula $X^2$—H. Alternatively, instead of the compound (X-2), each of the compounds represented by formulas $X^{11}$—B—C(=O)—OH and $X^2$—H may be used individually.

Examples of the base include inorganic bases such as sodium hydride, $K_2CO_3$ and $Cs_2CO_3$, and organic bases such as triethylamine, 4-dimethylaminopyridine (DMAP) and pyridine.

As the reaction solvent, any reaction solvent capable of dissolving the compounds (X-1) and (X-2) as raw materials can be used, and specific examples include tetrahydrofuran (THF), acetone, dimethylformamide (DMF), dimethylacetamide, dimethyl sulfoxide (DMSO) and acetonitrile.

[Chemical Formula 27.]

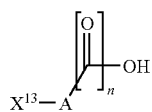
(X-1)

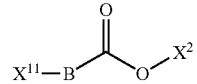
(X-2)

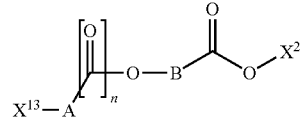
(X-3)

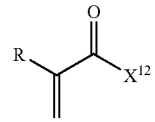
(X-4)

In the formulas, R represents a hydrogen atom, a lower alkyl group or a halogenated lower alkyl group; each of A and B independently represents a divalent hydrocarbon group which may have a substituent; $X^2$ represents an acid dissociable, dissolution inhibiting group; each of $X^{12}$ and $X^{13}$ independently represents a hydroxyl group or a halogen atom, with the provision that either one of $X^{12}$ and $X^{13}$ represents a hydroxyl group and the other represents a halogen atom; $X^{11}$ represents a halogen atom; and u represents 0 or 1.

In formulas (X-1) to (X-4) above, R, $X^2$, A and B are the same as defined above.

Examples of halogen atoms for $X^{11}$, $X^{12}$ and $X^{13}$ include a bromine atom, a chlorine atom, an iodine atom and a fluorine atom.

As the halogen atom for $X^{12}$ or $X^{13}$, in terms of reactivity, a chlorine atom or a bromine atom is preferable.

As $X^{11}$, in terms of reactivity, a bromine atom or a chlorine atom is preferable.

The above-mentioned production method of monomer W shows a method for producing monomers for deriving the structural units represented by general formulas (a1-3-01) and (a1-3-02) above when u=1, and shows a method for producing monomers for deriving the structural units represented by general formulas (a1-3-03) and (a1-3-04) above when u=0.
Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from a monocyclic lactone such as γ-butyrolactone or mevalonic lactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 28.]

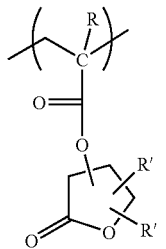 (a2-1)

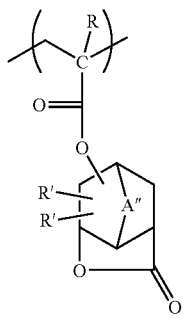 (a2-2)

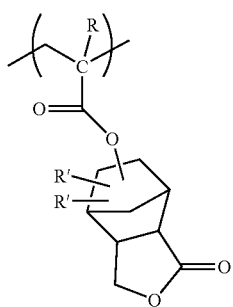 (a2-3)

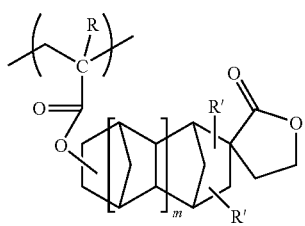 (a2-4)

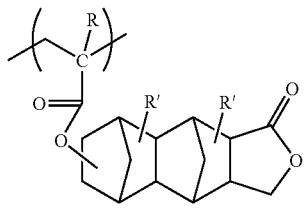 (a2-5)

In the formulas, R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents an integer of 0 or 1; and A" represents an oxygen atom, a sulfur atom, or an alkylene group of 1 to 5 carbon atoms which may contain an oxygen atom or a sulfur atom.

In general formulas (a2-1) to (a2-5), R is the same as R in the structural unit (a1).

The lower alkyl group for R' is the same as the lower alkyl group for R in the structural unit (a1).

When R" is a linear or branched alkyl group, it preferably has 1 to 10 carbon atoms, and more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, ethylene group, n-propylene group, isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 29.]

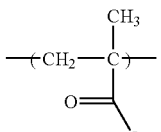 (a2-1-1)

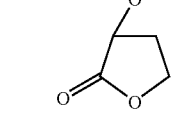 (a2-1-2)

(a2-1-3)
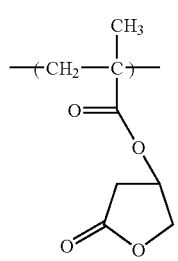
(a2-1-4)
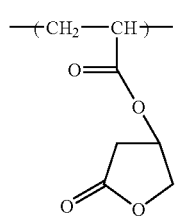
(a2-1-5)
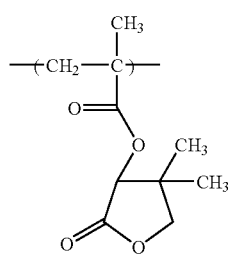
(a2-1-6)
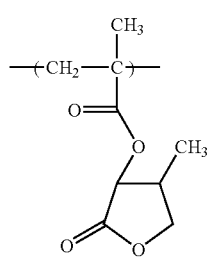
[Chemical Formula 30.]
(a2-2-1)
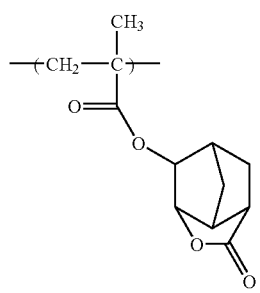
(a2-2-2)
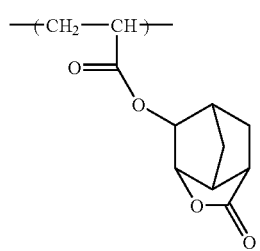
(a2-2-3)
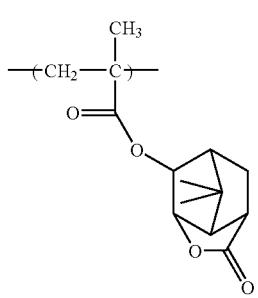
(a2-2-4)
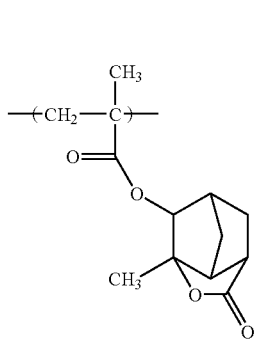
(a2-2-5)
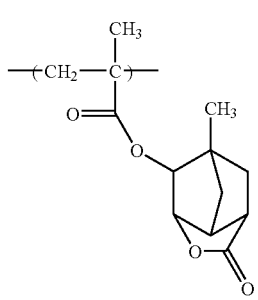
(a2-2-6)
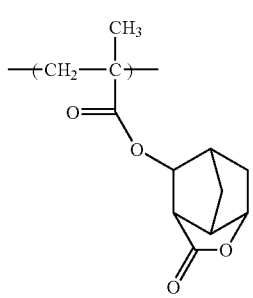
(a2-2-7)
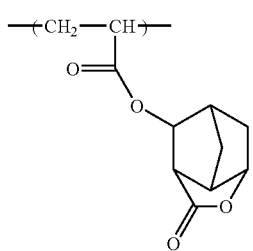

(a2-2-8)
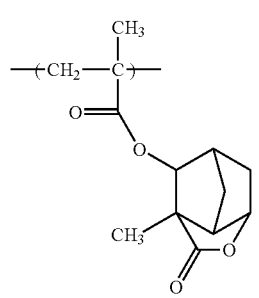
(a2-2-9)
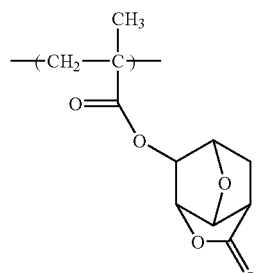
(a2-2-10)
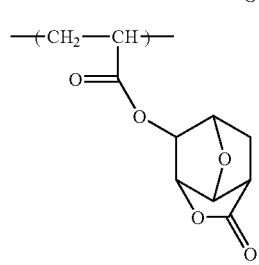
(a2-2-11)
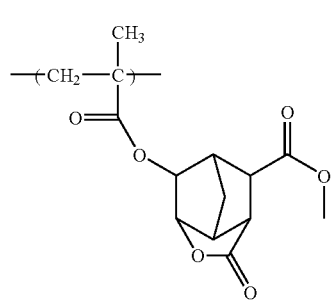
(a2-2-12)
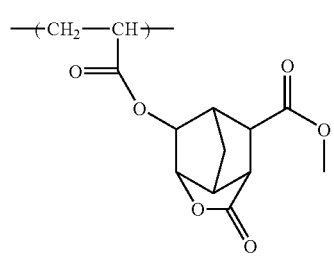
(a2-2-13)
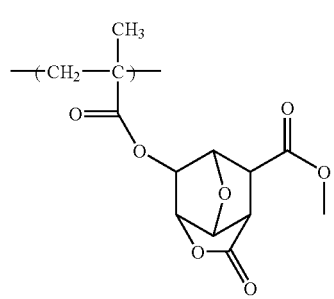
(a2-2-14)
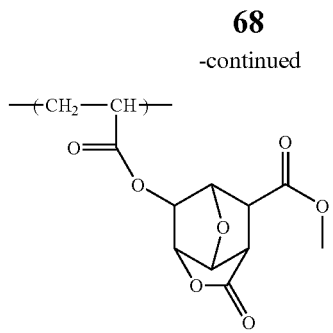
[Chemical Formula 31.]
(a2-3-1)
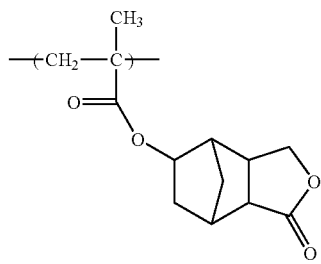
(a2-3-2)
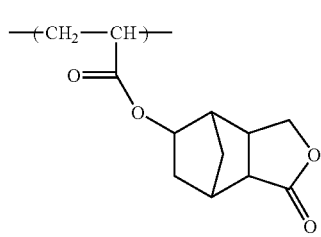
(a2-3-3)
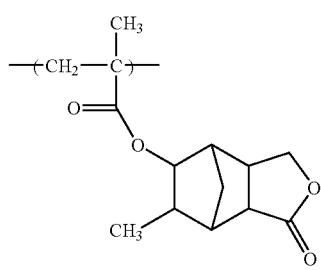
(a2-3-4)
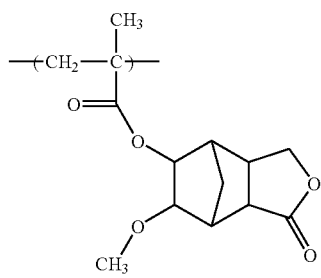
(a2-3-5)
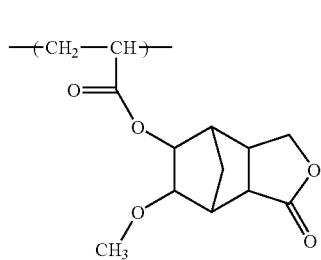

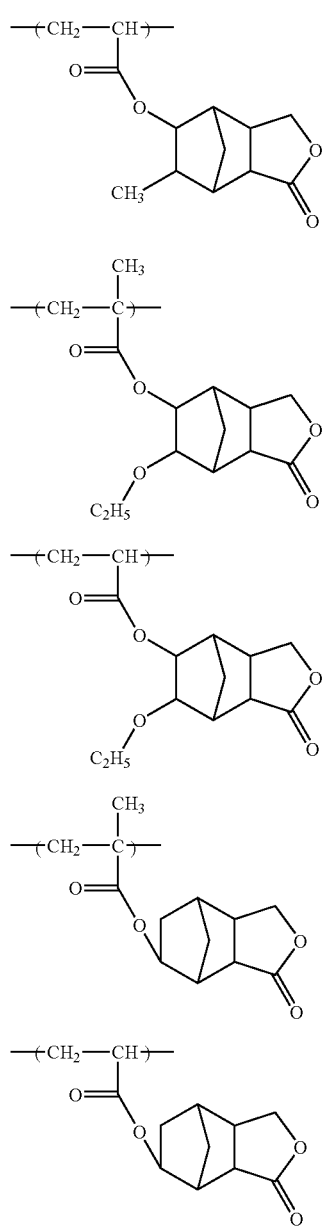
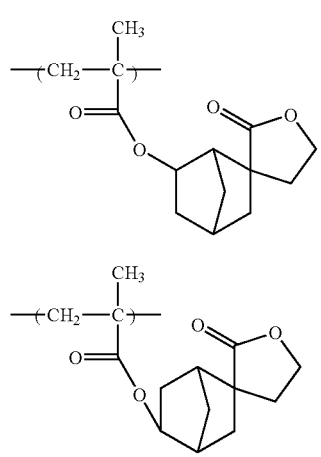
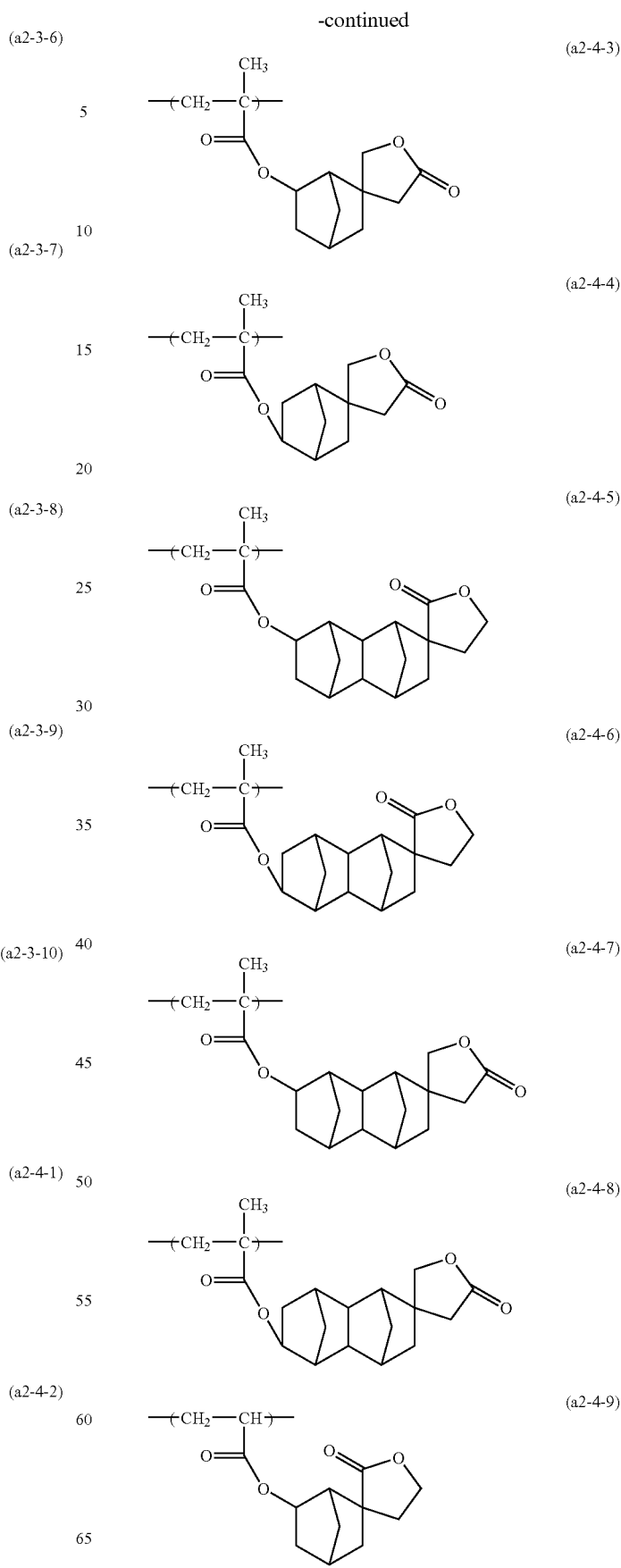

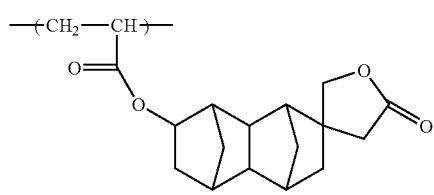
(a2-4-10)

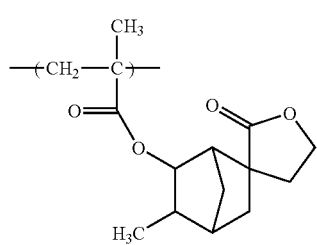
(a2-4-11)

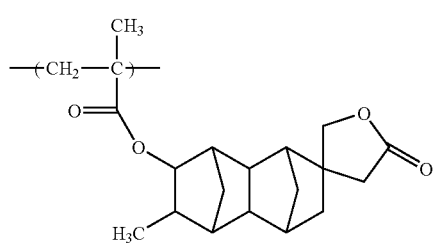
(a2-4-12)

[Chemical Formula 33.]

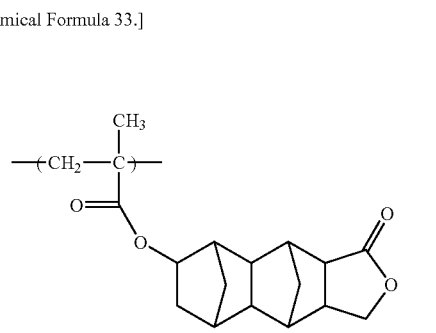
(a2-5-1)

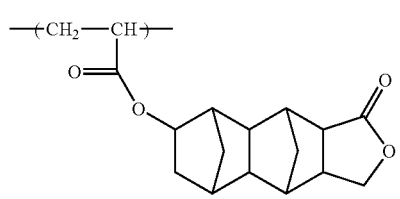
(a2-5-2)

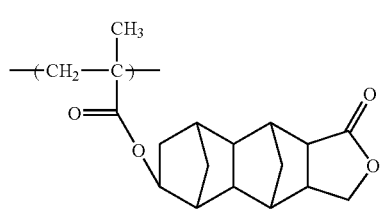
(a2-5-3)

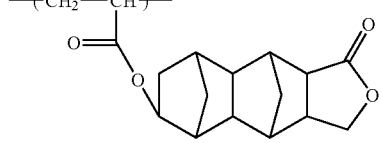
(a2-5-4)

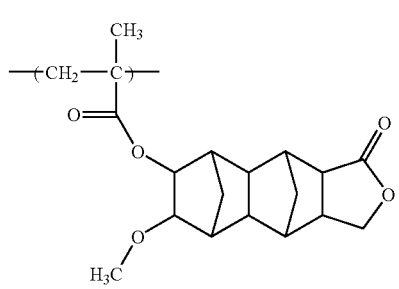
(a2-5-5)

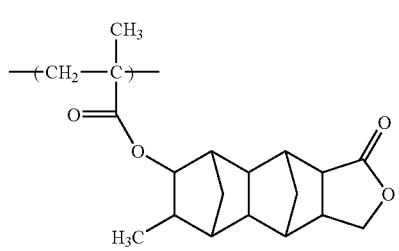
(a2-5-6)

In the component (A1), as the structural unit (a2), one type of structural unit may be used alone, or two or more types of structural units may be used in combination.

As the structural unit (a2), at least one structural unit selected from the group consisting of structural units represented by general formulas (a2-1) to (a2-5) is preferable, and at least one structural unit selected from the group consisting of structural units represented by general formulas (a2-1) to (a2-3) is more preferable. Of these, it is particularly desirable to use at least one structural unit selected from the group consisting of structural units represented by formulas (a2-1-1), (a2-1-2), (a2-1-3), (a2-1-4), (a2-2-1), (a2-2-2), (a2-2-9), (a2-2-10), (a2-3-1), (a2-3-2), (a2-3-9) and (a2-3-10).

In the component (A1), the amount of the structural unit (a2) based on the combined total of all structural units constituting the component (A1) is preferably within a range from 1 to 40 mol %, more preferably from 5 to 35 mol %, still more preferably from 10 to 30 mol %, and most preferably 10 to 25 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, the solubility of the component (A) in an organic solvent (S) described below is enhanced, and a good balance can also be achieved with the other structural units.

Structural Unit (a0-1)

The structural unit (a0-1) is a structural unit represented by general formula (a0-1) shown below.

[Chemical Formula 34.]

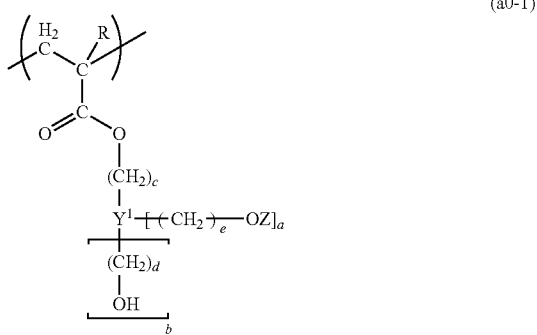

(a0-1)

In general formula (a0-1), R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

In general formula (a0-1), R represents a hydrogen atom, a lower alkyl group of 1 to 5 carbon atoms or a halogenated lower alkyl group of 1 to 5 carbon atoms.

The lower alkyl group and halogenated lower alkyl group for R are the same as the lower alkyl group and halogenated lower alkyl group which may be bonded to the α-position of the aforementioned acrylate ester. Of the various possibilities, R is preferably a hydrogen atom or a methyl group.

In general formula (a0-1) above, $Y^1$ represents an aliphatic cyclic group.

In the present descriptions and the claims, the term "aliphatic cyclic group" refers to a monocyclic group or polycyclic group that has no aromaticity.

The "aliphatic cyclic group" within the structural unit (a0-1) may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituents (aliphatic ring) is not limited to be constituted from only carbon and hydrogen (not limited to hydrocarbon rings), but is preferably a hydrocarbon ring. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a mono cycloalkane or a polycycloalkane such as a bicycloalkane, tricycloalkane or tetracycloalkane which may or may not be substituted with a lower alkyl group, a fluorine atom or a fluorinated alkyl group. Specific examples include groups in which two or more hydrogen atoms have been removed from a monocycloalkane such as cyclopentane and cyclohexane; and groups in which two or more hydrogen atoms have been removed from a polycycloalkane such as adamantane, norbornane, isobornane, tricyclodecane or tetracyclododecane.

The aliphatic cyclic group within the structural unit (a0-1) is preferably a polycyclic group, and a group in which two or more hydrogen atoms have been removed from adamantane is particularly desirable.

In general formula (a0-1), Z represents a tertiary alkyl group-containing group or an alkoxyalkyl group.

In the present description and the claims, the term "tertiary alkyl group" refers to an alkyl group having a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing group" refers to a group which includes a tertiary alkyl group in the structure thereof. The tertiary alkyl group-containing group may be either constituted of only a tertiary alkyl group, or constituted of a tertiary alkyl group and an atom or group other than a tertiary alkyl group.

Examples of the "atom or group other than a tertiary alkyl group" which constitutes the tertiary alkyl group-containing group with a tertiary alkyl group include a carbonyloxy group, a carbonyl group, an alkylene group and an oxygen atom.

As the tertiary alkyl group-containing group for Z, a tertiary alkyl group-containing group which does not have a ring structure, and a tertiary alkyl group-containing group which has a ring structure can be mentioned.

A tertiary alkyl group-containing group which does not have a ring structure is a group which has a branched tertiary alkyl group as the tertiary alkyl group, and has no ring in the structure thereof.

As the branched tertiary alkyl group, for example, a group represented by general formula (I) shown below may be mentioned.

[Chemical Formula 35.]

(I)

In formula (I), each of $R^{21}$ to $R^{23}$ independently represents a linear or branched alkyl group. The number of carbon atoms within the alkyl group is preferably from 1 to 5, and more preferably from 1 to 3.

Further, in the group represented by general formula (I), the total number of carbon atoms is preferably from 4 to 7, more preferably from 4 to 6, and most preferably 4 or 5.

Preferable examples of groups represented by general formula (I) include a tert-butyl group and a tert-pentyl group, and a tert-butyl group is more preferable.

Examples of tertiary alkyl group-containing groups which do not have a ring structure include the aforementioned branched tertiary alkyl group; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, an alkylene group of 1 to 4 carbon atoms is more preferable, and an alkylene group of 1 or 2 carbon atoms is the most desirable.

As a chain-like tertiary alkyloxycarbonyl group, for example, a group represented by general formula (II) shown below can be mentioned. In general formula (II), $R^{21}$ to $R^{23}$ are the same as defined for $R^{21}$ to $R^{23}$ in general formula (I) above. As the chain-like tertiary alkyloxycarbonyl group, a tert-butyloxycarbonyl group (t-boc) and a tert-pentyloxycarbonyl group are preferable.

[Chemical Formula 36.]

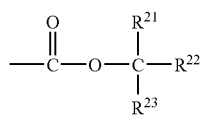
(II)

As a chain-like tertiary alkyloxycarbonylalkyl group, for example, a group represented by general formula (III) shown below can be mentioned. In general formula (III), $R^{21}$ to $R^{23}$ are the same as defined for $R^{21}$ to $R^{23}$ in general formula (I) above. f represents an integer of 1 to 3, and is preferably 1 or 2. As the chain-like tertiary alkyloxycarbonylalkyl group, a tert-butyloxycarbonylmethyl group and a tert-butyloxycarbonylethyl group are preferable.

Among these, as the tertiary alkyl group-containing group which does not have a ring structure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is the most preferable.

[Chemical Formula 37.]

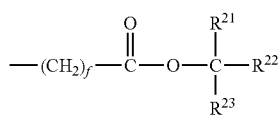
(III)

A tertiary alkyl group-containing group which has a ring structure is a group which contains a tertiary carbon atom and a ring in the structure thereof.

In the tertiary alkyl group-containing group which has a ring structure, the ring structure preferably has 4 to 12 carbon atoms which constitute the ring, more preferably 5 to 10 carbon atoms, and most preferably 6 to 10 carbon atoms. As the ring structure, for example, groups in which one or more hydrogen atoms have been removed from a mono cycloalkane or a polycycloalkane such as a bicycloalkane, tricycloalkane or tetracycloalkane may be mentioned. Preferable examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the tertiary alkyl group-containing group which has a ring structure, for example, a group having the following group (1) or (2) as the tertiary alkyl group can be mentioned.

(1) A group in which a linear or branched alkyl group is bonded to a carbon atom which constitutes the ring of a cyclic alkyl group (cycloalkyl group), so that the carbon atom becomes a tertiary carbon atom.

(2) A group in which an alkylene group (branched alkylene group) having a tertiary carbon atom is bonded to a carbon atom constituting the ring of a cycloalkyl group.

In the aforementioned group (1), the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, a 2-ethyl-2-adamantyl group, a 1-methyl-1-cycloalkyl group and a 1-ethyl-1-cycloalkyl group.

In the aforementioned group (2), the cycloalkyl group having a branched alkylene group bonded thereto may have a substituent. Examples of substituents include a fluorine atom, a fluorinated lower alkyl group of 1 to 5 carbon atoms which is substituted by a fluorine atom, and an oxygen atom (=O).

As an example of the group (2), a group represented by general formula (IV) shown below may be mentioned.

[Chemical Formula 38.]

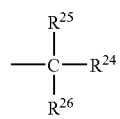
(IV)

In general formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms, and an oxygen atom (=O).

Each of $R^{25}$ and $R^{26}$ independently represents a linear or branched alkyl group. As the alkyl group, the same alkyl groups as those described above for $R^{21}$ to $R^{23}$ in general formula (I) may be mentioned.

As the alkoxyalkyl group for Z, for example, a group represented by general formula (V) shown below may be mentioned.

[Chemical Formula 39.]

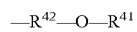

—$R^{42}$—O—$R^{41}$ (V)

In formula (V), $R^{41}$ represents a linear, branched or cyclic alkyl group.

When $R^{41}$ represents a linear or branched alkyl group, it is preferably an alkyl group of 1 to 5 carbon atoms, more preferably an ethyl group or a methyl group, and an ethyl group is particularly desirable.

When $R^{41}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group, may be mentioned. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

$R^{42}$ represents a linear or branched alkylene group. The alkylene group preferably has 1 to 5 carbon atoms, more preferably 1 to 3 carbon atoms, and most preferably 1 or 2 carbon atoms.

As the alkoxyalkyl group for Z, a group represented by general formula (VI) shown below is particularly desirable.

[Chemical Formula 40.]

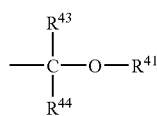

(VI)

In general formula (VI), $R^{41}$ is the same as defined above, and each of $R^{43}$ and $R^{44}$ independently represents a linear or branched alkyl group or a hydrogen atom.

With respect to $R^{43}$ and $R^{44}$, the alkyl group preferably has 1 to 15 carbon atoms, and may be either linear or branched. The alkyl group for $R^{43}$ and $R^{44}$ is preferably an ethyl group or a methyl group, and is most preferably a methyl group. It is particularly desirable that either one of $R^{43}$ and $R^{44}$ be a hydrogen atom, and the other be a methyl group.

Among the above-mentioned examples, as Z, a tertiary alkyl group-containing group is preferable, a group represented by general formula (II) above is more preferable, and a tert-butyloxycarbonyl group (t-boc) is most preferable.

In general formula (a0-1), a represents an integer of 1 to 3, and b represents an integer of 0 to 2, with the provision that a+b=1 to 3.

a is preferably 1 or 2. When a is 1 or 2, superior effects can be achieved in suppressing pattern collapse and improving the pattern shape. Further, it is presumed that proximity effect can be reduced. The proximity effect refers to the influence on the size and shape of a resist pattern by a pattern formed in the proximity thereof. The smaller the influence (i.e., smaller the proximity effect), the smaller the difference in the pattern size with various pitch, which is preferable.

In addition, when a is 2, the solubility in an organic solvent is improved.

b is preferably 0.

a+b is preferably 1 or 2.

c represents an integer of 0 to 3, preferably 0 or 1, and more preferably 0.

d represents an integer of 0 to 3, preferably 0 or 1, and more preferably 0.

e represents an integer of 0 to 3, preferably 0 or 1, and more preferably 0.

As the structural unit (a0-1), a structural unit represented by general formula (a0-1-1) or (a0-1-2) shown below is particularly desirable.

[Chemical Formula 41.]

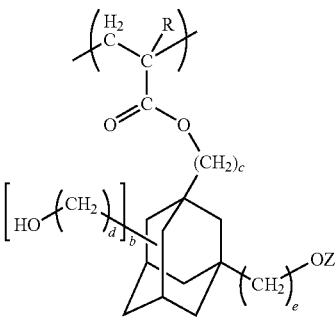

(a0-1-1)

In the formula, R, Z, b, c, d and e are respectively the same as defined above.

[Chemical Formula 42.]

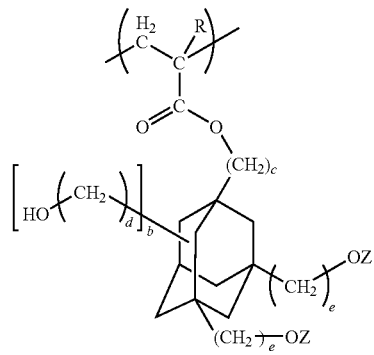

(a0-1-2)

In the formula, R, Z, b, c, d and e are respectively the same as defined above, and the plurality of e and Z may be the same or different from each other.

A monomer for deriving the structural unit (a0-1) can be synthesized, for example, by protecting part or all of the hydroxyl groups within a compound represented by general formula (a0-1') shown below (namely, an acrylate ester containing an aliphatic cyclic group having 1 to 3 alcoholic hydroxyl groups) with tertiary alkyl group-containing groups or alkoxyalkyl groups by a conventional method.

[Chemical Formula 43.]

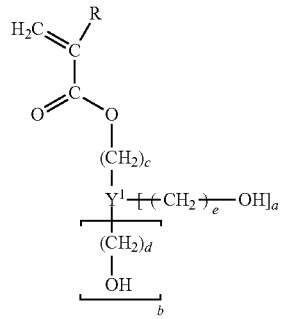

(a0-1')

In the formula, R, $Y^1$, a, b, c, d and e are respectively the same as defined above.

As the structural unit (a0-1), one type of structural unit may be used alone, or two or more types of structural units may be used in combination.

The amount of the structural unit (a0-1) within the component (A) based on the combined total of all structural units constituting the component (A) is preferably 1 to 45 mol %, more preferably 5 to 45 mol %, still more preferably 5 to 40 mol %, and most preferably 5 to 35 mol %. When the amount of the structural unit (a0-1) is at least as large as the lower limit of the above-mentioned range, the solubility of the component (A) in an organic solvent is improved. On the other hand, when the amount of the structural unit (a0-1) is no more than the upper limit of the above-mentioned range, a good balance can be achieved with the other structural units.

Structural Unit (a0-2)

The structural unit (a0-2) is a structural unit represented by general formula (a0-2) shown below.

[Chemical Formula 44.]

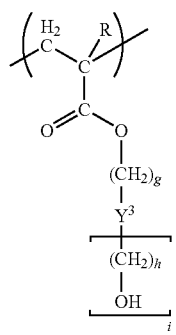

(a0-2)

In the formula, R represents a hydrogen atom, a lower alkyl group of 1 to 5 carbon atoms or a halogenated lower alkyl group of 1 to 5 carbon atoms; $Y^3$ represents an alkylene group or an aliphatic cyclic group; each of g and h independently represents an integer of 0 to 3; and i represents an integer of 1 to 3.

In general formula (a0-2) above, R represents a hydrogen atom, a lower alkyl group of 1 to 5 carbon atoms or a halogenated lower alkyl group of 1 to 5 carbon atoms. As R, the same groups as those described above for R defined in general formula (a0-1) can be mentioned.

$Y^3$ represents an alkylene group or an aliphatic cyclic group.

As the alkylene group for $Y^3$, an alkylene group of 1 to 10 carbon atoms can be used.

As the aliphatic cyclic group for $Y^3$, the same groups as those described above for the aliphatic cyclic group for $Y^1$ in general formula (a0-1) can be mentioned. It is preferable that the structure of the basic ring (aliphatic ring) in $Y^3$ be the same as that in $Y^1$.

g represents an integer of 0 to 3, preferably 0 or 1, and more preferably 0.

h represents an integer of 0 to 3, preferably 0 or 1, and more preferably 0.

i represents an integer of 1 to 3, preferably 1 or 2, and more preferably 1.

As the structural unit (a0-2), a structural unit represented by general formula (a0-2-1) shown below is preferable, and a structural unit in which one of the i groups of —(CH$_2$)$_h$—OH is bonded to the 3rd position of the 1-adamantyl group is particularly desirable.

[Chemical Formula 45.]

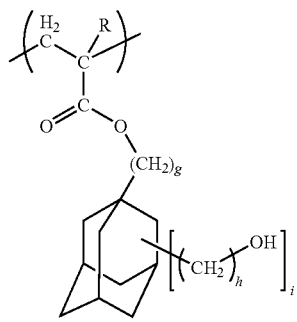

(a0-2-1)

In the formula, R, g, h and i are respectively the same as defined above.

As the structural unit (a0-2), one type of structural unit may be used alone, or two or more types of structural units may be used in combination.

The amount of the structural unit (a0-2) within the component (A) based on the combined total of all structural units constituting the component (A) is preferably 1 to 40 mol %, more preferably 1 to 35 mol %, still more preferably 5 to 30 mol %, and most preferably 5 to 25 mol %. When the amount of the structural unit (a0-2) is at least as large as the lower limit of the above-mentioned range, the rectangulart of the cross-sectional shape of the resist pattern is improved, and hence, a resist pattern having an excellent shape can be formed. On the other hand, when the amount of the structural unit (a0-2) is no more than the upper limit of the above-mentioned range, a good balance can be achieved with the other structural units.

Structural Unit (a3)

In the positive resist composition of the present invention, in addition to the structural unit (a1), the component (A1) may further include a structural unit other than the above-mentioned structural units (a1), (a2), (a0-1) and (a0-2), as long as the effects of the present invention are not impaired.

Examples of other structural units include a structural unit (a3) derived from an acrylate ester containing a polar group-containing aliphatic hydrocarbon group, provided that the structural unit (a3) does not include the structural units represented by the aforementioned general formulas (a0-1) and (a0-2).

When the component (A1) includes the structural unit (a3), the hydrophilicity of the component (A) is enhanced, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of the polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

Preferable examples of the structural unit (a3) include structural units represented by formulas (a3-1), (a3-2), and (a3-3) shown below.

[Chemical Formula 46.]

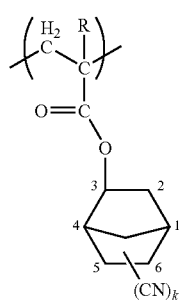
(a3-1)

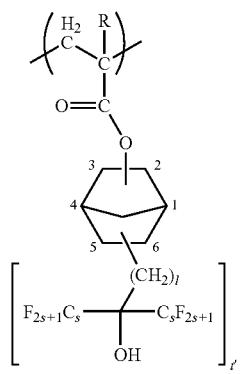
(a3-2)

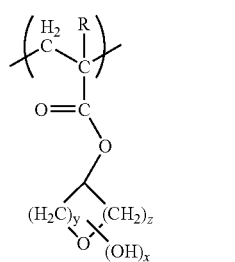
(a3-3)

In the formulas, R is as defined above; k represents an integer of 1 to 3; t' represents an integer of 1 to 3; l represents an integer of 1 to 5; s represents an integer of 1 to 3; x represents an integer of 1 or 2; y represents an integer of 0 to 2 and z represents an integer of 1 to 3, with the proviso that y+z is an integer of 2 or more.

In general formula (a3-1), k is preferably 1. The cyano group is preferably bonded to the 5th or 6th position of the norbornyl group.

In formula (a3-2), t' is preferably 1, l is preferably 1 and s is preferably 1. Further, it is preferable that a 2-norbonyl group or 3-norbonyl group be bonded to the terminal of the carboxyl group of the acrylic acid. The fluorinated alkyl alcohol is preferably bonded to the 5th or 6th position of the norbornyl group.

In general formula (a3-3), x represents an integer of 1 or 2, and is preferably 1.
y represents an integer of 0 to 2, and is preferably 1.
z represents an integer of 1 to 3, and is preferably 2.
y+z is an integer of 2 or more, preferably 2 to 4, and most preferably 3.

In those cases where x is 1, the substitution position of the hydroxyl group may be any position. It is particularly desirable that the hydroxyl group be bonded to the carbon atom adjacent to the carbon atom which is bonded to the terminal oxygen atom of —C(O)—O—. Moreover, in those cases where x is 2, any combination of substitution positions can be used.

Among the above examples, 3-methacryloyloxy-4-hydroxytetrahydrofuran and 3-acrylolyloxy-4-hydroxytetrahydrofuran are particularly desirable.

When the component (A1) includes the structural unit represented by formula (a3-3), not only the compatibility of the component (A) with the developing solution is enhanced, but also the adhesion between the resist film and the substrate is improved.

As the structural unit (a3), one type of structural unit may be used alone, or two or more types of structural units may be used in combination.

When the component (A) contains the structural unit (a3), the amount of the structural unit (a3) based on the combined total of all structural units constituting the component (A) is preferably 1 to 40 mol %, more preferably 5 to 35 mol %, and still more preferably 10 to 35 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

Structural Unit (a4)

In the positive resist composition of the present invention, the component (A1) may include a structural unit (a4) as another structural unit, as long as the effects of the present invention are not impaired.

As the structural unit (a4), any other structural unit which cannot be classified as one of the above-mentioned structural units (a1), (a2), (a0-1), (a0-2) and (a3) can be used without any particular limitations, and any of the multitude of conventional structural units used within resist resins for ArF excimer lasers or KrF excimer lasers (and particularly for ArF excimer lasers) can be used.

As the structural unit (a4), for example, a structural unit derived from an acrylate ester that contains a non-acid-dissociable aliphatic polycyclic group is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 47.]

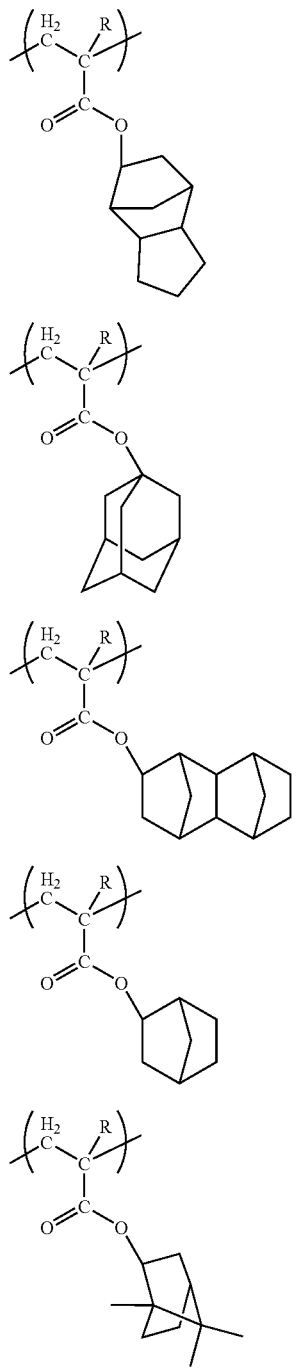

In the formulas, R is as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) is preferably a resin component having the structural unit (a1).

Preferable examples of such resin components include a copolymer having the structural units (a1) and (a2); a copolymer having the structural units (a1) and (a0-1); a copolymer having the structural units (a1), (a2) and (a0-1); a copolymer having the structural units (a1) and (a0-2); a copolymer having the structural units (a1), (a2) and (a0-2); a copolymer having the structural units (a1), (a0-1) and (a0-2); and a copolymer having the structural units (a1), (a2), (a0-1) and (a0-2).

Examples of such copolymers include a copolymer consisting of the structural units (a1), (a2), (a0-1) and (a0-2); a copolymer consisting of the structural units (a1), (a2), (a0-1) and (a3); and a copolymer consisting of the structural units (a1), (a0-1) and (a3).

In the present invention, as the component (A1), a polymeric compound that includes a combination of structural units such as that shown below is particularly desirable.

[Chemical Formula 48.]

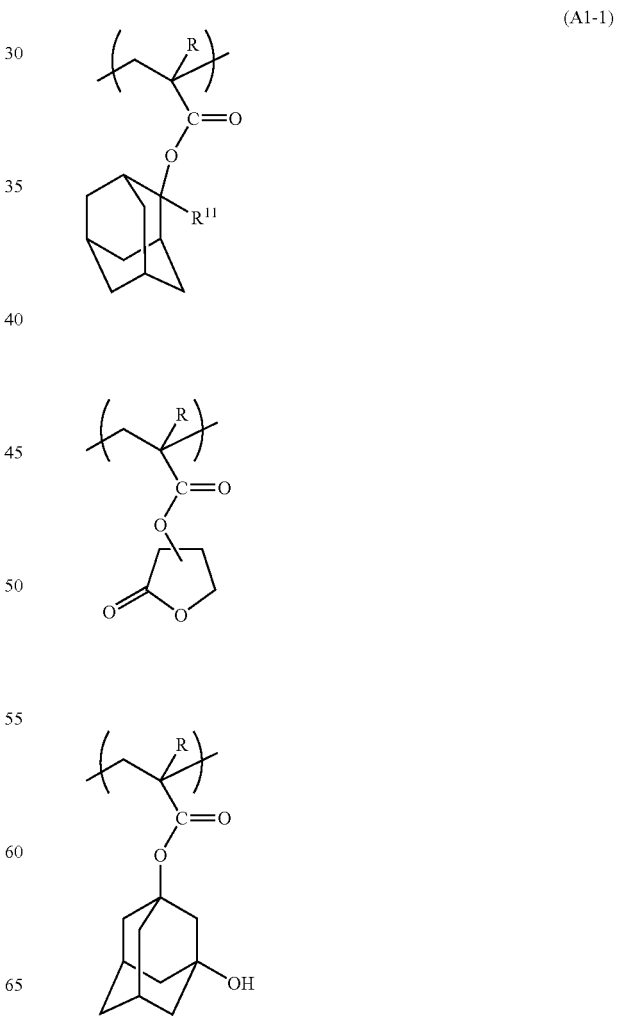

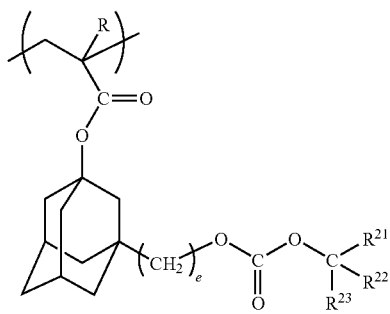

In formula (A1-1), R is the same as defined above, and the plurality of R may be either the same or different from each other; $R^{11}$ is the same as defined for $R^{11}$ in formula (a1-1-01); $R^{21}$ to $R^{23}$ are the same as defined for $R^{21}$ to $R^{23}$ in formula (II) above; and e is the same as defined for e in formula (a0-1) above.

[Chemical Formula 49.]

(A1-2)

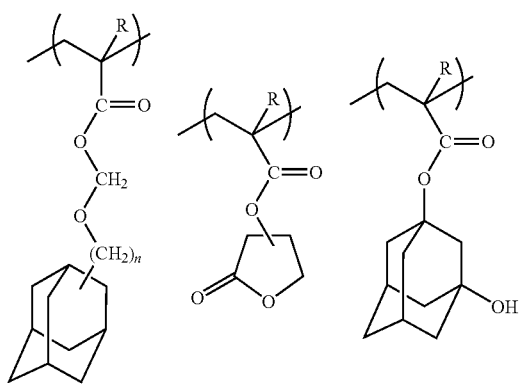

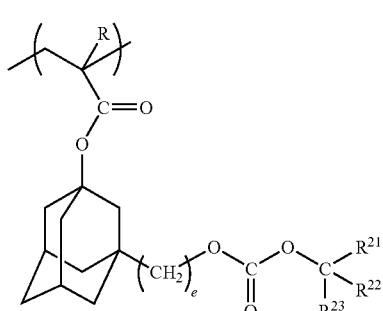

In formula (A1-2), R is the same as defined above, and the plurality of R may be either the same or different from each other; n is as defined for n in formula (p1); $R^{21}$ to $R^{23}$ are the same as defined for $R^{21}$ to $R^{23}$ in formula (II); and e is the same as defined for e in formula (a0-1).

[Chemical Formula 50.]

(A1-3)

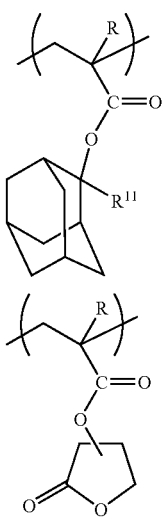

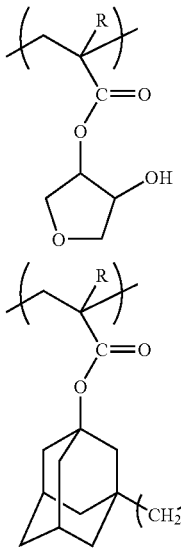

In formula (A1-3), R is the same as defined above, and the plurality of R may be either the same or different from each other; $R^{11}$ is the same as defined for $R^{11}$ in formula (a1-1-01); $R^{21}$ to $R^{23}$ are the same as defined for $R^{21}$ to $R^{23}$ in formula (II); and e is the same as defined for e in formula (a0-1).

[Chemical Formula 51.]

(A1-4)

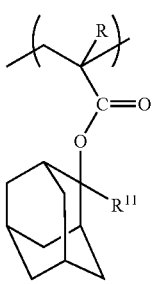 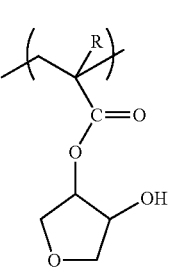

-continued

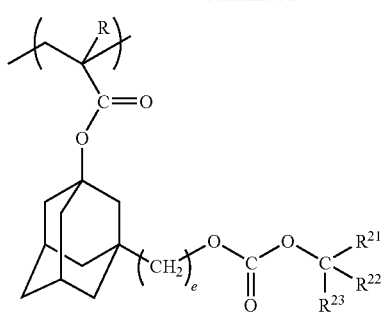

In formula (A1-4), R is the same as defined above, and the plurality of R may be either the same or different from each other; $R^{11}$ is the same as defined for $R^{11}$ in formula (a1-1-01); $R^{21}$ to $R^{23}$ are the same as defined for $R^{21}$ to $R^{23}$ in formula (II); and e is the same as defined for e in formula (a0-1).

[Chemical Formula 52.]

(A1-5)

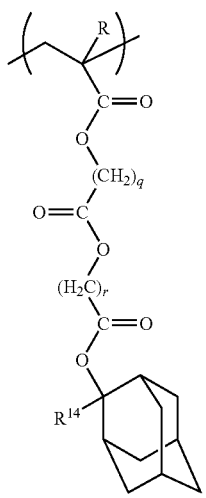

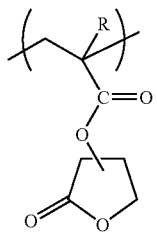

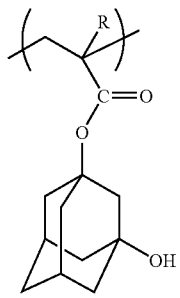

-continued

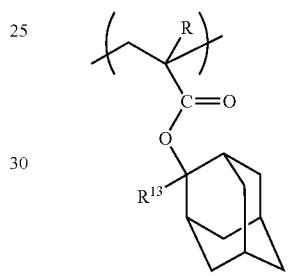

In formula (A1-5), R is the same as defined above, and the plurality of R may be either the same or different from each other; $R^{14}$, q and r are the same as defined above; $R^{21}$ to $R^{23}$ are the same as defined for $R^{21}$ to $R^{23}$ in formula (II); and e is the same as defined for e in formula (a0-1).

[Chemical Formula 53.]

(A1-6)

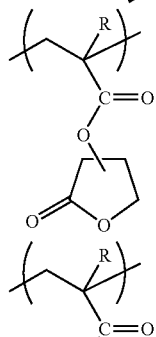

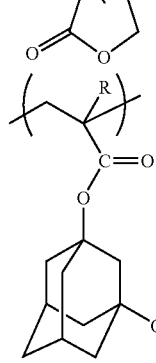

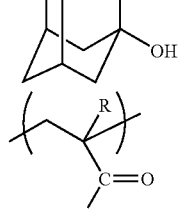

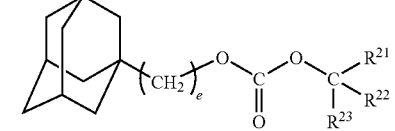

In formula (A1-6), R is the same as defined above, and the plurality of R may be either the same or different from each other; $R^{13}$ is the same as defined for $R^{13}$ in formula (a1-1-03); $R^{21}$ to $R^{23}$ are the same as defined for $R^{21}$ to $R^{23}$ in formula (II); and e is the same as defined for e in formula (a0-1).

[Chemical Formula 54.]

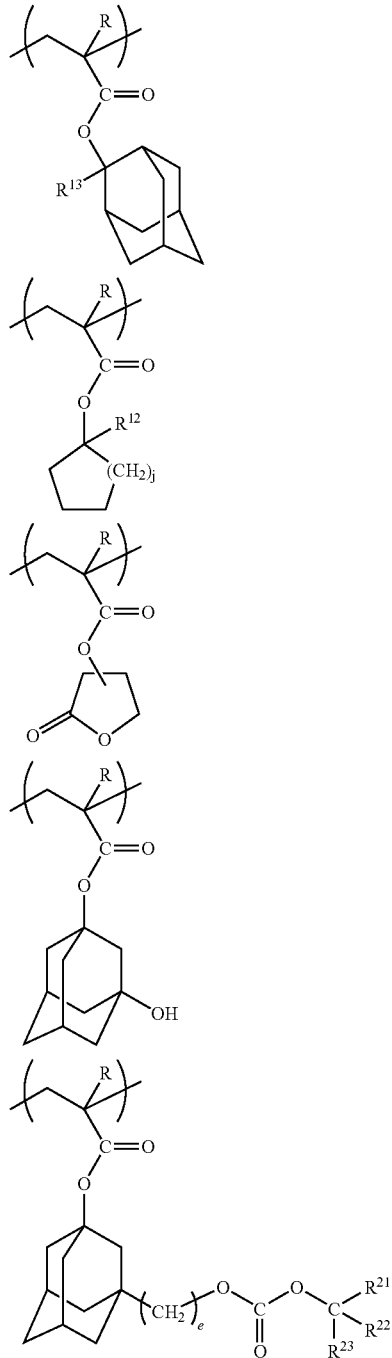

(A1-7)

In formula (A1-7), R is the same as defined above, and the plurality of R may be either the same or different from each other; $R^{13}$ is the same as defined for $R^{13}$ in formula (a1-1-03); $R^{12}$ and j are the same as defined for $R^{12}$ and j in formula (a1-1-02); $R^{21}$ to $R^{23}$ are the same as defined for $R^{21}$ to $R^{23}$ in formula (II); and e is the same as defined for e in formula (a0-1).

[Chemical Formula 55.]

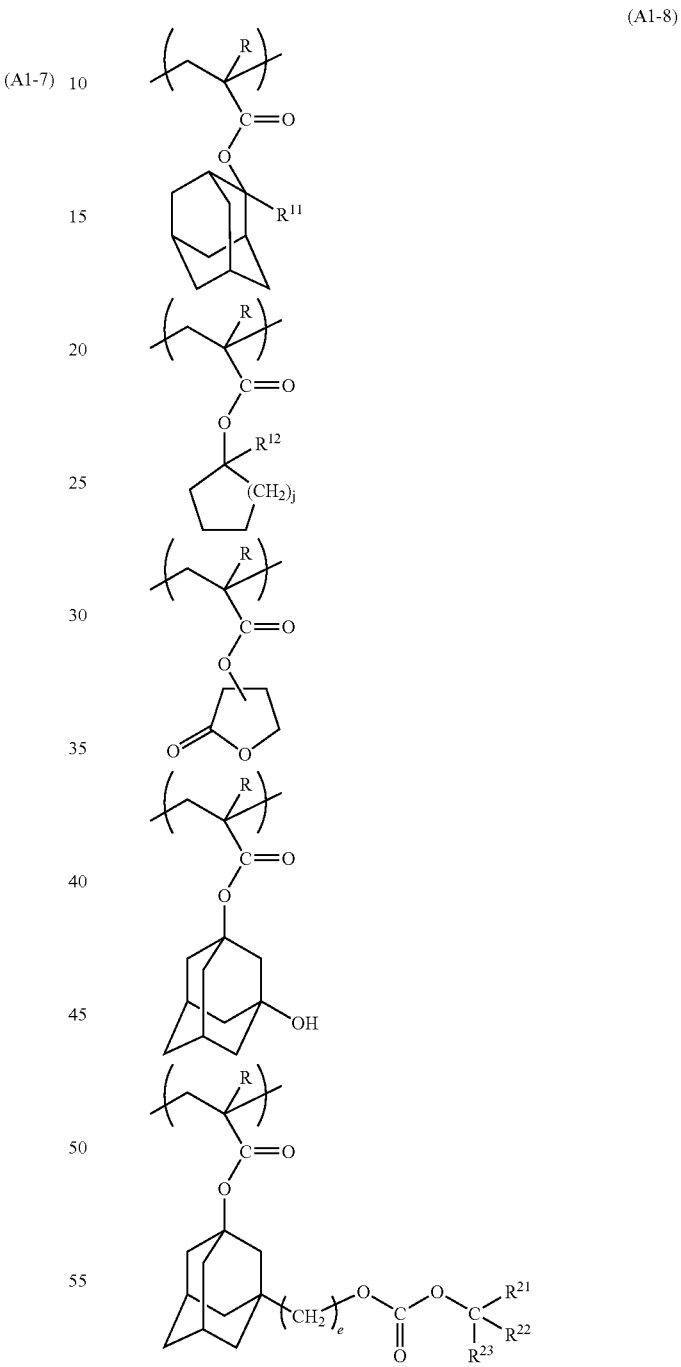

(A1-8)

In formula (A1-8), R is the same as defined above, and the plurality of R may be either the same or different from each other; $R^{11}$ is the same as defined for $R^{11}$ in formula (a1-1-01); $R^{12}$ and j are the same as defined for $R^{12}$ and j in formula (a1-1-02); $R^{21}$ to $R^{23}$ are the same as defined for $R^{21}$ to $R^{23}$ in formula (II); and e is the same as defined for e in formula (a0-1).

[Chemical Formula 56.]

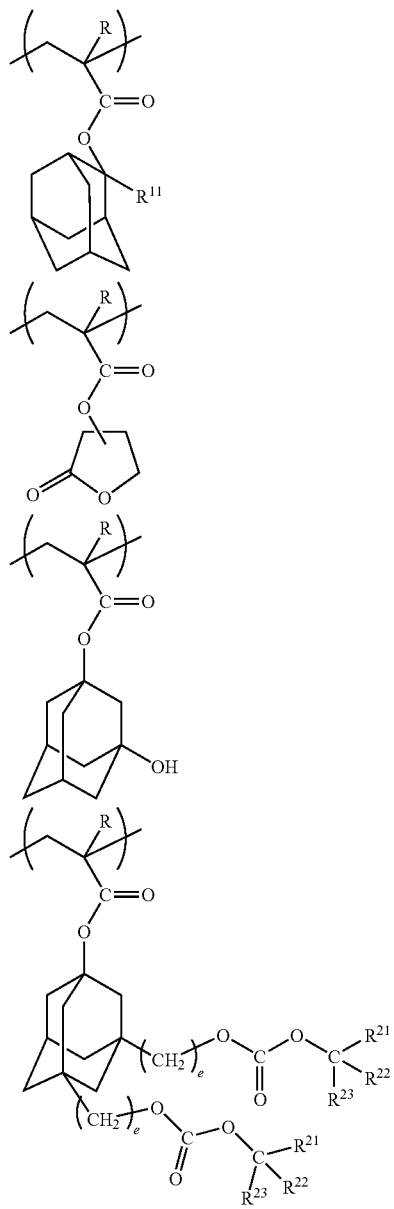

(A1-9)

In formula (A1-9), R is the same as defined above; $R^{11}$ is the same as defined for $R^{11}$ in formula (a1-1-01); $R^{21}$ to $R^{23}$ are the same as defined for $R^{21}$ to $R^{23}$ in formula (II); e is the same as defined for e in formula (a0-1); and the plurality of R, $R^{21}$ to $R^{23}$ and e may individually be the same or different from each other.

In the component (A), as the component (A1), one type may be used alone, or two or more types may be combined for use as a mixed resin composition.

The component (A1) can be obtained, for example, by a conventional radical polymerization or the like of the monomers corresponding with each of the structural units, using a radical polymerization initiator such as azobisisobutyronitrile (AIBN) and dimethyl azobisisobutyrate.

Furthermore, in the component (A1), by using a chain transfer agent such as HS—$CH_2$—$CH_2$—$CH_2$—$C(CF_3)_2$—OH during the polymerization, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By ensuring that the weight average molecular weight is no more than the upper limit of the above-mentioned range, the polymeric compound (A1) exhibits satisfactory solubility in a resist solvent when used as a resist. On the other hand, by ensuring that the weight average molecular weight is at least as large as the lower limit of the above-mentioned range, the dry etching resistance and cross-sectional shape of the resist pattern become satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), a low molecular weight compound that has a molecular weight of at least 500 but less than 2,000, contains a hydrophilic group, and also contains an acid dissociable, dissolution inhibiting group such as the groups mentioned above in the description of the component (A1) is preferable. Specific examples include compounds containing a plurality of phenol skeletons in which a part of the hydrogen atoms within hydroxyl groups have been substituted with the aforementioned acid dissociable, dissolution inhibiting groups.

Preferable examples of the component (A2) include low molecular weight phenolic compounds that are known, for example, as sensitizers or heat resistance improvers for use in non-chemically amplified g-line or i-line resists, wherein some of the hydroxyl group hydrogen atoms of these compounds have been substituted with the aforementioned acid dissociable, dissolution inhibiting groups, and any of these compounds may be used.

Examples of these low molecular weight phenolic compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. It goes without saying that the low molecular weight phenolic compound is not limited to these examples.

Also, there are no particular limitations on the acid dissociable, dissolution inhibiting group, and suitable examples include the groups described above.

In the component (A), as the component (A2), one type may be used alone, or two or more types may be used in combination.

In the positive resist composition of the present invention, as the component (A), one type of component may be used alone, or two or more types may be used in combination.

In the positive resist composition of the present invention, the amount of the component (A) can be appropriately adjusted depending on the thickness of the resist film to be formed, and the like.

<Component (B)>

In the positive resist composition of the present invention, as the component (B), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, a compound represented by general formula (b-1) or (b-2) shown below can be used.

[Chemical Formula 57.]

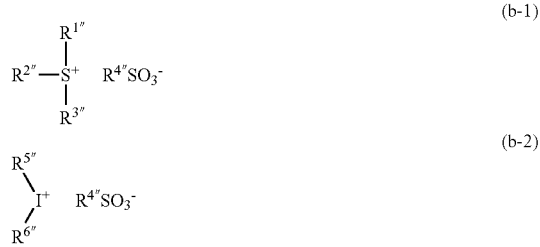

wherein, $R^{1''}$ to $R^{3''}$, $R^{5''}$ and $R^{6''}$ each independently represents an aryl group which may have a substituent, or an alkyl group which may have a substituent, wherein two of $R^{1''}$ to $R^{3''}$ in formula (b-1) may be bonded to each other to form a ring with the sulfur atom in the formula; and $R^{4''}$ represents an alkyl group, a halogenated alkyl group, an aryl group or an alkenyl group which may have a substituent; with the proviso that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. Two of $R^{1''}$ to $R^{3''}$ in formula (b-1) may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. Examples thereof include an unsubstituted aryl group having 6 to 20 carbon atoms, a substituted aryl group in which a part or all of the hydrogen atoms of the aforementioned unsubstituted aryl group has been substituted with alkyl groups, alkoxy groups, alkoxyalkyloxy groups, alkoxycarbonylalkyloxy groups, —O—C(=O)—$R^b$ (in the formula, $R^b$ represents an alkyl group), halogen atoms, hydroxyl groups or the like, and —($R^{4'}$)—C(=O)—$R^{5'}$. $R^{4'}$ represents an alkylene group of 1 to 5 carbon atoms. $R^{5'}$ represents an aryl group. As the aryl group for $R^{5'}$, the same as the aryl group for $R^{1''}$ to $R^{3''}$ can be mentioned.

The unsubstituted aryl group is preferably an aryl group having 6 to 10 carbon atoms because it can be synthesized at a low cost. Specific examples thereof include a phenyl group and a naphthyl group.

The alkyl group as the substituent for the substituted aryl group is preferably an alkyl group having 1 to 5 carbon atoms, and particularly preferably a methyl group, an ethyl group, a propyl group, an n-butyl group, or a tert-butyl group.

The alkoxy group as the substituent for the substituted aryl group is preferably an alkoxy group having 1 to 5 carbon atoms, and particularly preferably a methoxy group, an ethoxy group, an n-propoxy group, an iso-propoxy group, an n-butoxy group or a tert-butoxy group.

The halogen atom as the substituent for the substituted aryl group is preferably a fluorine atom.

Examples of the alkoxyalkyloxy group as the substituent for the substituted aryl group include a group represented by a general formula: —O—C($R^{47}$)($R^{48}$)—O—$R^{49}$ (wherein each of $R^{47}$ and $R^{48}$ independently represents a hydrogen atom or a linear or branched alkyl group; and $R^{49}$ represents an alkyl group).

The alkyl group for $R^{47}$ and $R^{48}$ preferably has 1 to 5 carbon atoms, and may be either linear or branched, and is preferably an ethyl group or a methyl group, and most preferably a methyl group.

It is preferable that at least one of $R^{47}$ and $R^{48}$ be a hydrogen atom, and it is particularly desirable that either one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, ethyl group, propyl group, n-butyl group and tert-butyl group.

The cyclic alkyl group for $R^{49}$ preferably has 4 to 15 carbon atoms, more preferably 4 to 12 carbon atoms, and most preferably 5 to 10 carbon atoms.

Specific examples thereof include groups in which one or more hydrogen atoms have been removed from a monocycloalkane or a polycycloalkane such as a bicycloalkane, tricycloalkane or tetracycloalkane, and which may or may not be substituted with alkyl groups of 1 to 5 carbon atoms, fluorine atoms or fluorinated alkyl groups. Examples of the monocycloalkane include cyclopentane and cyclohexane. Examples of polycycloalkane include adamantane, norbornane, isobornane, tricyclodecane and tetracyclododecane. Of these, a group in which one or more hydrogen atoms have been removed from adamantane is preferable.

Examples of the alkoxycarbonylalkyloxy group as the substituent for the substituted aryl group include a group represented by a general formula: —O—$R^{50}$—C(=O)—O—$R^{55}$ (wherein $R^{50}$ represents a linear or branched alkylene group; and $R^{55}$ represents an alkyl group, preferably a tertiary alkyl group).

The linear or branched alkylene group for $R^{50}$ preferably has 1 to 5 carbon atoms, and examples thereof include a methylene group, ethylene group, trimethylene group, tetramethylene group and 1,1-dimethylethylene group.

Examples of tertiary alkyl groups usable as the alkyl group for $R^{55}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a -(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Examples of other preferable alkyl groups for $R^{55}$ include a decyl group, a tricyclodecanyl group, an adamantyl group, a 1-(1-adamantyl)methyl group, a tetracyclododecanyl group, an isobornyl group, and a norbornyl group.

In the —O—C(=O)—$R^b$ group ($R^b$ represents an alkyl group) for the substituted aryl group, preferable examples of alkyl groups for $R^b$ include a decyl group, a tricyclodecanyl group, an adamantyl group, a 1-(1-adamantyl)methyl group, a tetracyclododecanyl group, an isobornyl group, and a norbornyl group.

The aryl group for $R^{1'''}$ to $R^{3'''}$ is preferably a phenyl group or a naphthyl group.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1'''}$ to $R^{3'''}$ are bonded to each other to form a ring with the sulfur atom in the formula, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom.

When two of $R^{1'''}$ to $R^{3'''}$ are bonded to each other to form a ring with the sulfur atom in the formula, the remaining one of $R^{1'''}$ to $R^{3'''}$ is preferably an aryl group. As examples of the aryl group, the same as the above-mentioned aryl groups for $R^{1'''}$ to $R^{3'''}$ can be mentioned.

Specific examples of cation moiety represented by general formula (b-1) include triphenylsulfonium, (3,5-dimethylphenyl)diphenyl sulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

As the cation moiety represented by general formula (b-1), cations represented by general formulas (b-1-1) to (b-1-13) shown below are preferable. Among these, cation moieties having a triphenyl skeleton, such as cation moieties represented by formulas (b-1-1) to (b-1-8) and (b-1-11) to (b-1-13) shown below are particularly desirable.

In formulas (b-1-9) and (b-1-10) shown below, each of $R^7$ and $R^{10}$ independently represents a phenyl group or naphthyl group which may have a substituent, an alkyl group of 1 to 5 carbon atoms, an alkoxy group or a hydroxyl group.

v is an integer of 1 to 3, and most preferably 1 or 2.

[Chemical Formula 58.]

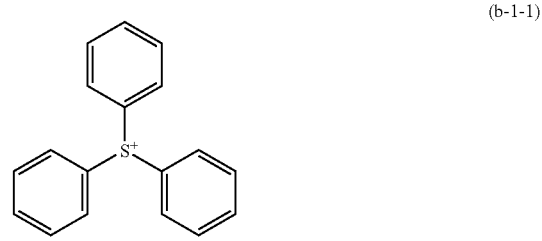
(b-1-1)

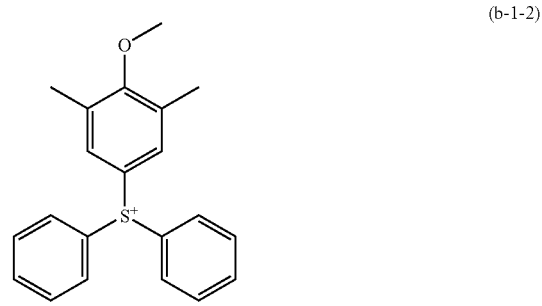
(b-1-2)

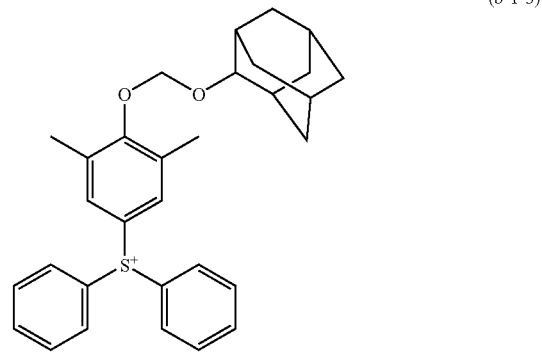
(b-1-3)

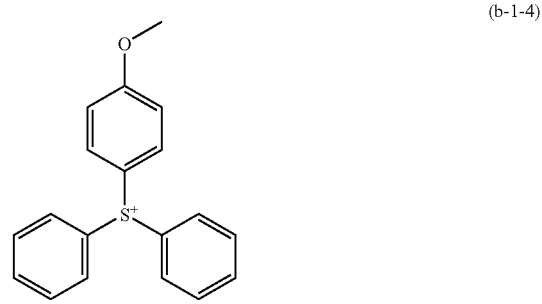
(b-1-4)

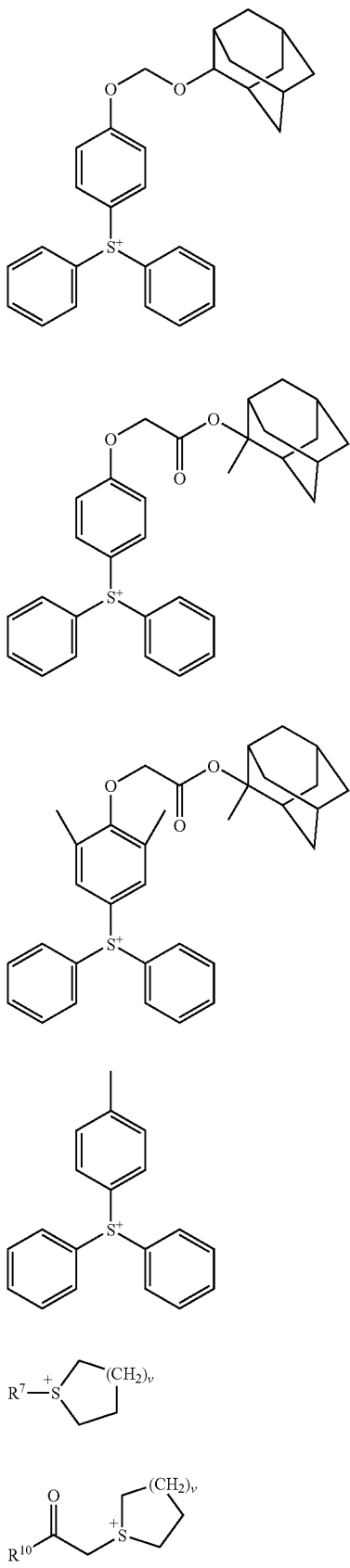

In the above formula (b-2), $R^{5''}$ and $R^{6''}$ each independently represents an aryl group or an alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same as the aryl groups for $R^{1''}$ to $R^{3''}$ can be mentioned.

As the alkyl group for $R^{5''}$ and $R^{6''}$, the same as the alkyl groups for $R^{1''}$ to $R^{3''}$ can be mentioned.

It is particularly desirable that both of $R^{5''}$ and $R^{6''}$ represent a phenyl group.

Specific examples of the cation moiety represented by general formula (b-2) include diphenyliodonium and bis(4-tert-butylphenyl)iodonium.

$R^{4''}$ represents an alkyl group, a halogenated alkyl group, an aryl group or an alkenyl group which may have a substituent.

The alkyl group for $R^{4''}$ may be any of linear, branched or cyclic, and a linear or cyclic alkyl group is preferable.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as those mentioned above in relation to $R^{1'''}$, having 4 to 15 carbon atoms, more preferably 4 to 10 carbon atoms, and most preferably 6 to 10 carbon atoms.

When $R^{4'''}$ represents an alkyl group which may have a substituent, examples of anion moieties include methanesulfonate, n-propanesulfonate, n-butanesulfonate and n-octanesulfonate.

As an example of the halogenated alkyl group for $R^{4'''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable. In other words, the halogenated alkyl group is preferably a linear, branched or cyclic fluorinated alkyl group which may have a substituent. When $R^{4'''}$ represents a fluorinated alkyl group which may have a substituent, an anion moiety is preferably a perfluoroalkyl group, and specific examples thereof include trifluoromethanesulfonate, heptafluoropropanesulfonate and nonafluorobutanesulfonate.

In the halogenated alkyl group, the ratio of the number of halogen atoms relative to the combined total of halogen atoms and hydrogen atoms within the halogenated alkyl group (namely, the halogenation ratio (%)) is preferably 10 to 100%, more preferably 50 to 100%, and is most preferably 100% (i.e., a halogenated alkyl group in which all of the hydrogen atoms have been substituted with halogen atoms is most preferable).

Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by formula $X-Q^1-$ [wherein $Q^1$ represents a divalent linking group containing an oxygen atom; and X represents a hydrocarbon group of 3 to 30 carbon atoms which may have a substituent].

Examples of the halogen atom and alkyl group include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X-Q^1-$, $Q^1$ represents a divalent linking group containing an oxygen atom.

$Q^1$ may contain an atom other than an oxygen atom. Examples of the atom other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate group (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As $Q^1$, a divalent linking group containing an ester bond or an ether bond is preferable, and a group —$R^{91}$—O—, —$R^{92}$—O—C(=O)— or —C(=O)—O—$R^{93}$—O—C(=O)— is particularly desirable.

In the group represented by formula $X-Q^1-$, the hydrocarbon group for X may be either an aromatic hydrocarbon group or an aliphatic hydrocarbon group.

An aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group include a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Examples of the aforementioned halogenated alkyl group include a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 60.]

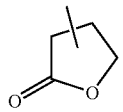
(L1)

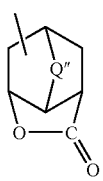
(L2)

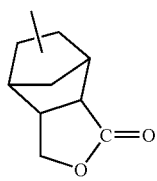
(L3)

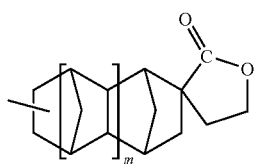
(L4)

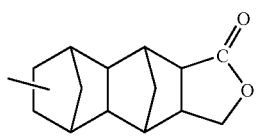
(L5)

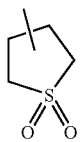
(S1)

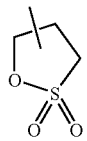
(S2)

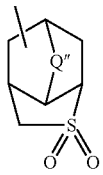
(S3)

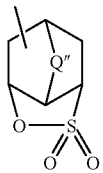
(S4)

wherein Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents an integer of 0 or 1.

As the alkylene group for Q", $R^{94}$ and $R^{95}$, the same alkylene groups as those described above for $R^{91}$ to $R^{93}$ can be used.

In these aliphatic cyclic groups, a part of the hydrogen atoms bound to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups for substituting a part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and the aforementioned groups represented by formulas (L2) to (L5), (S3) and (S4) are preferable.

Further, in the present invention, it is particularly desirable that X have a polar moiety, because it results in improved lithographic properties and resist pattern shape.

Specific examples of X having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

In the present invention, $R^{4"}$ preferably has a group represented by formula X-$Q^1$- as a substituent. In this case, $R^{4"}$ is preferably a group represented by formula X-$Q^1$-$Y^4$- [wherein $Q^1$ and X are the same as defined above, and $Y^4$ represent an alkylene group of 1 to 4 carbon atoms which may have a substituent, or a fluorinated alkylene group of 1 to 4 carbon atoms which may have a substituent].

In the group represented by formula X-$Q^1$-$Y^4$-, as the alkylene group for $Y^4$, the same alkylene group as those described above for $Q^1$ in which the number of carbon atoms is 1 to 4 can be used.

As the fluorinated alkylene group for $Y^4$, groups in which part of or all of the hydrogen atoms in the alkylene group are substituted with fluorine atoms can be used.

Specific examples of $Y^4$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—. —$CF(CF_3)CF(CF_3)$—, —$C(CF_3)_2CF_2$—, —$CF(CF_2CF_3)CF_2$—, —$CF(CF_2CF_2CF_3)$—, and —$C(CF_3)(CF_2CF_3)$—;  —CHF—,  —$CH_2CF_2$—, —$CH_2CH_2CF_2$—, —$CH_2CF_2CF_2$—, —$CH(CF_3)CH_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, and —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^4$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, and —CF(CF$_2$CF$_3$)CF$_2$—; —CH$_2$CF$_2$—, —CH$_2$CH$_2$CF$_2$—, and —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Among these, —CF$_2$—, —CF$_2$CF$_2$—, —CF$_2$CF$_2$CF$_2$—, and CH$_2$CF$_2$CF$_2$— are preferable, —CF$_2$—, —CF$_2$CF$_2$— and —CF$_2$CF$_2$CF$_2$— are more preferable, and —CF$_2$— is particularly desirable.

The alkylene group or fluorinated alkylene group for Y$^4$ may have a substituent. The alkylene group or fluorinated alkylene group "has a substituent" means that part or all of the hydrogen atoms or fluorine atoms in the alkylene group or fluorinated alkylene group have been substituted with atoms or groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl) tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Furthermore, onium salts in which the anion moiety of these onium salts is replaced by an anion moiety represented by any one of formulas (b1) to (b8) shown below can also be used.

[Chemical Formula 61.]

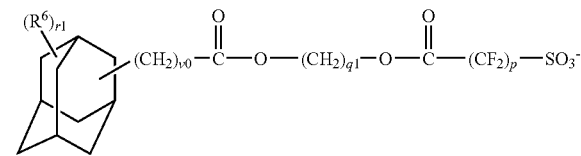
(b1)

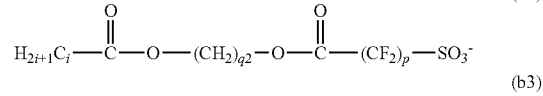
(b2)

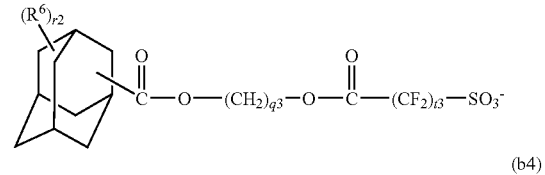
(b3)

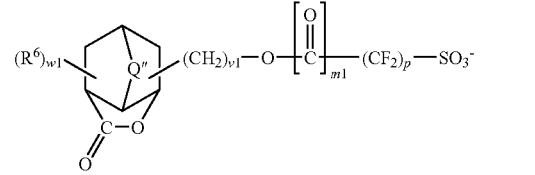
(b4)

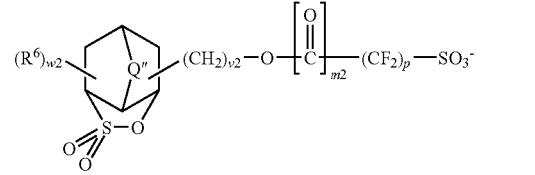
(b5)

-continued

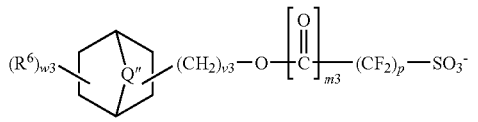
(b6)

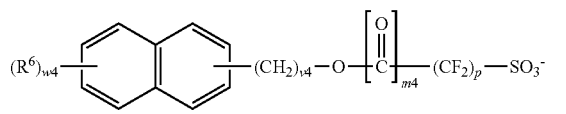
(b7)

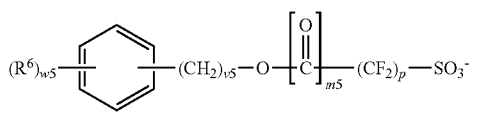
(b8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^6$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^6$, the same groups as those which the aforementioned aliphatic hydrocarbon group or aromatic hydrocarbon group for X may have as a substituent can be used.

When the subscripts (r1 and r2, and w1 to w5) of $R^6$ represent an integer of 2 or more, the plurality of $R^6$ within the compound may be the same or different from each other.

Further, onium salt-based acid generators in which the anion moiety in general formula (b-1) or (b-2) is replaced by an anion moiety represented by general formula (b-3) or (b-4) shown below (the cation moiety is the same as the cation moiety represented in formula (b-1) or (b-2)) may also be used.

[Chemical Formula 62.]

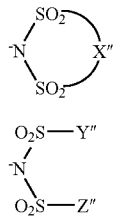

(b-3)

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved.

The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Further, an onium salt-based acid generator in which the anion moiety ($R^{4"}SO_3^-$) in general formula (b-1) or (b-2) has been replaced with $R^a$—$COO^-$ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4"}$ can be used.

Specific examples of the group represented by the formula "$R^a$—$COO^-$" include a trifluoroacetate ion, an acetate ion, and a 1-adamantanecarboxylix acid ion.

Furthermore, as an onium salt-based acid generator, a sulfonium salt having a cation moiety represented by general formula (b-5) or (b-6) shown below may be used.

[Chemical Formula 63.]

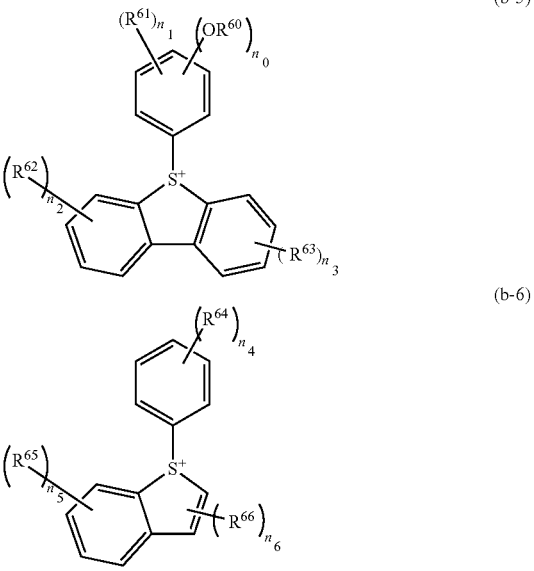

wherein $R^{60}$ represents a hydrogen atom or an alkyl group; $R^{61}$ represents an alkyl group, an acetyl group, a carboxyl group or a hydroxyalkyl group; each of $R^{62}$ to $R^{66}$ independently represents an alkyl group, an acetyl group, an alkoxy group, a carboxyl group or a hydroxyalkyl group; each of $n_0$ to $n_5$ independently represents an integer of 0 to 3, with the proviso that $n_0+n_1$ is 5 or less; and $n_6$ represents an integer of 0 to 2.

With respect to $R^{60}$ to $R^{66}$ in general formulas (b-5) and (b-6), the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

When the subscript $n_0$ of $OR^{60}$ represents an integer of 2 or more, the plurality of $OR^{60}$ may be the same or different from each other.

When the subscripts $n_1$ to $n_6$ of $R^{61}$ to $R^{66}$ represent an integer of 2 or more, the plurality of $R^{61}$ to $R^{66}$ may be the same or different from each other.

$n_0$ is preferably 0 or 1.

$n_1$ is preferably 0 to 2.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

Specific examples of preferable cation moieties represented by formula (b-5) or (b-6) are shown below.

[Chemical Formula 64.]

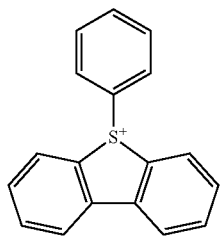

(b-5-1)

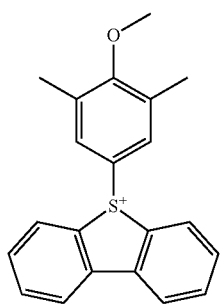

(b-5-2)

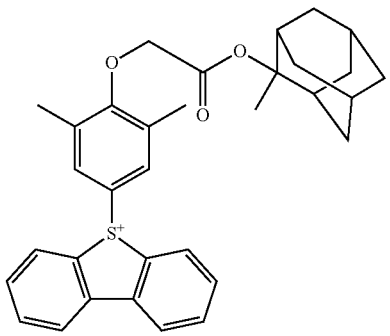

(b-5-3)

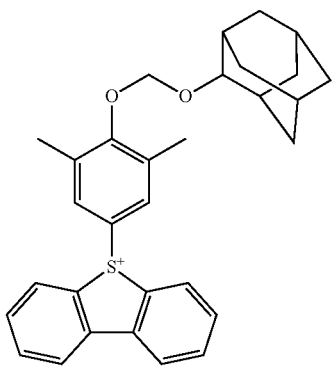

(b-5-4)

The anion moiety of the sulfonium salt having a cation moiety represented by general formula (b-5) or (b-6) as a cation moiety thereof is not particularly limited, and the same anion moieties for onium salt-based acid generators which have been proposed may be used.

Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above.

Among these, fluorinated alkylsulfonate ions are preferable, more preferably fluorinated alkylsulfonate ions of 1 to 4 carbon atoms, and linear perfluoroalkylsulfonate ions of 1 to 4 carbon atoms are particularly desirable. Specific examples include a trifluoromethylsulfonate ion, a heptafluoro-n-propylsulfonate ion and a nonafluoro-n-butylsulfonate ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be selected as appropriate.

[Chemical Formula 65.]

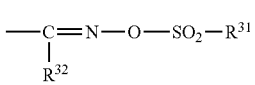

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferable examples of the oxime sulfonate-based acid generator include compounds represented by general formula (B-2) or (B-3) shown below.

[Chemical Formula 66.]

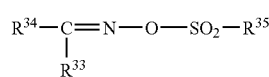

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 67.]

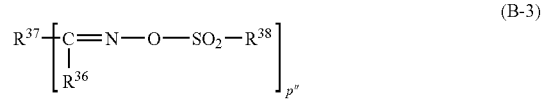

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same alkyl groups having no substituent or the halogenated alkyl groups mentioned above for $R^{35}$ can be used.

p" is preferably 2.

Specific examples of suitable oxime sulfonate-based acid generators include
α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide, α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thien-2-yl acetonitrile,
α-(4-dodecylbenzenesulfonyloxyimino)benzyl cyanide,
α-[(p-toluenesulfonyloxyimino)-4-methoxyphenyl]acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)-cyclohexyl acetonitrile,
α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile,
α-(cyclohexylsulfonyloxyimino)-cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile,
α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile,
α-(n-butylsulfonyloxyimino)-1-cyclohexenyl acetonitrile,
α-(methylsulfonyloxyimino)-phenyl acetonitrile,
α-(methylsulfonyloxyimino)-p-methoxyphenyl acetonitrile,
α-(trifluoromethylsulfonyloxyimino)-phenyl acetonitrile,
α-(trifluoromethylsulfonyloxyimino)-p-methoxyphenyl acetonitrile,
α-(ethylsulfonyloxyimino)-p-methoxyphenyl acetonitrile,
α-(propylsulfonyloxyimino)-p-methylphenyl acetonitrile, and
α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 85) may be preferably used.

Furthermore, as preferable examples, the following can be mentioned.

[Chemical Formula 68]

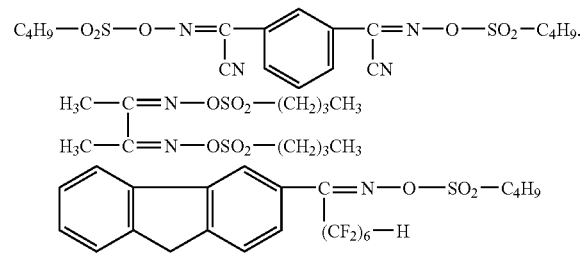

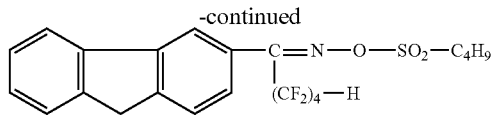

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazo methane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is particularly desirable to use an onium salt having a fluorinated alkylsulfonic acid ion as the anion moiety.

The amount of the component (B) within the positive resist composition according to the present invention is preferably from 0.5 to 60 parts by weight, more preferably from 1 to 40 parts by weight, and most preferably from 2 to 30 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (S)>

In the positive resist composition of the present invention, the component (S) includes an alcohol-based organic solvent having a boiling point of at least 150° C. (hereafter, such an alcohol-based organic solvent is referred to as "component (S1)").

In the present descriptions and the claims, the term "alcohol-based organic solvent" refers to a compound in which at least one hydrogen atom within an aliphatic hydrocarbon has been substituted with an hydroxyl group, and is a liquid at normal temperature and normal pressure. The structure of the main chain constituting the aforementioned aliphatic hydrocarbon may be a chain-like structure or a cyclic structure, or may include a cyclic structure within the chain-like structure, or may include an ether bond within the chain-like structure.

Here, the term "boiling point" refers to the normal boiling point measured under normal pressure.

[Component (S1)]

The component (S1) is an alcohol-based organic solvent having a boiling point of at least 150° C.

The boiling point of the component (S1) is at least 150° C., and is preferably at least 155° C., and most preferably within a range from 155 to 250° C.

When the boiling point is at least 150° C., the component (A) exhibits excellent solubility in the organic solvent (S) containing the component (S1). Further, by making the lower limit and upper limit of the boiling point at least 150° C. and no more than 250° C., respectively, properties of the positive resist composition in terms of coatability (wettability) to a substrate become excellent. Furthermore, because the component (A) exhibits excellent solubility in the component (S1), the number of options (that is, the polymeric compounds which can be used as the component (A)) increases, which contributes to improvements in the lithographic properties. These advantages can also be achieved when the positive resist composition is used in a double patterning process.

As the component (S1), for example, a monohydric alcohol and a dihydric alcohol can be mentioned, and a monohydric alcohol is preferable, and a primary or secondary monohydric alcohol is more preferable. Further, the component (S1) preferably has a ring structure composed of at least 5 carbon atoms (more preferably at least 7 carbon atoms) or a chain-like structure composed of at least 5 carbon atoms (more preferably at least 7 carbon atoms). The ring structure or chain-like structure described above may contain an ether bond within the structure.

With respect to the chain-like structure composed of at least 5 carbon atoms (more preferably at least 7 carbon atoms), it is even more preferable that the longest main chain containing an —OH group have at least 5 carbon atoms. The main chain may contain an ether bond within the structure.

It is particularly desirable that the component (S1) be a monohydric alcohol having a chain-like structure composed of at least 5 carbon atoms (more preferably at least 7 carbon atoms).

Here, the term "monohydric alcohol" refers to compounds in which the number of hydroxyl groups incorporated within the alcohol molecule is 1, and does not include dihydric alcohols, trihydric alcohols, or derivatives thereof.

Specific examples of the component (S1) having a chain-like structure include propylene glycol (PG; boiling point: 188° C.); and monohydric alcohols such as 1-butoxy-2-propanol (BP; boiling point: 170° C.), n-hexanol (boiling point: 157.1° C.), 2-heptanol (boiling point: 160.4° C.), 3-heptanol (boiling point: 156.2° C.), 1-heptanol (boiling point: 176° C.), 5-methyl-1-hexanol (boiling point: 167° C.), 6-methyl-2-heptanol (boiling point: 171° C.), 1-octanol (boiling point: 196° C.), 2-octanol (boiling point: 179° C.), 3-octanol (boiling point: 175° C.), 4-octanol (boiling point: 175° C.), 2-ethyl-1-hexanol (boiling point: 185° C.), and 2-(2-butoxyethoxy)ethanol (boiling point: 231° C.).

Further, specific examples of the component (S1) having a ring structure include monohydric alcohols such as cyclopentane methanol (boiling point: 162° C.), 1-cyclopentylethanol (boiling point: 167° C.), cyclohexanol (boiling point: 160° C.), cyclohexane methanol (CM, boiling point: 183° C.), cyclohexane ethanol (boiling point: 205° C.), 1,2,3,6-tetrahydrobenzyl alcohol (boiling point: 191° C.), exo-norborneol (boiling point: 176° C.), 2-methylcyclohexanol (boiling point: 165° C.), cycloheptanol (boiling point: 185° C.), 3,5-dimethylcyclohexanol (boiling point: 185° C.), and benzyl alcohol (boiling point: 204° C.).

Of these, monohydric alcohols having a chain-like structure are preferable, and 1-butoxy-2-propanol is particularly desirable.

As the component (S1), one type may be used alone, or two or more types may be used in combination.

The amount of the component (S1) within the component (S) is preferably at least 50% by weight, more preferably at least 80% by weight, and most preferably 100% weight. When the amount of the component (S1) is at least as large as the lower limit of the above-mentioned range, the solubility of the component (A) in the component (S) becomes even more satisfactory.

In addition to the component (S1), the component (S) may include an organic solvent other than the component (S1), as long as the effects of the present invention are not impaired.

[Component (S2)]

As an organic solvent other than the component (S1), for example, an ether-based organic solvent having no hydroxyl group (hereafter, referred to as "component (S2)") may be used.

Here, the expression "ether-based organic solvent having no hydroxyl group" refers to a compound that contains an ether bond (C—O—C) within the molecule but has no hydroxyl group, and is a liquid at normal temperature and normal pressure.

Of the various possibilities, it is more preferable that the component (S2) be a compound having neither a hydroxyl group nor a carbonyl group.

Preferable examples of the component (S2) include compounds represented by general formula (s1'-1) shown below.

$$R^{70}\text{—O—}R^{71} \quad (s1'\text{-}1)$$

In general formula (s1'-1), $R^{70}$ and $R^{71}$ each independently represents a hydrocarbon group. Alternatively, $R^{70}$ and $R^{71}$ may be bonded to each other to form a ring. —O— represents an ether bond.

In general formula (s1'-1), as the hydrocarbon group for $R^{70}$ and $R^{71}$, for example, an alkyl group, an aryl group or the like can be mentioned, and an alkyl group is preferable. It is more preferable that both of $R^{70}$ and $R^{71}$ represent an alkyl group, and it is particularly desirable that $R^{70}$ and $R^{71}$ represent the same alkyl group.

The alkyl group for $R^{70}$ and $R^{71}$ is not particularly limited and includes, for example, a linear, branched or cyclic alkyl group having 1 to 20 carbon atoms. Part or all of the hydrogen atoms of the alkyl group may or may not be substituted with halogen atoms or the like.

The alkyl group preferably has 1 to 15 carbon atoms, and more preferably 1 to 10 carbon atoms, because coatability of the resist composition becomes satisfactory. Specific examples include an ethyl group, a propyl group, an isopropyl group, an n-butyl group, an isobutyl group, an n-pentyl group, an isopentyl group, a cyclopentyl group and a hexyl group, and an n-butyl group and an isopentyl group are particularly desirable.

The halogen atom, with which hydrogen atoms of the alkyl group may be substituted, is preferably a fluorine atom.

The aryl group for $R^{70}$ and $R^{71}$ is not particularly limited. For example, an aryl group having 6 to 12 carbon atoms may be used in which part or all of the hydrogen atoms of the aryl group may or may not be substituted with alkyl groups, alkoxy groups, or halogen atoms.

The aryl group is preferably an aryl group having 6 to 10 carbon atoms because it can be synthesized at a low cost. Specific examples thereof include a phenyl group, a benzyl group and a naphthyl group.

The alkyl group, with which hydrogen atoms of the aryl group may be substituted, is preferably an alkyl group having 1 to 5 carbon atoms, and more preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and more preferably a methoxy group or an ethoxy group.

The halogen atom, with which hydrogen atoms of the aryl group may be substituted, is preferably a fluorine atom.

Alternatively, in general formula (s1'-1), $R^{70}$ and $R^{71}$ may be bonded to each other to form a ring.

In this case, $R^{70}$ and $R^{71}$ each independently represents a linear or branched alkylene group (preferably an alkylene group of 1 to 10 carbon atoms) and the terminal of $R^{70}$ and the terminal of $R^{71}$ are bonded to each other to form a ring. Further, a carbon atom of the alkylene group may be substituted with an oxygen atom.

Specific examples of such ether-based organic solvents include 1,8-cineole, tetrahydrofuran and dioxane.

The boiling point (at normal pressure) of the component (S2) is preferably within a range from 30 to 300° C., more preferably from 100 to 200° C., and still more preferably from 140 to 180° C. When the boiling point of the component (S2) is at least as large as the lower limit of the above-mentioned temperature range, the component (S) hardly evaporates during the spin coating process when applying the positive resist composition of the present invention, thereby suppressing coating irregularities and improving the resulting coating properties. On the other hand, when the boiling point of the component (S2) is no more than the upper limit of the above-mentioned temperature range, the component (S) is satisfactorily removed from the resist film by a prebake (PAB) treatment, thereby improving formability of the resist film. Further, when the boiling point of the component (S2) is within the above-mentioned temperature range, the effect of reducing the thickness loss of the resist patterns and the stability of the composition upon storage are further improved. The above-mentioned temperature range for the boiling point of the component (S2) is also preferable from the viewpoints of the heating temperature required in the PAB step and/or post exposure baking (PEB) step.

Specific examples of the component (S2) include 1,8-cineole (boiling point: 176° C.), dibutyl ether (boiling point: 142° C.), diisopentyl ether (boiling point: 171° C.), dioxane (boiling point: 101° C.), anisole (boiling point: 155° C.), ethylbenzyl ether (boiling point: 189° C.), diphenyl ether (boiling point: 259° C.), dibenzyl ether (boiling point: 297° C.), phenetole (boiling point: 170° C.), butylphenyl ether, tetrahydrofuran (boiling point: 66° C.), ethylpropyl ether (boiling point: 63° C.), diisopropyl ether (boiling point: 69° C.), dihexyl ether (boiling point: 226° C.), dipropyl ether (boiling point: 91° C.), and cresylmethyl ether.

These components (S2) can be used either alone, or in combinations of two or more different solvents.

In the present invention, the component (S2) is preferably a cyclic or chain-like, ether-based organic solvent because the effect of reducing the thickness loss of the resist patterns becomes satisfactory, and it is particularly desirable that the component (S2) be at least one member selected from the group consisting of 1,8-cineole, dibutyl ether and diisopentyl ether.

[Component (S3)]

In addition to the component (S1), or in addition to the components (S1) and (S2), the component (S) may also include an organic solvent other than the components (S1) and (S2) (hereafter, referred to as "component (S3)"), as long as the effects of the present invention are not impaired.

The component (S3) may be any organic solvent which can dissolve the resist materials to give a uniform solution, and any one or more kinds of organic solvents can be appropriately selected from those which have been conventionally known as solvents for a chemically amplified resist.

By further including the component (S3), the solubility of the components (A), (B) and the like, and other properties can be adjusted.

Examples of the component (S3) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA; boiling point: 146° C.) and propylene glycol monomethyl ether (PGME; boiling point: 120° C.) are preferable); esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as ethylbenzene, diethylbenzene, pentylbenzene, isopropylbenzene, toluene, xylene, cymene and mesitylene; dimethyl sulfoxide (DMSO); and alcohol-based organic solvents having a boiling point of less than 150° C. (hereafter, referred to as "component (S3a)"), such as n-pentyl alcohol (boiling point: 138.0° C.), s-pentyl alcohol (boiling point: 119.3° C.), t-pentyl alcohol (boiling point: 101.8° C.), isopentyl alcohol (boiling point: 130.8° C.), isobutanol (also called isobutyl alcohol or 2-methyl-1-propanol) (boiling point: 108° C.), isopropyl alcohol (boiling point: 82.3° C.), 2-ethylbutanol (boiling point: 147° C.), neopentyl alcohol (boiling point: 114° C.), n-butanol (boiling point: 117.7° C.), s-butanol (boiling point: 99.5° C.), t-butanol (boiling point: 82.5° C.), 1-propanol (boiling point: 97.2° C.), n-hexanol (boiling point: 157.1° C.), 2-methyl-1-butanol (boiling point: 128.0° C.), 2-methyl-2-butanol (boiling point: 112.0° C.), and 4-methyl-2-pentanol (boiling point: 132° C.).

These components (S3) can be used either alone, or in combinations of two or more different solvents.

The total amount of the component (S) used is not particularly limited, and is appropriately adjusted to a concentration which enables coating of the positive resist composition of the present invention onto a substrate, depending on the thickness of the coating film. In general, the component (S) is preferably used in an amount such that the solid content of the resist composition becomes within the range from 1 to 20% by weight, and more preferably from 2 to 15% by weight.

In the positive resist composition of the present invention, as the component (S), a mixed solvent of the components (S1) and (S3a) may also be used favorably. When such a mixed solvent is used, the solubility of resist materials, especially that of the component (A) (and preferably the component (A1)) is significantly enhanced, as compared to the case where the component (S3a) is used alone.

The mixing ratio (weight ratio) of the component (S1) to the component (S3a) (i.e., (S1)/(S3a)) is preferably within a range from 1/99 to 99/1, more preferably from 5/95 to 95/5, and is most preferably from 10/90 to 90/10. When the ratio of the component (S1) to the component (S3a) is within the above-mentioned range, the solubility of the resist materials and other properties can be improved even further.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<Optional Components>

[Component (D)]

In order to improve factors such as the resist pattern shape and the post exposure stability of the latent image formed by the pattern-wise exposure of the resist layer, it is preferable that the positive resist composition of the present invention further include a nitrogen-containing organic compound (D) (hereafter referred to as "component (D)") as an optional component.

A multitude of these components (D) have already been proposed, and any of these known compounds may be used, although a cyclic amine, an aliphatic amine, and particularly a secondary aliphatic amine or tertiary aliphatic amine is preferable. Here, an aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (namely, alkylamines or alkyl alcohol amines). Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferable. Of these alkyl alcohol amines, triethanolamine and triisopropanolamine are particularly desirable. Among these trialkylamines, tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

[Component (E)]

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as "component (F)") selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

The positive resist composition of the present invention may further include a fluorine-containing compound (F) (hereafter, referred to as "component (F)"). By including the component (F), the hydrophobicity of the surface of the resist film improves, thereby yielding a resist composition that is suitable also for immersion exposure.

The component (F) is not particularly limited and may be either a polymeric compound (polymer or copolymer) including a recurring unit, or a low molecular weight compound (non-polymer).

Examples of the polymeric compounds (polymers or copolymers) used as the component (F) include a polymeric compound having a recurring unit that contains a fluorine atom. More specifically, a polymeric compound including one or more recurring units that contain a fluorine atom; and a polymeric compound including recurring units consisting of a structural unit containing a fluorine atom and a structural unit with no fluorine atom, can be mentioned.

Further, examples of the low molecular weight compounds (non-polymers) used as the component (F) include a monomer for deriving structural units containing a fluorine atom which constitute the aforementioned polymeric compounds (polymers or copolymers).

Among these, the component (F) is preferably a polymeric compound (polymer or copolymer).

Structural Unit Containing a Fluorine Atom (Structural Unit (f1))

The structural unit containing a fluorine atom (hereafter, referred to as "structural unit (f1)") is not particularly limited as long as it is a structural unit containing a fluorine atom. For example, in the structural unit, a fluorine atom may be included within the side chain or may be directly bonded to the main chain, or a fluorine atom may be included in a substituent which is directly bonded to the main chain.

Of these various possibilities, as the structural unit (f1), a structural unit containing a fluorine atom within the side chain thereof is preferable. Specific examples include a structural unit having a group represented by general formula (f1-1-0) shown below; a structural unit having a fluorine atom and a group that contains an acid dissociable, dissolution inhibiting group, and a structural unit having a non-acid-dissociable fluorinated alkyl group of 1 to 20 carbon atoms, and a structural unit having a group represented by general formula (f1-1-0) is more preferable.

[Chemical Formula 69.]

(f1-1-0)

In formula (f1-1-0), $R^8$ represents an organic group having a fluorine atom, with the provision that the carbon atom within the —C(=O)— moiety is not directly bonded to the main chain.

(Structural Unit having a Group Represented by General Formula (f1-1-0))

In the formula (f1-1-0) above, $R^8$ represents an organic group having a fluorine atom.

An "organic group" is a group containing at least one carbon atom.

In the organic group having a fluorine atom for $R^8$, the structure of $R^8$ may be linear, branched or cyclic, and is preferably linear or branched.

In $R^8$, the organic group preferably has 1 to 20 carbon atoms, more preferably 1 to 15 carbon atoms, still more preferably 1 to 10 carbon atoms, and most preferably 1 to 5 carbon atoms.

In $R^8$, the fluorination ratio of the organic group is preferably 25% or more, more preferably 50% or more, and most preferably 60% or more, as the hydrophobicity of the resist film is enhanced.

The term "fluorination ratio" refers to the percentage (%) of the number of fluorine atoms relative to the total number of hydrogen atoms and fluorine atoms contained within the organic group.

More specifically, preferable examples of $R^8$ include a fluorinated hydrocarbon group which may have a substituent.

In the fluorinated hydrocarbon group, the hydrocarbon group (a hydrocarbon group which is not fluorinated) may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^8$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups (below-described groups which do not have a substituent) have been substituted with a fluorine atom.

The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be any of linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8 carbon atoms. Specific examples include a methyl group, an ethyl group, an n-propyl group, an n-butyl group, an n-pentyl group, an n-hexyl group, an n-heptyl group, an n-octyl group, an n-nonyl group and an n-decanyl group.

The unsubstituted branched alkyl group preferably has 3 to 10 carbon atoms, and more preferably 3 to 8 carbon atoms. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecanyl group and a tetracyclododecanyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include an alkyl group of 1 to 5 carbon atoms.

As the fluorinated alkyl group for $R^8$, a linear or branched fluorinated alkyl group is preferable. In particular, a group represented by general formula (VII-1) or (VII-2) shown below is desirable, and a group represented by general formula (VII-1) is most preferable.

[Chemical Formula 70.]

(VII-1)

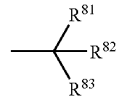
(VII-2)

In general formula (VII-1), $R^{41'}$ represents an unsubstituted alkylene group of 1 to 9 carbon atoms, and $R^{42'}$ represents a fluorinated alkyl group of 1 to 9 carbon atoms, with the provision that the total number of carbon atoms of $R^{41'}$ and $R^{42'}$ is no more than 10. In general formula (VII-2), each of $R^{81}$ to $R^{83}$ independently represents a linear alkyl group of 1 to 5 carbon atoms, with the provision that at least one of $R^{81}$ to $R^{83}$ represents an alkyl group having a fluorine atom.

In general formula (VII-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group and a pentafluoroethyl group are preferable.

In general formula (VII-2), as the alkyl group for $R^{81}$ to $R^{83}$, an ethyl group or a methyl group is preferable, and a methyl group is particularly desirable. At least one of the alkyl groups for $R^{81}$ to $R^{83}$ is a fluorinated alkyl group and all of the alkyl groups for $R^{81}$ to $R^{83}$ may be fluorinated alkyl groups.

In general formula (f1-1-0), the carbon atom within the —C(=O)— moiety is not directly bonded to the main chain. As a result, the group "—O—$R^8$" may be dissociated satisfactorily by the action of an alkali developing solution which is weakly basic.

In other words, the group "—O—$R^8$" is dissociated from a group represented by general formula (f1-1-0) due to hydrolysis caused by the action of an alkali developing solution. Therefore, in the group represented by general formula (f1-1-0), a hydrophilic group [—C(=O)—OH] is formed when the group "—O—$R^8$" dissociates. Accordingly, the hydrophilicity of the component (F) is enhanced, and hence, the compatibility of the component (F) with the alkali developing solution is improved. As a result, the hydrophilicity of the resist film surface is enhanced during developing.

In the positive resist composition of the present invention, as the structural unit (f1), a structural unit (f1-1) represented by general formula (f1-1-1) shown below can be mentioned as a preferable example, because favorable solubility of the composition in organic solvents can be achieved, and the hydrophobicity of the surface of the resist film can be enhanced.

[Chemical Formula 71.]

(f1-1-1)

In formula (f1-1-1), R represents a hydrogen atom, a lower alkyl group of 1 to 5 carbon atoms or a halogenated lower alkyl group of 1 to 5 carbon atoms; $Q^0$ represents a single bond or a divalent linking group; and $R^8$ represents an organic group having a fluorine atom.

Structural Unit (f1-1)

The structural unit (f1-1) is a structural unit represented by the aforementioned general formula (f1-1-1).

In general formula (f1-1-1), R represents a hydrogen atom, a lower alkyl group of 1 to 5 carbon atoms or a halogenated lower alkyl group of 1 to 5 carbon atoms.

The lower alkyl group and halogenated lower alkyl group for R are the same as the lower alkyl group and halogenated lower alkyl group which may be bonded to the α-position of the aforementioned acrylate ester.

In general formula (f1-1-1), $Q^0$ represents a single bond or a divalent linking group.

Preferable examples of the divalent linking group for $Q^0$ include a hydrocarbon group which may have a substituent, and a group containing a hetero atom.

(Hydrocarbon Group which May have a Substituent)

With respect to the divalent linking group for $Q^0$, the hydrocarbon group may "have a substituent" means that part or all of the hydrogen atoms of the hydrocarbon group may be substituted with groups or atoms other than hydrogen atoms.

The hydrocarbon group for $Q^0$ may be either an aliphatic hydrocarbon group, or an aromatic hydrocarbon group.

Here, an aliphatic hydrocarbon group refers to a hydrocarbon group that has no aromaticity. The aliphatic hydrocarbon group may be either saturated or unsaturated, but in general, the aliphatic hydrocarbon group is preferably saturated.

Specific examples of aliphatic cyclic groups include a linear or branched aliphatic hydrocarbon group and an aliphatic hydrocarbon group containing a ring in the structure thereof.

The linear or branched aliphatic hydrocarbon group for $Q^0$ preferably has 1 to 10 carbon atoms, more preferably 1 to 8 carbon atoms, still more preferably 1 to 5 carbon atoms, and most preferably 1 to 3 carbon atoms.

As the linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$; alkylethylene groups such as —CH($CH_3$)$CH_2$—, —CH($CH_3$)CH($CH_3$)—, —C($CH_3$)$_2CH_2$—, and —CH($CH_2CH_3$)$CH_2$—; alkyltrimethylene groups such as —CH($CH_3$)$CH_2CH_2$— and —$CH_2$CH($CH_3$)$CH_2$—; and alkyltetramethylene groups such as —CH($CH_3$)$CH_2CH_2CH_2$— and —$CH_2$CH($CH_3$)$CH_2CH_2$—. As the alkyl group within the alkylalkylene group, a linear alkyl group of 1 to 5 carbon atoms is preferable.

The linear or branched (chain-like) aliphatic hydrocarbon group may or may not have a substituent. Examples of substituents include a fluorine atom, a fluorinated lower alkyl group of 1 to 5 carbon atoms which is substituted by a fluorine atom, and an oxygen atom (=O).

Examples of aliphatic hydrocarbon groups containing a ring represented by $Q^0$ include a cyclic aliphatic hydrocarbon group (an aliphatic hydrocarbon ring having 2 hydrogen atoms removed therefrom), a group in which the cyclic aliphatic hydrocarbon group is bonded to the terminal of the aforementioned chain-like aliphatic hydrocarbon group or interposed within the chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two or more hydrogen atoms have been removed from a monocycloalkane of 3 to 6 carbon atoms is preferable. Examples of the monocycloalkane include cyclopentane and cyclohexane.

As the polycyclic group, a group in which two or more hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of substituents include a lower alkyl group of 1 to 5 carbon atoms, a fluorine atom, a fluorinated lower alkyl group of 1 to 5 carbon atoms, and an oxygen atom (=O).

Examples of aromatic hydrocarbon groups for $Q^0$ include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

Among these examples, the aforementioned divalent aromatic hydrocarbon group is preferable, and an aromatic hydrocarbon group in which one hydrogen atom has been removed from a phenyl group, or an aromatic hydrocarbon group in which one hydrogen atom has been removed from a naphthyl group is particularly desirable.

The alkyl chain within the arylalkyl group preferably has 1 to 4 carbon atom, more preferably 1 or 2 carbon atoms, and most preferably 1 carbon atom.

The aromatic hydrocarbon group may or may not have a substituent. Examples of substituents include a lower alkyl group of 1 to 5 carbon atoms, a fluorine atom, a fluorinated alkyl group of 1 to 5 carbon atoms, and an oxygen atom (=O).

Among the above-mentioned examples, as the hydrocarbon group which may have a substituent, a linear, branched or cyclic aliphatic hydrocarbon group or a divalent aromatic hydrocarbon group is preferable, and a methylene group, and ethylene group, —CH(CH$_3$)—, a group in which one hydrogen atom has been removed from a tetracyclododecanyl group, or an aromatic hydrocarbon group in which one hydrogen atom has been removed from a phenyl group is particularly desirable.

(Group Containing a Hetero Atom)

A hetero atom is an atom other than a carbon atom and a hydrogen atom, and examples thereof include an oxygen atom, a nitrogen atom, a sulfur atom and a halogen atom.

Examples of groups containing a hetero atom include —O—, —C(=O)—, —C(=O)—O—, a carbonate bond (—O—C(=O)—O—), —NH—, —NR$^{05}$— (wherein R$^{05}$ represents an alkyl group), —NH—C(=O)—, =N—, and a combination of any of these "groups" with a divalent hydrocarbon group.

As the divalent hydrocarbon group, the same groups as those described above for the hydrocarbon group which may have a substituent can be used, and a linear or branched aliphatic hydrocarbon group is preferable.

Among the above-mentioned examples, as the group containing a hetero atom, a combination of any of the aforementioned "groups" with a divalent hydrocarbon group is preferable. More specifically, it is particularly desirable to use a combination of any of the aforementioned "groups" with the aforementioned aliphatic hydrocarbon group, or a combination of the aforementioned aliphatic hydrocarbon group, any of the aforementioned "groups" and the aforementioned aliphatic hydrocarbon group.

In general formula (f1-1-1), R$^8$ represents an organic group having a fluorine atom, and is the same defined for R$^8$ in general formula (f1-1-0).

Preferable examples of the structural unit (f1-1) include structural units represented by general formula (f1-1-10) or (f1-1-20) shown below.

[Chemical Formula 72.]

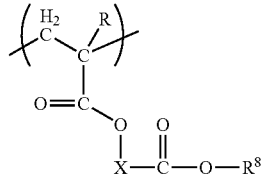
(f1-1-10)

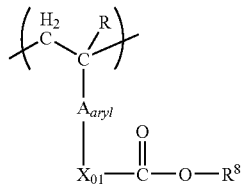
(f1-1-20)

In the formulas, each R independently represents a hydrogen atom, a lower alkyl group of 1 to 5 carbon atoms or a halogenated lower alkyl group of 1 to 5 carbon atoms; X represents a divalent organic group; A$_{aryl}$ represents a divalent aromatic cyclic group which may have a substituent; X$_{01}$ represents a single bond or a divalent linking group; and each R$^8$ independently represents an organic group having a fluorine atom.

In formulas (f1-1-10) and (f1-1-20), R$^8$ is the same as defined above.

In formulas (f1-1-10) and (f1-1-20), as R$^8$, a fluorinated hydrocarbon group is preferable, a fluorinated alkyl group is more preferable, a fluorinated alkyl group of 1 to 5 carbon atoms is still more preferable, and —CH$_2$—CF$_3$, —CH$_2$—CF$_2$—CF$_3$, —CH(CF$_3$)$_2$, —CH$_2$—CF$_2$—CF$_2$—CF$_3$, —CH$_2$—CH$_2$—CF$_2$—CF$_2$—CF$_3$ and —CH$_2$—CH$_2$—CF$_2$—CF$_2$—CF$_2$—CF$_3$ are most preferable.

As the lower alkyl group for R, a linear or branched lower alkyl group is preferable, and specific examples of lower alkyl groups include a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of halogen atoms include a fluorine atom, a chlorine atom, a bromine atom and an iodine atom, and a fluorine atom is particularly desirable.

In the present invention, as R, a hydrogen atom, a lower alkyl group or a fluorinated lower alkyl group is preferable, and a hydrogen atom or a methyl group is more preferable in terms of industrial availability.

In general formula (f1-1-10), X represents a divalent organic group.

Preferable examples of X include a hydrocarbon group which may have a substituent, and a group containing a hetero atom. These groups are the same as the hydrocarbon group which may have a substituent and the group containing a hetero atom, respectively, which are described above in relation to the divalent linking group for Q$^0$.

In general formula (f1-1-20), A$_{aryl}$ represents a divalent aromatic cyclic group which may have a substituent. A specific example of A$_{aryl}$ includes an aromatic hydrocarbon ring (which may have a substituent) having 2 or more hydrogen atoms removed therefrom.

The ring skeleton of the aromatic cyclic group for $A_{aryl}$ preferably has 6 to 15 carbon atoms. Examples of ring skeletons include a benzene ring, a naphthalene ring, a phenanthrene ring and an anthracene ring. Among these, a benzene ring or a naphthalene ring is particularly desirable.

Examples of substituents which an aromatic cyclic group for $A_{aryl}$ may have include a halogen atom, an alkyl group, an alkoxy group, a halogenated lower alkyl group and an oxygen atom (=O). Examples of halogen atoms include a fluorine atom, a chlorine atom, an iodine atom and a bromine atom. As the substituent which an aromatic cyclic group for $A_{aryl}$ may have, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ is an aromatic cyclic group having a substituent, the number of the substituent may be either 1, 2 or more, preferably 1 or 2, and more preferably 1.

In general formula (f1-1-20), $X_{01}$ represents a single bond or a divalent linking group.

Examples of divalent linking groups include an alkylene group of 1 to 10 carbon atoms, —O—, —C(=O)—, —C(=O)—O—, a carbonate bond (—O—C(=O)—O—), —NH—C(=O)—, and a combination of these groups, and a combination of —O— with an alkylene group of 1 to 10 carbon atoms or a combination of —C(=O)—O— with an alkylene group of 1 to 10 carbon atoms is more preferable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by the aforementioned general formula (f1-1-10), structural units represented by general formulas (f1-1-11) to (f1-1-16) shown below are preferable.

Further, among structural units represented by the aforementioned general formula (f1-1-20), structural units represented by general formulas (f1-1-21) to (f1-1-26) shown below are preferable.

[Chemical Formula 73.]

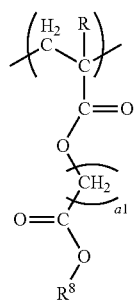

(f1-1-11)

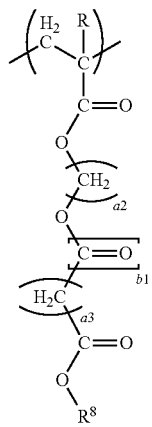

(f1-1-12)

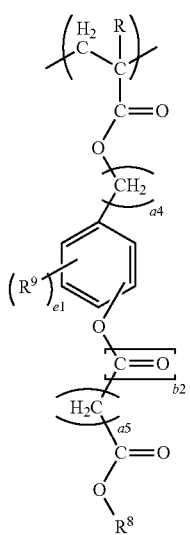

(f1-1-13)

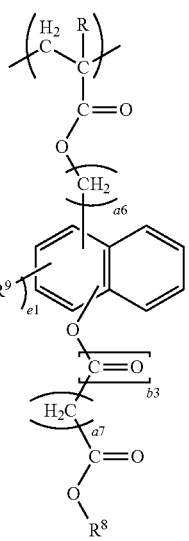

(f1-1-14)

[Chemical Formula 74.]
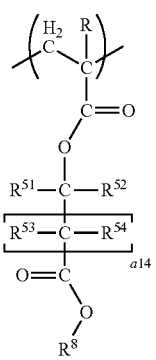
(f1-1-15)
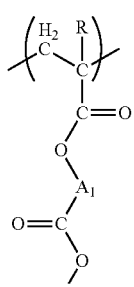
(f1-1-16)
[Chemical Formula 75.]
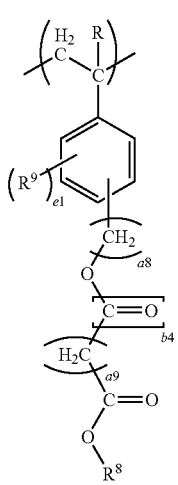
(f1-1-21)
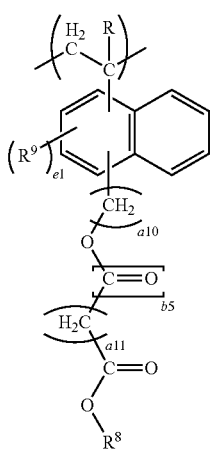
(f1-1-22)
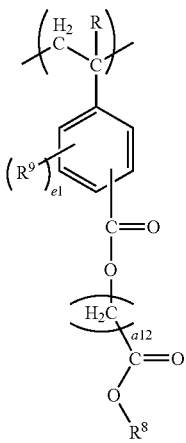
(f1-1-23)
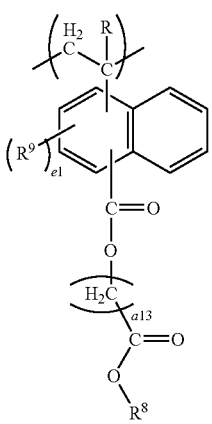
(f1-1-24)
[Chemical Formula 76.]
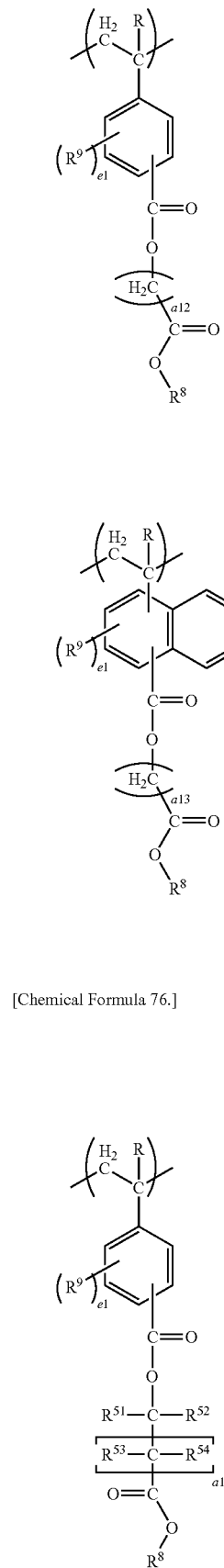
(f1-1-25)

(f1-1-26)

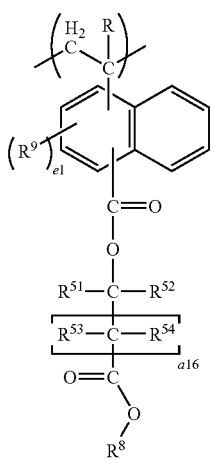

In the above general formulas (f1-1-11) to (f1-1-16) and (f1-1-21) to (f1-1-26), R and $R^8$ are the same as defined above; each of $R^{51}$ and $R^{52}$ independently represents an alkyl group of 1 to 10 carbon atoms; each of $R^{53}$ and $R^{54}$ independently represents a hydrogen atom or an alkyl group of 1 to 10 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 0 to 5; each of b1 to b5 independently represents 0 or 1; each $R^9$ represents a substituent; e1 represents an integer of 0 to 2; and $A_1$ represents a cyclic alkylene group of 4 to 20 carbon atoms.

In formulas (f1-1-11) to (f1-1-16) and (f1-1-21) to (f1-1-26), as R, a hydrogen atom or a methyl group is preferable.

In formula (f1-1-11), a1 is preferably an integer of 1 to 3, and more preferably 1 or 2.

In formula (f1-1-12), it is preferable that each of a2 and a3 independently represent an integer of 1 to 3, and more preferably 1 or 2.

b1 is preferably 0.

In formula (f1-1-13), a4 is preferably an integer of 0 to 3, more preferably an integer of 0 to 2, and most preferably 0 or 1.

a5 is preferably an integer of 1 to 3, and more preferably 1 or 2.

Examples of the substituent for $R^9$ include a halogen atom, a lower alkyl group, an alkoxy group of 1 to 5 carbon atoms, a halogenated lower alkyl group, or an oxygen atom (=O). As the lower alkyl group, the same lower alkyl groups as those described above for R can be mentioned. Examples of halogen atoms include a fluorine atom, a chlorine atom, an iodine atom and a bromine atom. As the halogenated lower alkyl group, the same halogenated lower alkyl groups as those described above for R can be mentioned.

e1 is preferably 0 or 1, and most preferably 0 from an industrial viewpoint.

b2 is preferably 0.

In formula (f1-1-14), a6 is preferably an integer of 0 to 3, more preferably an integer of 0 to 2, and most preferably 0 or 1.

a7 is preferably an integer of 1 to 3, and more preferably 1 or 2.

b3 is preferably 0.

$R^9$ and e1 are the same as defined above.

In formula (f1-1-15), a14 is preferably an integer of 0 to 3, more preferably an integer of 0 to 2, and most preferably 0 or 1.

It is preferable that each of $R^{51}$ and $R^{52}$ independently represents a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-pentyl group, a cyclopentyl group, a cyclohexyl group, a cyclooctyl group, a norbornyl group, an isobornyl group, a tricyclodecanyl group, an adamantyl group and a tetracyclododecanyl group. Of these, an alkyl group of 1 to 6 carbon atoms is preferable, more preferably an alkyl group of 1 to 4 carbon atoms, and most preferably a methyl group or an ethyl group.

It is preferable that each of $R^{53}$ and $R^{54}$ independently represents a hydrogen atom, or a linear, branched or cyclic alkyl group of 1 to 10 carbon atoms. For $R^{53}$ and $R^{54}$, the linear, branched or cyclic alkyl group of 1 to 10 carbon atoms is as defined above for $R^{51}$ and $R^{52}$.

In formula (f1-1-16), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples of cyclic alkylene groups include those described above as the "cyclic aliphatic hydrocarbon group" for the aforementioned hydrocarbon group which may have a substituent, and the cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

In formula (f1-1-21), a8 is preferably an integer of 0 to 3, more preferably an integer of 0 to 2, and most preferably 0 or 1.

a9 is preferably an integer of 1 to 3, and more preferably 1 or 2.

b4 is preferably 0.

$R^9$ and e1 are the same as defined above.

In formula (f1-1-22), a10 is preferably an integer of 0 to 3, more preferably an integer of 0 to 2, and most preferably 0 or 1.

a11 is preferably an integer of 1 to 3, and more preferably 1 or 2.

b5 is preferably 0.

$R^9$ and e1 are the same as defined above.

In formula (f1-1-23), a12 is preferably an integer of 1 to 3, and more preferably 1 or2.

$R^9$ and e1 are as defined above.

In formula (f1-1-24), a13 is preferably an integer of 1 to 3, and more preferably 1 or2.

$R^9$ and e1 are the same as defined above.

In formulas (f1-1-25) and (f1-1-26), each of a15 and a16 is preferably an integer of 0 to 3, more preferably an integer of 0 to 2, and most preferably 0 or 1.

Each of $R^{51}$, $R^{52}$, $R^{53}$ and $R^{54}$ are as defined above.

$R^9$ and e1 are the same as defined above.

Specific examples of structural units represented by the above general formulas (f1-1-11) to (f1-1-16) and (f1-1-21) to (f1-1-26) are shown below.
[Chemical Formula 77]
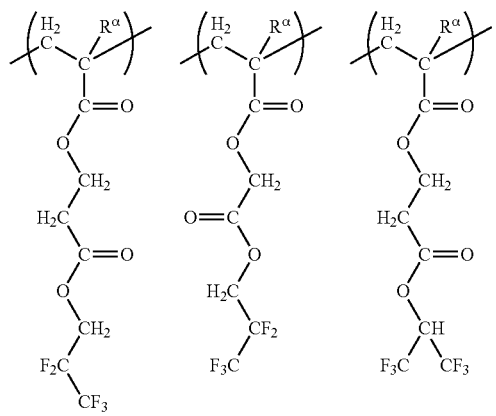
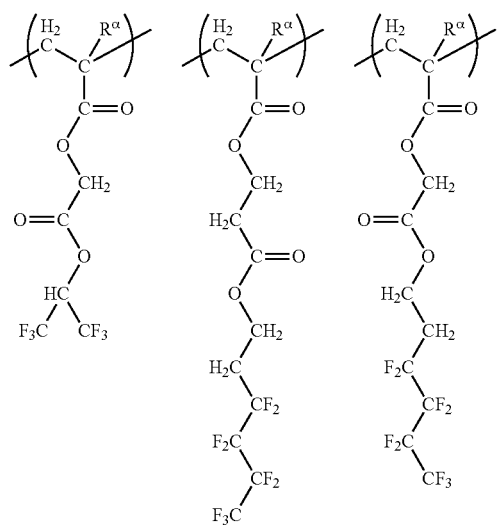
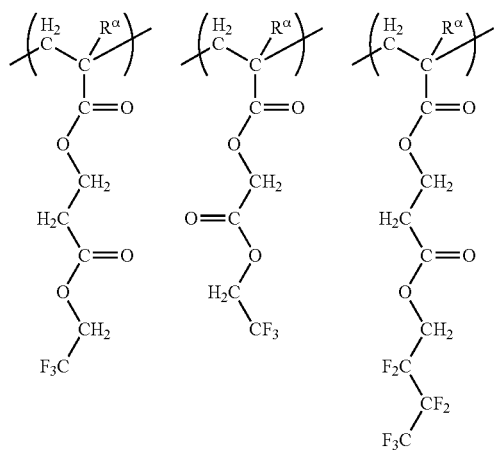
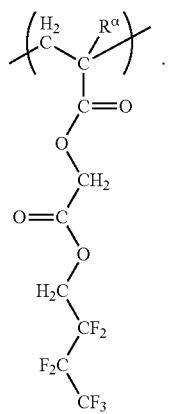
In the formulas, $R^\alpha$ represents a hydrogen atom or a methyl group.
[Chemical Formula 78]
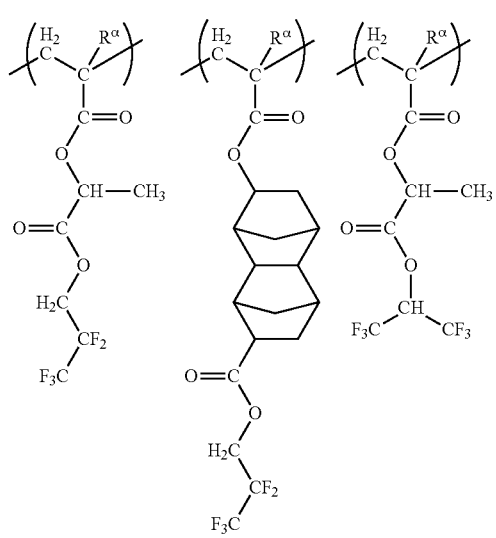
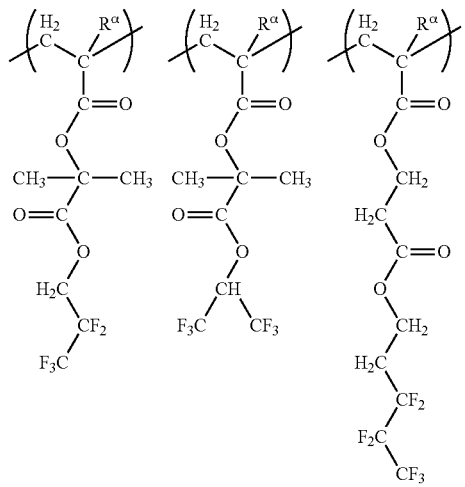

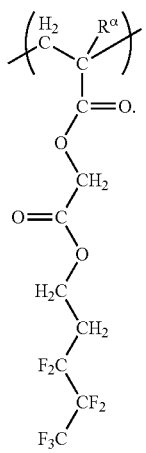
In the formulas, $R^\alpha$ represents a hydrogen atom or a methyl group.
[Chemical Formula 79]
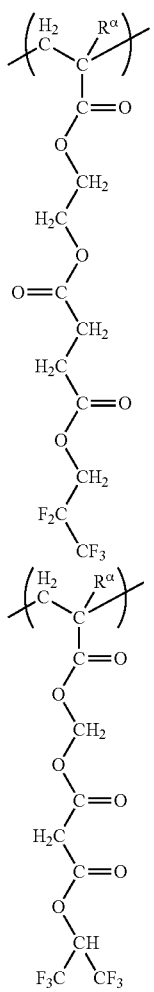 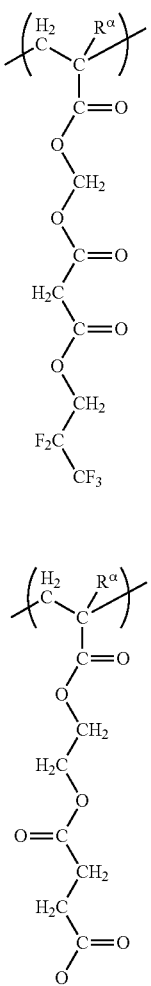 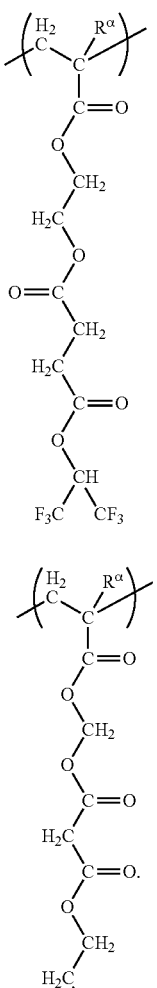
In the formulas, $R^\alpha$ represents a hydrogen atom or a methyl group.
[Chemical Formula 80]
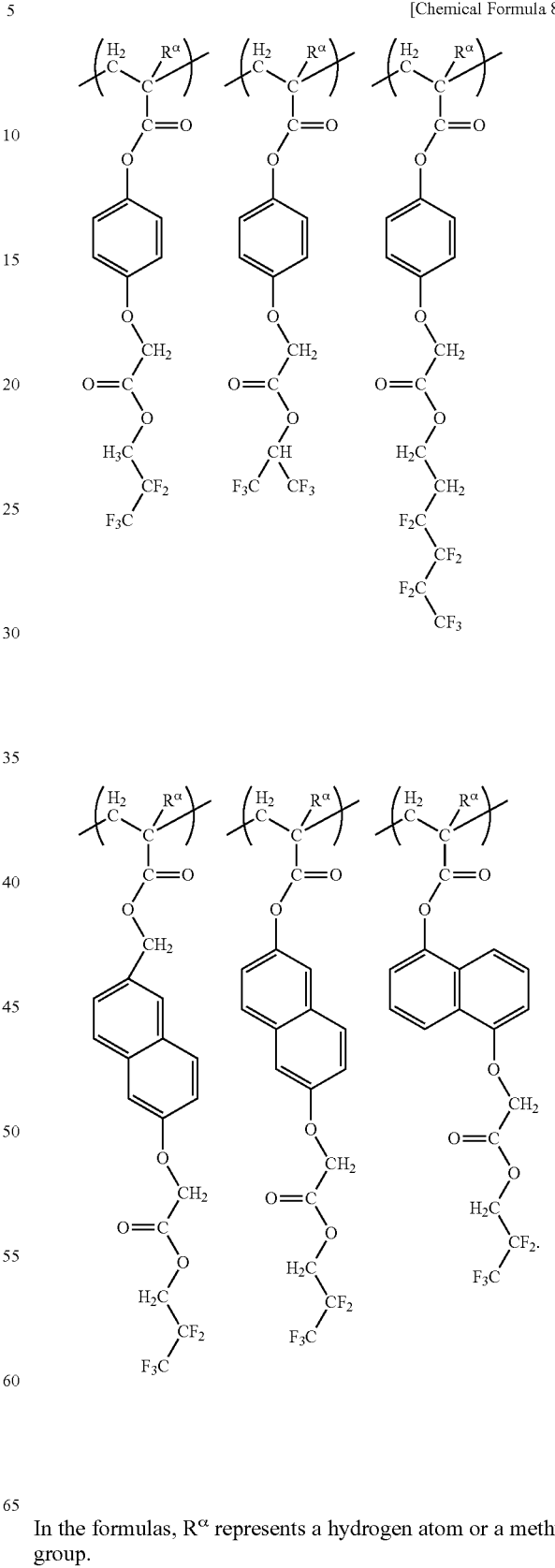
In the formulas, $R^\alpha$ represents a hydrogen atom or a methyl group.

[Chemical Formula 81]

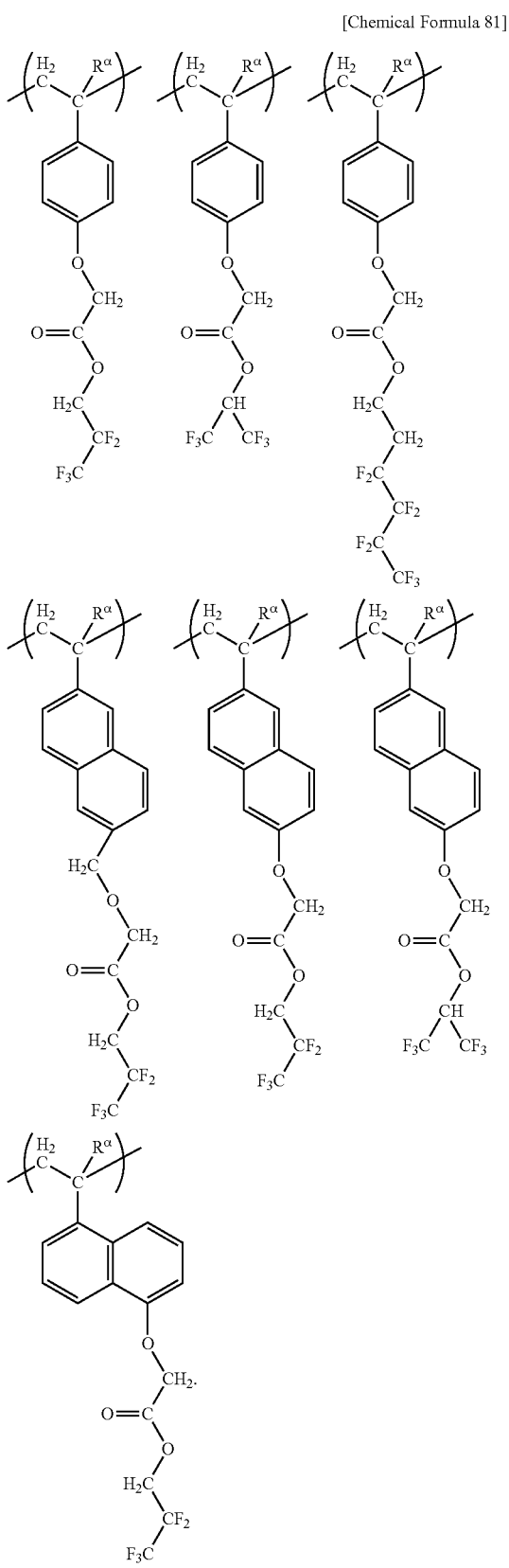

In the formulas, $R^α$ represents a hydrogen atom or a methyl group.

As the structural unit (f1-1), at least one structural unit selected from the group consisting of structural units represented by the aforementioned general formulas (f1-1-11) to (f1-1-16) and (f1-1-21) to (f1-1-26) is preferable, more preferably at least one structural unit selected from the group consisting of structural units represented by the aforementioned general formulas (f1-1-11) to (f1-1-13), (f1-1-21) and (f1-1-22), still more preferably at least one structural unit selected from the group consisting of structural units represented by the aforementioned general formulas (f1-1-11) and (f1-1-22), and most preferably structural units represented by the aforementioned general formula (f1-1-11).

In the component (F), as the structural unit (f1), one type of structural unit may be used alone, or two or more types may be used in combination.

In the component (F), the amount of the structural unit (f1) based on the combined total of all structural units constituting the component (F) is preferably 30 to 95 mol %, more preferably 40 to 90 mol %, and still more preferably 50 to 85 mol %.

When the amount of the structural unit (f1) is at least as large as the lower limit of the above-mentioned range, during resist pattern formation, the characteristic feature of enhancing hydrophobicity of the resist film is improved. On the other hand, when the amount of the structural unit (f1) is no more than the upper limit of the above-mentioned range, a good balance can be achieved with the other structural units.

When the structural unit (f1-1) is used as the structural unit (f1), in the component (F), the amount of the structural unit (f1-1) based on the combined total of all structural units constituting the component (F) is preferably 30 to 95 mol %, more preferably 40 to 90 mol %, and still more preferably 50 to 85 mol %. When the amount of the structural unit (f1-1) is at least as large as the lower limit of the above-mentioned range, the characteristic feature of enhancing hydrophobicity of the resist film is improved. On the other hand, when the amount of the structural unit (f1-1) is no more than the upper limit of the above-mentioned range, a good balance can be achieved with the other structural units.

Other Structural Unit (Structural Unit (f2))

The component (F) may include a structural unit other than the structural unit (f1) (hereafter, referred to as "structural unit (f2)"), as long as the effects of the present invention are not impaired.

There are no particular limitations on the structural unit (f2), provided the structural unit is derived from a compound that is copolymerizable with the compound that gives rise to the structural unit (f1).

Examples of the structural unit (f2) include structural units which have been proposed for the base resin of a conventional chemically amplified resist (such as the aforementioned structural units (a1) to (a4) in the component (A1)). When used in a positive resist composition, the structural unit (a1) can be mentioned as a preferable example of the structural unit (f2).

In the component (F), as the structural unit (f2), one type of structural unit may be used alone, or two or more types may be used in combination.

For example, when the structural unit (a1) is used as the structural unit (f2), of the various structural units classified as the structural unit (a1), structural units represented by general formulas (a1-1) and (a1-3) are preferable, structural units represented by general formula (a1-1) are more preferable, and structural units represented by general formulas (a1-1-28), (a1-1-31) to (a1-1-42), (a1-1-51) and (a1-1-52) are particularly desirable.

In the component (F), the amount of the structural unit (a1) based on the combined total of all structural units constituting the component (F) is preferably 1 to 40 mol %, and more preferably 5 to 30 mol %.

When the amount of the structural unit (a1) is within the above-mentioned range, the water repellency is improved, and a good balance can be achieved with the other structural units.

In the positive resist composition of the present invention, the component (F) is preferably a polymeric compound that includes the structural unit (f1) (hereafter, referred to as "fluorine-containing resin (F1-1)").

Examples of such a fluorine-containing resin (F1-1) include a copolymer containing the structural unit (f1) and the structural unit (f2). More specifically, a copolymer containing the structural unit (f1) and the structural unit (a1) can be mentioned as a preferable example.

Among the above-mentioned examples, it is particularly desirable that the fluorine-containing resin (F1-1) be a copolymer consisting of the structural unit (f1-1) and the structural unit (a1).

In the component (F), as the fluorine-containing resin (F1-1), one type may be used alone, or two or more types may be used in combination.

In the positive resist composition of the present invention, as the fluorine-containing resin (F1-1), a resin that includes a combination of structural units such as that shown below is particularly desirable.

[Chemical Formula 82]

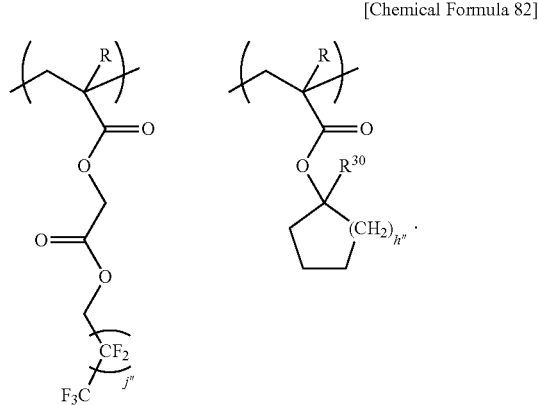

Fluorine-containing resin (F1-1-10)
In the formula, R is the same as defined above, and the plurality of R may be either the same or different from each other; j" represents an integer of 0 to 3, preferably an integer of 0 to 2, more preferably 0 or 1, and most preferably 0; $R^{30}$ represents a lower alkyl group of 1 to 5 carbon atoms and is the same as the lower alkyl group for R above, and is preferably a methyl group or an ethyl group, and most preferably an ethyl group; h" represents an integer of 1 to 6 and is preferably 3 or 4, and is most preferably 4.

The weight average molecular weight (Mw) (the polystyrene equivalent value determined by gel permeation chromatography) of the component (F) is not particularly limited, but is preferably 2,000 to 50,000, more preferably 3,000 to 30,000, and most preferably 4,000 to 25,000. When the weight average molecular weight is no more than the upper limit of the above-mentioned range, the component (F) exhibits satisfactory solubility in a resist solvent when used as a resist. On the other hand, when the weight average molecular weight is at least as large as the lower limit of the above-mentioned range, dry etching resistance and cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5. Mn represents the number average molecular weight.

The component (F) can be produced, for example, by a conventional radical polymerization or the like of the monomers corresponding with each of the structural units that constitute the component (F), using a radical polymerization initiator such as azobisisobutyronitrile (AIBN) or dimethyl 2,2'-azobis(isobutyrate) (V-601).

In the positive resist composition of the present invention, the amount of the component (F) is preferably from 0.5 to 30 parts by weight, more preferably from 1 to 20 parts by weight, and most preferably from 1 to 10 parts by weight, relative to 100 parts by weight of the component (A). By ensuring that the amount of the component (F) is at least as large as the lower limit of the above-mentioned range, the hydrophobicity of a resist film formed using the resist composition is enhanced. Further, the hydrophobicity of a resist film formed using the resist composition is also suitable for immersion exposure. On the other hand, by ensuring that the amount of the component (F) is no more than the upper limit of the above-mentioned range, solubility of the component (F) in a resist solvent (organic solvent) is improved. Further, the lithographic properties are also improved.

If desired, other miscible additives can also be added to the positive resist composition according to the present invention. Examples of such miscible additives include additive resins for improving the performance of the resist film, surfactants for improving the applicability, dissolution inhibitors, plasticizers, stabilizers, colorants, halation prevention agents, and dyes.

By using the positive resist composition according to the first aspect of the present invention, resist materials exhibit excellent solubility. As a result, satisfactory solubility of resist materials such as acrylic resins is achieved, and the precipitation of resist materials with time can be suppressed, and hence, the storage stability of the positive resist composition is improved.

The reason for this observation has not been elucidated yet, but it is presumed that because the alcohol-based organic solvent (namely, the above-mentioned component (S1)) added in the positive resist composition of the present invention has a higher boiling point than those of the conventionally used organic solvents, and also exhibits relatively high lipophilicity, the compatibility with the resist materials is improved.

Further, in the positive resist composition according to the first aspect of the present invention, the above-mentioned structural unit (a2) can be added in a larger amount, as compared to the conventional resist compositions containing an alcohol-based organic solvent which were limited in the amount of the structural unit (a2) added. As a result, the adhesion between the resist film and the substrate is enhanced, and the lithographic properties are further improved.

Moreover, the positive resist composition of the present invention also exhibits excellent wettability when applied to a substrate.

Furthermore, according to the positive resist composition of the present invention, film formability becomes satisfactory when forming a resist film on a substrate, and also both coating irregularities and striations can be suppressed.

(Method of Forming a Resist Pattern)

As a method of forming a resist pattern using the positive resist composition according to the present invention, a method including the following steps can be preferably used; i.e., a step of applying the positive resist composition of the present invention to a substrate to form a resist film on the substrate; a step of conducting exposure of the resist film; and a step of developing the resist film to form a resist pattern.

For example, firstly, the above-mentioned positive resist composition is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, the same substrate as that used in the method of forming a resist pattern according to the second aspect of the present invention described later can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

Further, according to the positive resist composition of the present invention, a resist pattern can be formed by the double patterning process without dissolving the first resist pattern formed using a first resist composition during the double patterning process. Therefore, the positive resist composition is also suitable as a resist composition for the double patterning process.

In other words, the positive resist composition according to the present invention is preferably a positive resist composition used for forming a second resist film in a method of forming a positive resist pattern, including: applying a positive resist composition to a substrate to form a first resist film on the substrate; subjecting the first resist film to selective exposure and alkali developing to form a first resist pattern; applying a positive resist composition on the substrate on which the first resist pattern is formed to form a second resist film; and subjecting the second resist film to selective exposure and alkali developing to form a resist pattern.

The steps conducted in the above-mentioned method of forming a positive resist pattern are the same as the steps conducted in the method of forming a resist pattern according to the second aspect of the present invention, which will be described later.

<<Method of Forming a Resist Pattern>>

More specifically, the method for forming a resist pattern according to the present invention includes:

a step of applying a positive resist composition (hereafter, frequently referred to as "first resist composition") to a substrate to form a first resist film on the substrate (hereafter, referred to as "film forming step (1)");

a step of subjecting the first resist film to selective exposure and alkali developing to form a first resist pattern (hereafter referred to as "patterning step (1)");

a step of applying the positive resist composition according to the present invention to the substrate on which the first resist pattern is formed to form a second resist film (hereafter, referred to as "film forming step (2)"); and a step of subjecting the second resist film to selective exposure and alkali developing to form a resist pattern (hereafter referred to as "patterning step (2)").

Each of these steps will be described in more detail below.

[Film Forming Step (1)]

The substrate is not specifically limited and a conventionally known substrate can be used. For example, substrates for electronic components, and such substrates having wiring patterns formed thereon can be used. Specific examples of the material of the substrate include a silicon wafer; metals such as copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The first resist film can be formed by a conventional method, for example, by applying a first positive resist composition on a substrate. The first positive resist composition can be applied by a conventional method using a spinner or the like.

The first positive resist composition used for forming the first resist film will be described later in detail.

More specifically, the first resist film can be formed, for example, by applying the first positive resist composition onto a substrate using a spinner or the like, and vaporizing organic solvents by conducting a bake treatment (prebake) at a temperature of 80 to 150° C. for 40 to 120 seconds, preferably 60 to 90 seconds.

The thickness of the resist film is preferably within the range from 50 to 500 nm, and more preferably from 50 to 450 nm. By ensuring that the thickness of the resist film satisfies the above-mentioned range, a resist pattern with a high level of resolution can be formed, and a satisfactory level of etching resistance can be achieved.

[Patterning Step (1)]

The patterning step can be conducted by a conventional method. For example, the first resist film is subjected to selective exposure using a mask having a predetermined pattern (mask pattern), a post exposure bake treatment (PEB) at a temperature of 80 to 150° C. for 40 to 120 seconds, preferably 60 to 90 seconds, and alkali developing using an alkali developing solution such as a 0.1 to 10% by weight aqueous solution of tetramethylammonium hydroxide (TMAH), thereby removing the exposed portions of the first resist film and forming a first resist pattern.

In some cases, the patterning step may include a post bake step following the above alkali developing.

The wavelength to be used for exposure is not particularly limited and the exposure can be conducted using radiation such as KrF excimer laser, ArF excimer laser, $F_2$ excimer laser, extreme ultraviolet rays (EUV), vacuum ultraviolet rays (VUV), electron beam (EB), X-rays, and soft X-rays.

The selective exposure of the first resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist film formed on a wafer (which was conventionally filled with air or an inert gas such as nitrogen) is filled with a solvent (an immersion medium) that has a larger refractive index than the refractive index of air.

More specifically, in immersion lithography, the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film (i.e., the first resist film in the patterning step (1)) to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and an example of a suitable perfluoroalkylamine compound is perfluorotributylamine (boiling point: 174° C.).

[Film Forming Step (2)]

Next, by applying the above-mentioned positive resist composition according to the present invention on the substrate on which the first resist pattern is formed, a second resist film is formed which fills in the gaps between a plurality of resist patterns.

Similar to the first resist film, the second resist film can be formed using a conventional method.

The film thickness of the second resist film is at least as thick as the first resist pattern and is preferably thicker. In other words when the substrate is viewed from the second resist film side, it is preferable that the substrate surface be flat.

[Patterning Step (2)]

Subsequently, regions within the second resist film other than the region where a plurality of resist patterns is already formed are subjected to selective exposure and developing. Accordingly, the exposed portions of the second resist film are removed, and between a plurality of resist patterns formed previously, a plurality of resist patterns is newly formed. As a result, a resist pattern is formed on the substrate which is composed of a plurality of resist patterns formed in the previous step, and a plurality of resist patterns newly formed on the second resist film.

In the present invention, when a first resist pattern is formed on a substrate, any region within the substrate which does not completely overlap with a region where the first resist pattern is formed is referred to as "region other than the region where the first resist pattern is formed". In other words, the expression includes a region which does not overlap at all with the region where the first resist pattern is formed, and also includes a region which only partially overlaps with the region where the first resist pattern is formed.

In the present invention, when forming a resist pattern so as to ultimately form a line and space pattern, it is preferable that the region where the first resist pattern is formed and the region exposed selectively in the patterning step (2) do not overlap at all. As a result, a resist pattern can be formed with a pitch smaller than that of the first resist pattern formed in the patterning step (1).

Selective exposure of "regions other than the region where the first resist pattern is formed" can be conducted, for example, by using a mask pattern which is different from the first mask pattern used in the patterning step (1).

For example, an isolated line and space pattern may be formed in the patterning step (1) using a mask pattern for forming a line and space pattern, in which a plurality of lines are arranged with a constant pitch; and then a line pattern may be formed in intermediate regions between the adjacent line patterns formed in the patterning step (1) by changing the mask pattern in the patterning step (2). Accordingly, a line and space pattern can be newly formed which has a pitch as small as the half size of the pitch of the previously formed line and space pattern. In other words, a dense resist pattern can be formed with a narrower pitch than that of the isolated pattern formed previously.

Here, the term "isolated pattern" refers to a line and space pattern in which the space width is large so that the ratio of the line width to the space width (i.e., line width:space width) is 1:at least 2.

As described above, in the present invention, the first resist pattern is preferably a line and space pattern. As a result, a dense line and space pattern with a small pitch can be formed.

More specifically, for example, a line and space pattern with a line width of 100 nm and the line width:space width ratio of 1:3 (i.e., an isolated pattern) may be first formed; and then another line and space pattern with a line width of 100 nm and the line width:space width ratio of 1:3 may be formed by parallel displacement of the mask pattern by 200 nm in the direction perpendicular to the line direction, thereby ultimately forming a line and space pattern with a line width of 100 nm and the line width:space width ratio of 1:1 (i.e., a dense pattern).

Further, a fine resist pattern with or without various profiles can be formed, for example, through rotational movement of the mask pattern used in the patterning step (1), or by using a mask pattern different from the mask pattern used in the patterning step (1) (for instance, by using a mask with a line and space pattern in the patterning step (1) and then using a mask with a hole pattern in the patterning step (2)). Furthermore, a resist pattern with a hole-like or lattice-like pattern can also be formed, for example, by conducting a crossline patterning process in which a first line and space resist pattern is formed in the patterning step (1), followed by exposure and developing processes conducted so as to form a pattern that intersects with the first resist pattern. When conducting a crossline patterning process, the line width:space width ratio or the intersection angle formed between the respective line and space patterns may be appropriately controlled, in accordance with the profiles of hole-like or lattice-like resist pattern to be ultimately formed. For example, depending on the types of targeted pattern, the intersection angle may be changed so that one pattern intersects with another pattern orthogonally or diagonally (i.e., at an angle less than 90°).

It is thought that a hole-like (or lattice-like) resist pattern can be formed from the first and second L/S patterns because of the non-uniform diffusion of the acid generated upon exposure during formation of the second resist pattern (for example, acid generation may be controlled in the direction where the first L/S pattern resides (as compared to other directions where the first L/S pattern is absent)), apart from the factors associated with the pattern formation process.

(First Positive Resist Composition)

In the film forming step (1) described above, the first positive resist composition for forming the first resist film is not particularly limited as long as it has a low compatibility with the aforementioned organic solvent (S), and a chemically amplified positive resist composition is preferable.

There are no particular limitations on the chemically amplified positive resist composition, and any of the positive resist compositions which have been proposed for conventional ArF resists and the like can be appropriately selected for use depending on the exposure light source, lithographic properties, and the like.

The chemically amplified positive resist composition generally includes a base component (A') (hereafter, referred to as "component (A')") which exhibits increased solubility in an alkali developing solution by the action of acid and an acid-generator component (B') (hereafter, referred to as "component (B')") which generates acid upon exposure.

<Component (A')>

In the first positive resist composition, the component (A') may be a resin component (A1') which exhibits increased solubility in an alkali developing solution under the action of acid (hereafter, frequently referred to as "component (A1')"), a low molecular weight compound (A2') which exhibits increased solubility in an alkali developing solution under the action of acid (hereafter, frequently referred to as "component (A2')"), or a mixture of the component (A1') and the component (A2').

As the component (A2'), the same compounds as those described above for the component (A2) may be used.

[Component (A1')]

It is preferable that the component (A1') include a structural unit (a1) derived from an acrylate ester containing an acid dissociable, dissolution inhibiting group.

Further, it is preferable that the component (A1') further include a structural unit (a2) derived from an acrylate ester containing a lactone-containing cyclic group, as well as the structural unit (a1).

Moreover, it is preferable that the component (A1') further include a structural unit (a3') derived from an acrylate ester containing a polar group-containing aliphatic hydrocarbon group, as well as the structural unit (a1), or the structural unit (a1) and the structural unit (a2).

Also, the component (A1') may further include a structural unit (a4') different from the above-mentioned structural units (a1), (a2) and (a3'), as well as the structural unit (a1).

Structural Unit (a1)

The structural unit (a1) is a structural unit derived from an acrylate ester containing an acid dissociable, dissolution inhibiting group, and the same groups as those for the structural unit (a1) described in relation to the positive resist composition according to the first aspect of the present invention can be used.

In the component (A1'), as the structural unit (a1), one type of structural unit may be used alone, or two or more types of structural units may be used in combination.

Further, as the structural unit (a1), there is no particular limitation, and an arbitrary structural unit may be used. Among the various possibilities, structural units represented by the aforementioned general formula (a1-1) are preferable. More specifically, at least one structural unit selected from the group consisting of structural units represented by formulas (a1-1-1) to (a-1-1-7) and (a1-1-36) to (a1-1-42) is more preferable.

In the component (A1'), the amount of the structural unit (a1) based on the combined total of all structural units constituting the component (A1') is preferably 10 to 80 mol %, more preferably 20 to 70 mol %, and still more preferably 25 to 50 mol %. When the amount of the structural unit (a1) is at least as large as the lower limit of the above-mentioned range, a pattern can be easily formed using a resist composition prepared from the component (A1'). On the other hand, when the amount of the structural unit (a1) is no more than the upper limit of the above-mentioned range, a good balance can be achieved with the other structural units.

Structural Unit (a2)

The structural unit (a2) is a structural unit derived from an acrylate ester containing a lactone-containing cyclic group, and the same groups as those for the structural unit (a2) described in relation to the positive resist composition according to the first aspect of the present invention can be used.

In the component (A1'), as the structural unit (a2), one type of structural unit may be used alone, or two or more types of structural units may be used in combination.

Further, as the structural unit (a2), there is no particular limitation, and an arbitrary structural unit may be used. Among the various possibilities, at least one structural unit selected from the group consisting of structural units represented by general formulas (a2-1) to (a2-5) is preferable, at least one structural unit selected from the group consisting of structural units represented by general formulas (a2-1) to (a2-3) is more preferable, and at least one structural unit selected from the group consisting of structural units represented by chemical formulas (a2-1-1), (a2-1-2), (a2-2-1), (a2-2-2), (a2-2-9), (a2-2-10), (a2-3-1), (a2-3-2), (a2-3-9) and (a2-3-10) is still more preferable.

In the component (A1'), the amount of the structural unit (a2) based on the combined total of all structural units constituting the component (A1') is preferably 5 to 60 mol %, more preferably 10 to 50 mol %, and still more preferably 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

Structural Unit (a3')

The structural unit (a3') is a structural unit derived from an acrylate ester containing a polar group-containing aliphatic hydrocarbon group.

When the component (A1') includes the structural unit (a3'), the hydrophilicity of the component (A') is enhanced, and hence, the compatibility of the component (A') with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of the polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3') is preferably a structural unit derived from a hydroxyethyl ester of acrylic acid. On the other hand, when the hydrocarbon group is a polycyclic group, structural units mentioned above in connection with the explanation of the structural unit (a0-2) in the positive resist composition according to the first aspect of the present invention and represented by general formula (a0-2-1); and structural units mentioned above in connection with the explanation of the structural unit (a3) and represented by general formulas (a3-1), (a3-2), and (a3-3) are preferable.

In the component (A1'), as the structural unit (a3'), one type of structural unit may be used alone, or two or more types of structural units may be used in combination.

The amount of the structural unit (a3') within the component (A1') based on the combined total of all structural units constituting the component (A1') is preferably 5 to 50 mol %, more preferably 5 to 40 mol %, and still more preferably 5 to 25 mol %. When the amount of the structural unit (a3') is at least as large as the lower limit of the above-mentioned range, the effect of using the structural unit (a3') can be satisfactorily achieved. On the other hand, when the amount of the structural unit (a3') is no more than the upper limit of the above-mentioned range, a good balance can be achieved with the other structural units.

Structural Unit (a4')

As the structural unit (a4'), any other structural unit which cannot be classified as one of the above structural units (a1), (a2) and (a3') can be used without any particular limitations, and any of the multitude of conventional structural units used within resist resins for ArF excimer lasers or KrF excimer lasers (and particularly for ArF excimer lasers) can be used. For example, those structural units mentioned in relation to the positive resist composition according to the first aspect of the present invention can be used.

When the structural unit (a4') is included in the component (A1'), the amount of the structural unit (a4') based on the combined total of all the structural units that constitute the component (A1') is preferably within the range from 1 to 30 mol %, and more preferably from 10 to 20 mol %.

In the first positive resist composition, the component (A1') is preferably a copolymer having the structural unit (a1), and examples of such copolymers include a copolymer consisting of the structural units (a1) and (a2); a copolymer consisting of the structural units (a1) and (a3'); a copolymer consisting of the structural units (a1), (a2) and (a3'); and a copolymer consisting of the structural units (a1), (a2), (a3') and (a4').

In the component (A'), as the component (A1'), one type may be used alone, or two or more types may be used in combination.

In the first positive resist composition, it is particularly desirable that the component (A1') include a combination of structural units such as that shown in the following general formula (A1'-11).

[Chemical Formula 83.]

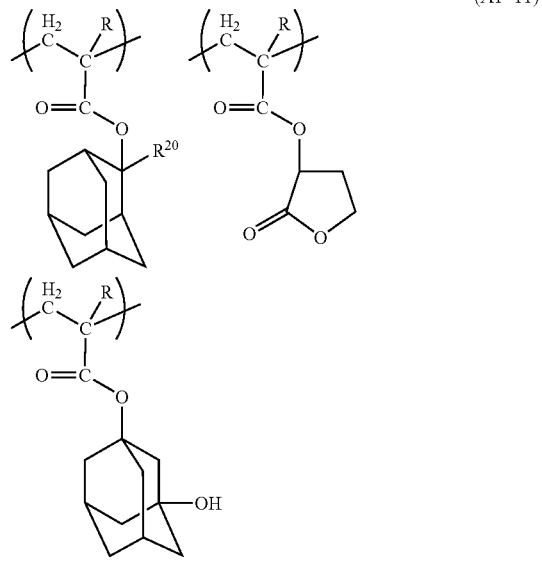

(A1'-11)

In formula (A1'-11), R is the same as defined above, and the plurality of R may be either the same or different from each other; and $R^{20}$ is the same as defined for $R^{11}$ in formula (a1-1-01).

The component (A1') can be obtained, for example, by a conventional radical polymerization or the like of the monomers corresponding with each of the structural units, using a radical polymerization initiator such as azobisisobutyronitrile (AIBN).

Furthermore, in the component (A1'), by using a chain transfer agent such as HS—$CH_2$—$CH_2$—$CH_2$—$C(CF_3)_2$—OH during the polymerization, a —$C(CF_3)_2$—OH group can be introduced at the terminals of the component (A1'). Such a copolymer having introduced a hydroxyalkyl group in which part of the hydrogen atoms of the alkyl group are substituted with fluorine atoms is effective in reducing line width roughness (LWR). Such a copolymer is also effective in reducing developing defects and line edge roughness (LER: unevenness of the side walls of a line pattern).

The weight average molecular weight (Mw) (the polystyrene equivalent value determined by gel permeation chromatography) of the component (A1') is not particularly limited, but is preferably 2,000 to 50,000, more preferably 3,000 to 30,000, and most preferably 5,000 to 20,000.

When the weight average molecular weight is no more than the upper limit of the above-mentioned range, the component (A1') exhibits satisfactory solubility in a resist solvent when used as a resist. On the other hand, when the weight average molecular weight is at least as large as the lower limit of the above-mentioned range, dry etching resistance and cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5.

<Component (B')>

As the component (B'), there is no particular limitation, and any of the known acid generators used in conventional chemically amplified resist compositions can be used. As the component (B'), the same acid generators as those for the component (B) described above in relation to the positive resist composition according to the first aspect of the present invention can be used.

As the component (B'), one type of these acid generators may be used alone, or two or more types may be used in combination.

In the present invention, as the component (B'), it is particularly desirable to use an onium salt having a fluorinated alkylsulfonic acid ion as the anion moiety.

The amount of the component (B') within the first positive resist composition is preferably from 0.5 to 60 parts by weight and more preferably from 1 to 40 parts by weight, relative to 100 parts by weight of the component (A'). When the amount of the component (B') is within the above-mentioned range, formation of a resist pattern can be satisfactorily performed. Further, by virtue of the above-mentioned range, a uniform solution can be obtained and the storage stability becomes satisfactory.

<Component (D')>

In order to improve factors such as the resist pattern shape and the post exposure stability of the latent image formed by the pattern-wise exposure of the resist layer, in the first positive resist composition, a nitrogen-containing organic compound (D') (hereafter referred to as "component (D')") can be added as an optional component.

A multitude of these components (D') have already been proposed, and any of these known compounds may be used. As the component (D'), the same compounds as those for the component (D) described above in relation to the positive resist composition according to the first aspect of the present invention can be used.

As the component (D'), one type of these nitrogen-containing organic compounds may be used alone, or two or more types may be used in combination.

The component (D') is typically used in an amount within a range from 0.01 to 5.0 parts by weight, relative to 100 parts by weight of the component (A').

<Component (E')>

Furthermore, in the first positive resist composition, for preventing any deterioration in sensitivity, and improving the resist pattern shape and the post exposure stability of the latent image formed by the pattern-wise exposure of the resist layer, at least one compound (E') (hereafter referred to as "component (E')") selected from the group consisting of an organic carboxylic acid, or a phosphorus oxo acid or derivative thereof can be added as an optional component.

A multitude of these components (E') have already been proposed, and any of these known compounds may be used. As the component (E'), the same compounds as those for the component (E) described above in relation to the positive resist composition according to the first aspect of the present invention can be used.

As the component (E'), one type of these compounds may be used alone, or two or more types may be used in combination.

As the component (E'), an organic carboxylic acid is preferable, and salicylic acid is particularly desirable.

The component (E') is typically used in an amount within a range from 0.01 to 5.0 parts by weight, relative to 100 parts by weight of the component (A').

If desired, other miscible additives can also be added to the first positive resist composition. Examples of such miscible additives include additive resins for improving the performance of the resist film, surfactants for improving the applicability, dissolution inhibitors, plasticizers, stabilizers, colorants, halation prevention agents, and dyes.

<Component (S')>

The first positive resist composition can be prepared by dissolving the materials for the resist composition in an organic solvent (hereafter, frequently referred to as "component (S')").

The component (S') may be any organic solvent which can dissolve the respective components to give a uniform solution, and any one or more kinds of organic solvents can be appropriately selected from those which have been conventionally known as solvents for a chemically amplified resist.

As the component (S'), the same organic solvents as those for the component (S3) described above in relation to the positive resist composition according to the first aspect of the present invention can be used.

These components (S') can be used either alone, or in combinations of two or more different solvents.

In the first positive resist composition, as the component (S'), propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S'), a mixed solvent of at least one of PGMEA and EL with γ-butyrolactone is also preferable. The mixing ratio (former:latter) of such a mixed solvent is preferably from 70:30 to 95:5.

There are no particular limitations on the overall amount used of the component (S'), and an amount that produces a liquid having a concentration that is suitable for application of the first positive resist composition onto a substrate is used.

By employing the method of forming a resist pattern described above according to the second aspect of the present invention, a resist pattern having a high level of resolution and excellent shape can be formed with minimal adverse effects on the first resist pattern during the double patterning process.

Furthermore, there is no need to use a freezing agent or the like, which results in improved workability.

Especially when forming a hole-like (or lattice-like) resist pattern, because a hole-like (or lattice-like) resist pattern with a high level of resolution and minute dimensions can be satisfactorily formed, among the various methods described above, it is preferable to employ a method of forming a resist pattern which involves the above-mentioned crossline patterning process, that is, a method including: a step of applying a positive resist composition on a substrate to form a first resist film on the substrate; a step of subjecting the first resist film to selective exposure and alkali developing to form a first line and space resist pattern; a step of applying the positive resist composition according to the present invention on the substrate on which the first line and space resist pattern is formed to form a second resist film; and a step of subjecting the second resist film to selective exposure and alkali developing so as to form a resist pattern that intersects with the first line and space resist pattern.

When conducting such a crossline patterning process, it is preferable to use an acid-generator component having an anion moiety that includes a bulky substituent in the positive resist composition according to the present invention used as the second resist composition, because a hole-like (or lattice-like) resist pattern with even higher levels of resolution and even finer dimensions can be formed.

Of the various acid-generator components, it is more preferable to use an acid-generator component that includes a fluorinated alkylsulfonate ion wherein the aforementioned $R^{4"}$ group is "group having a substituent group represented by formula $X-Q^1-$" as an anion moiety, and it is still more preferable to use an acid-generator component that includes a fluorinated alkylsulfonate ion wherein the aforementioned $R^{4"}$ group is a "group having a substituent group represented by formula $X-Q^1-Y^{4"}$" as an anion moiety. Specific examples of preferable anion moieties include anions represented by the above formulas (b1) to (b8), and anion moieties having a polycyclic group are particularly desirable.

Furthermore, in addition to the use of an acid-generator component having an anion moiety that includes a bulky substituent in the second positive resist composition as described above, it is preferable to use an acid-generator component having an anion moiety that includes a bulky substituent also in a positive resist composition used as the first resist composition. In this case, it is more preferable to use an acid-generator component that includes a fluorinated alkylsulfonate ion (wherein the aforementioned $R^{4"}$ group is a "group having a substituent group represented by formula $X-Q^1-$") as an anion moiety, and it is most preferable to use an acid-generator component that includes a fluorinated alkylsulfonate ion (wherein the aforementioned $R^{4"}$ group is a "group having a substituent group represented by formula $X-Q^1-Y^{4"}$") as an anion moiety. More specifically, acid-generator components having anions represented by the above formulas (b1) to (b8) as an anion moiety can be used favorably.

In the method of forming a resist pattern according to the present invention, the component (S1) included in the positive resist composition of the present invention for forming the second resist film is an organic solvent capable of dissolving resist materials, such as the components (A) and (B), without dissolving the first resist film. According to the method of forming a resist pattern described above, a resist pattern can be stably formed by the double patterning process while hardly dissolving the first resist pattern formed by the first positive resist composition.

EXAMPLES

As follows is a more detailed description of the present invention based on a series of examples, although the scope of the present invention is by no way limited by these examples.

<Synthesis of Resin Component (A):—No. 1>

Copolymers used as the component (A) used in Examples and Comparative Examples, i.e., the copolymers (A1-1-11) to (A1-1-21), (A1-1-22), (A1-1-23), (A1-2-1), (A1-3-1), (A1-4-1), (A1-5-1), (A1-6-1), (A1-7-1), (A1-7-2), and (A1-8-1) were synthesized by using the respective monomers (1) to (10) represented by chemical formulas shown below, as described in the following Synthesis Examples.

The monomer (3) was synthesized by the Synthesis Example described below.

[Chemical Formula 84.]

Monomer (1)

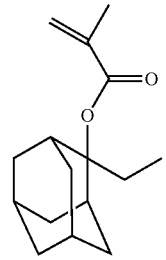

Monomer (2)

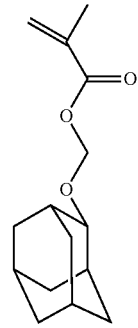

Monomer (3)

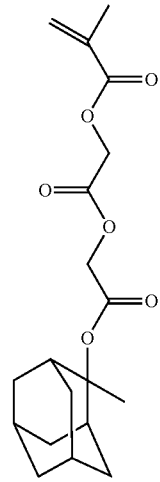

Monomer (4)

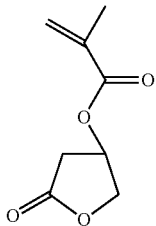

Monomer (5)

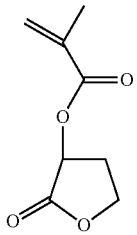

Monomer (6)

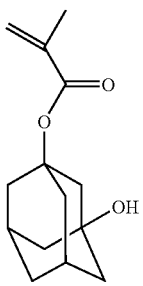

Monomer (7)

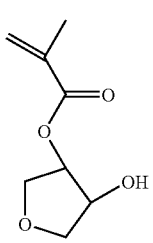

Monomer (8)

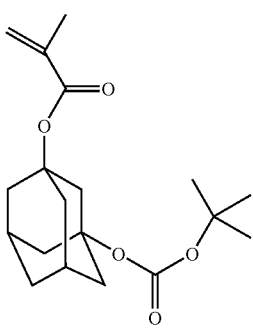

Monomer (9)

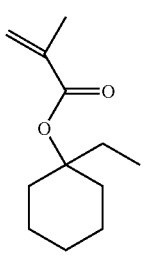

Monomer (10)

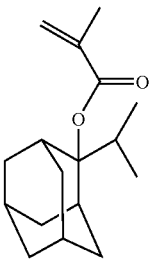

[Synthesis Example of Monomer (3)]

(i) Synthesis of 2-(2-(2-methyl-2-adamantyloxy)-2-oxoethoxy)-2-oxoethanol 37.6 g (494 mmol) of glycolic acid, 700 mL of DMF, 86.5 g (626 mmol) of potassium carbonate, and 28.3 g (170 mmol) of potassium iodide were added to a 2 L three-necked flask equipped with a thermometer, a cooling pipe, and a stirrer, followed by stirring at room temperature for 30 minutes. Then, 300 mL of a dimethylformamide solution containing 100 g (412 mmol) of 2-methyl-2-adamantyl chloroacetate was gradually added thereto. The resultant was heated to 40° C., and stirred for 4 hours. Following the completion of the reaction, 2,000 mL of diethyl ether was added to the reaction mixture, followed by filtration. The resulting solution was washed three times with 500 mL of distilled water, followed by crystallization using a mixed solution containing 300 mL of toluene and 200 mL of heptane, thereby obtaining 78 g of an objective compound in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results shown above, it was confirmed that the obtained compound was 2-(2-(2-methyl-2-adamantyloxy)-2-oxoethoxy)-2-oxoethanol.

(ii) Synthesis of 2-(2-(2-methyl-2-adamantyloxy)-2-oxoethoxy)-2-oxoethyl methacrylate [Monomer (3)]

165 g (584 mmol) of 2-(2-(2-methyl-2-adamantyloxy)-2-oxoethoxy)-2-oxoethanol, 2,000 mL of THF, 105 ML (754 mmol) of triethylamine, and 0.165 g (1,000 ppm) of p-methoxyphenol were added to and dissolved in a 2 L three-necked flask equipped with a thermometer, a cooling pipe, and a stirrer. Then, 62.7 mL (648 mmol) of methacryloyl chloride was gradually added thereto while cooling in an ice bath. The temperature of the resultant was elevated to room temperature, and the resultant was stirred for 3 hours. Following the completion of the reaction, 1,000 mL of diethyl ether was added thereto, followed by washing with 200 mL of distilled water 5 times. Thereafter, the extraction liquid was concentrated, thereby obtaining 198 g of an objective monomer (3) in the form of a colorless liquid (yield: 97%, GC purity: 99%).

The results of instrumental analysis of the obtained monomer (3) were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

From the results shown above, it was confirmed that the obtained monomer (3) was 2-(2-(2-methyl-2-adamantyloxy)-2-oxoethoxy)-2-oxoethyl methacrylate.

[Synthesis Example of Resin Component (A)]

This process is described in more detail using the synthesis of the copolymer (A1-1-11) as an example.

9.92 g of a monomer (1), 1.70 g of a monomer (4), 4.72 g of a monomer (6) and 10.1 g of a monomer (8) were dissolved in 106 g of methyl ethyl ketone. Then, 3.02 mmol of dimethyl 2,2'-azobis(isobutyrate) (product name: V-601, manufactured by Wako Pure Chemical Industries, Ltd.) as a polymerization initiator was added and dissolved in the resulting solution. The resulting solution was dropwise added to 30 g of methyl ethyl ketone heated to 75° C. over 6 hours in a nitrogen atmosphere. Following completion of the dropwise addition, the reaction solution was heated for 1 hour while stirring, and was then cooled to room temperature. Subsequently, an operation in which the reaction solution was added dropwise to an excess amount of mixed solution of methanol/water to precipitate a reaction product was repeated three times. The thus obtained reaction product was then dried under reduced pressure at room temperature, thereby obtaining the copolymer (A1-1-11) in the form of a white powder.

Other copolymers, i.e., the copolymers (A1-1-12) to (A1-1-21), (A1-1-22) and (A1-1-23), (A1-2-1), (A1-3-1), (A1-4-1), (A1-5-1), (A1-6-1), (A1-7-1) and (A1-7-2), and (A1-8-1) were synthesized in substantially the same manner as in the above method for synthesizing the copolymer (A1-1-11), except that monomers for deriving the structural units of the respective copolymers were used in a predetermined molar ratio.

Structures of the copolymers obtained in the above-mentioned Synthesis Example are shown below.

[Chemical Formula 85.]

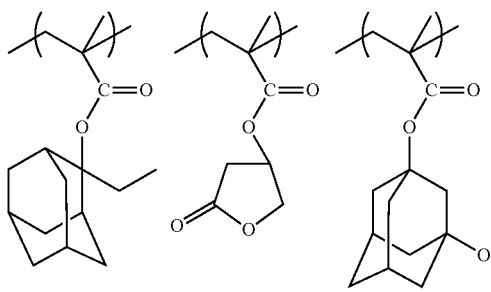

(A1-1-11)~(A1-1-21)

[Chemical Formula 86.]

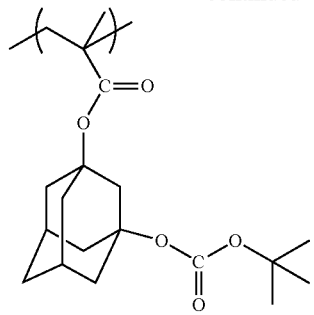

(A1-1-22)~(A1-1-23)

[Chemical Formula 87.]

(A1-2-1)

[Chemical Formula 88.]
(A1-3-1)
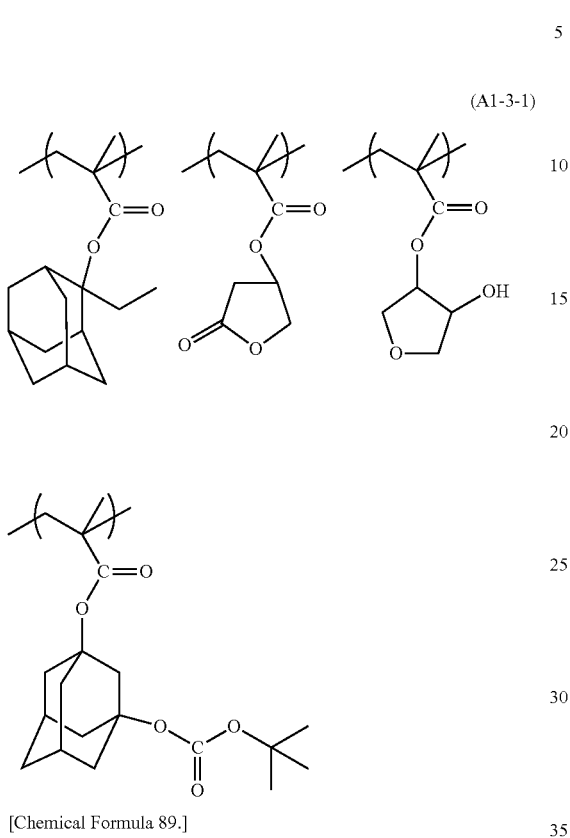
[Chemical Formula 89.]
[Chemical Formula 90.]
(A1-5-1)
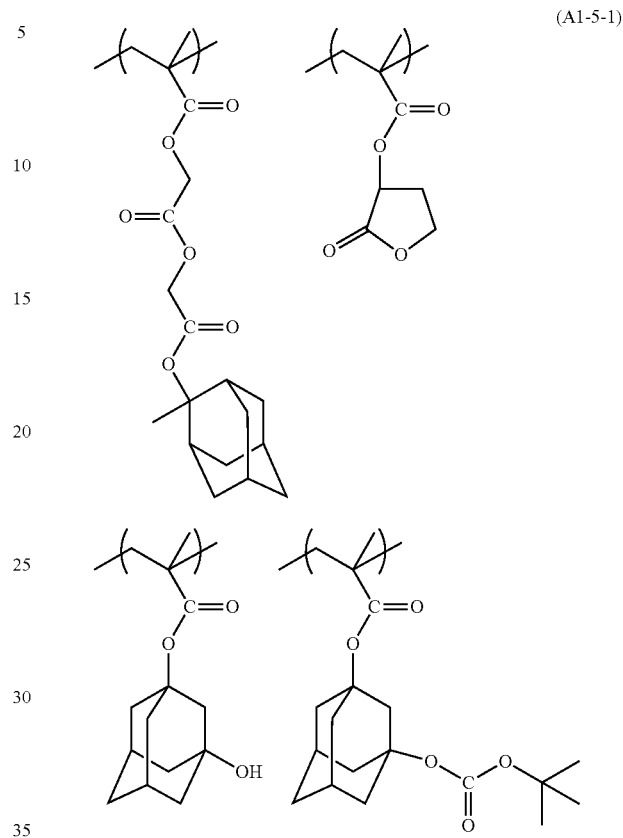
[Chemical Formula 91.]
(A-4-1)
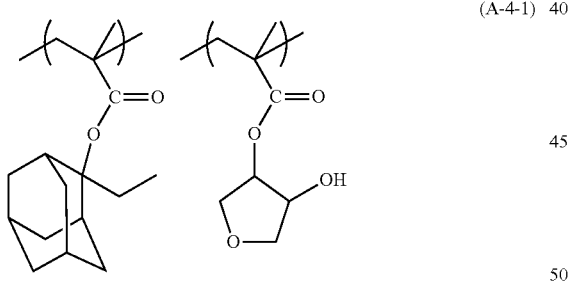
(A1-6-1)
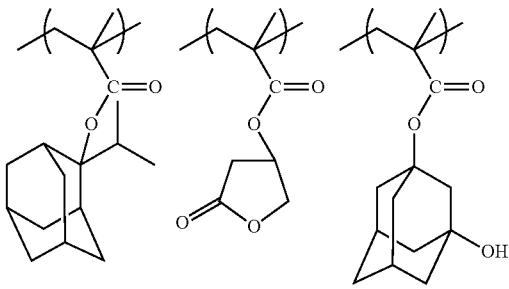

-continued

[Chemical Formula 92.]

(A1-7-1)~(A1-7-2)

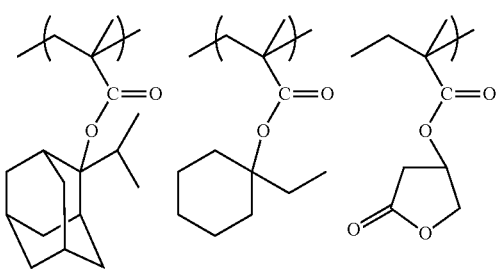

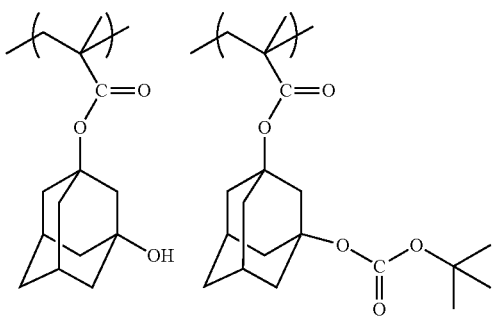

-continued

[Chemical Formula 93.]

(A1-8-1)

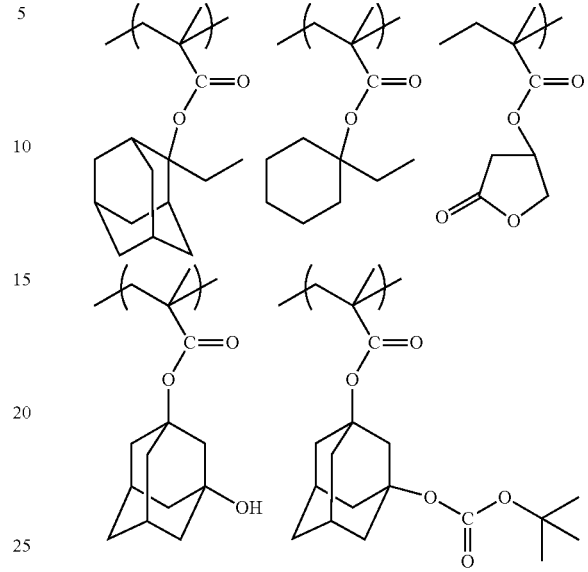

The weight average molecular weight (Mw) and dispersity (Mw/Mn) of the copolymers obtained in the above-mentioned Synthesis Example were determined by the polystyrene equivalent value as measured by gel permeation chromatography (GPC).

Further, the compositional ratio indicating the percentage (mol %) of structural units derived from the respective monomers within the copolymers was determined by carbon NMR.

The compositional ratio indicating the percentage (mol %) of structural units derived from the respective monomers within the copolymers, and weight average molecular weight (Mw) and dispersity (Mw/Mn) of the copolymers are shown in Table 1.

TABLE 1

| Copolymer | Percentage of structural units derived from respective monomers (mol %) | | | | | | | | | | Mw | Mw/Mn |
| --- | --- | --- | --- | --- | --- | --- | --- | --- | --- | --- | --- | --- |
|  | (1) | (2) | (3) | (4) | (5) | (6) | (7) | (8) | (9) | (10) |  |  |
| (A1-1-11) | 40 |  |  | 10 |  | 20 |  | 30 |  |  | 7000 | 1.59 |
| (A1-1-12) | 40 |  |  | 15 |  | 20 |  | 25 |  |  | 7000 | 1.66 |
| (A1-1-13) | 40 |  |  | 20 |  | 20 |  | 20 |  |  | 7000 | 1.69 |
| (A1-1-14) | 45 |  |  | 15 |  | 20 |  | 20 |  |  | 7000 | 1.68 |
| (A1-1-15) | 50 |  |  | 10 |  | 20 |  | 20 |  |  | 7000 | 1.67 |
| (A1-1-16) | 50 |  |  | 15 |  | 15 |  | 20 |  |  | 7000 | 1.70 |
| (A1-1-17) | 50 |  |  | 20 |  | 15 |  | 15 |  |  | 7000 | 1.65 |
| (A1-1-18) | 55 |  |  | 20 |  | 10 |  | 15 |  |  | 7000 | 1.70 |
| (A1-1-19) | 60 |  |  | 20 |  | 10 |  | 10 |  |  | 7000 | 1.70 |
| (A1-1-20) | 55 |  |  | 25 |  | 10 |  | 10 |  |  | 7000 | 1.65 |
| (A1-1-21) | 45 |  |  | 25 |  | 15 |  | 15 |  |  | 7000 | 1.70 |
| (A1-1-22) | 35 |  |  |  | 25 | 20 |  | 20 |  |  | 7000 | 1.70 |
| (A1-1-23) | 45 |  |  |  | 25 | 15 |  | 15 |  |  | 7000 | 1.70 |
| (A1-2-1) |  | 40 |  | 10 |  | 20 |  | 30 |  |  | 7000 | 1.61 |
| (A1-3-1) | 50 |  |  | 10 |  |  | 20 | 20 |  |  | 7000 | 1.69 |
| (A1-4-1) | 50 |  |  |  |  |  | 30 | 20 |  |  | 7000 | 1.70 |
| (A1-5-1) |  |  | 50 |  | 10 | 20 |  | 20 |  |  | 7000 | 1.66 |
| (A1-6-1) |  |  |  | 10 |  | 20 |  | 20 |  | 50 | 7000 | 1.50 |
| (A1-7-1) |  |  |  | 10 |  | 20 |  | 20 | 15 | 35 | 7000 | 1.60 |
| (A1-7-2) |  |  |  | 10 |  | 15 |  | 15 | 15 | 45 | 7000 | 1.65 |
| (A1-8-1) | 50 |  |  | 20 |  | 10 |  | 10 | 10 |  | 7000 | 1.65 |

<Synthesis of Fluorine-Containing Compound (F)>

20.00 g (88.44 mmol) of the [compound 1] and 6.60 g (29.48 mmol) of the [compound 2] were added to a three-necked flask equipped with a thermometer and a reflux tube and were dissolved by adding 39.90 g of THF thereto. Then, 23.58 mmol of dimethyl 2,2'-azobis(isobutyrate) (product name: V-601) as a polymerization initiator was added and dissolved in the resulting solution. The solution was dropwise added to 22.17 g of THF heated to 67° C. in a nitrogen atmosphere over 3 hours to effect a polymerization reaction. Thereafter, the solution was stirred while heating for 4 hours, and was then cooled to room temperature. The resulting polymer solution was dropwise added to an excess amount of n-heptane to precipitate a polymer. Then, the precipitated polymer was separated by filtration, followed by washing and drying, thereby obtaining 13 g of a fluorine-containing resin (F1-1-11) as an objective compound.

With respect to the fluorine-containing resin (F1-1-11), the weight average molecular weight (Mw) and the dispersity (Mw/Mn) were determined by the polystyrene equivalent value as measured by gel permeation chromatography (GPC). As a result, it was found that the weight average molecular weight was 13,800, and the dispersity was 1.5. Further the fluorine-containing resin (F1-1-11) was analyzed by carbon 13 nuclear magnetic resonance spectroscopy (600 MHz, $^{13}$C-NMR) to determine the composition of the copolymer (ratio 1/m (molar ratio) of the respective structural units within the structural formula). As a result, it was found that the composition of the copolymer was 1/m=77.6/22.4 (molar ratio).

[Chemical Formula 94.]

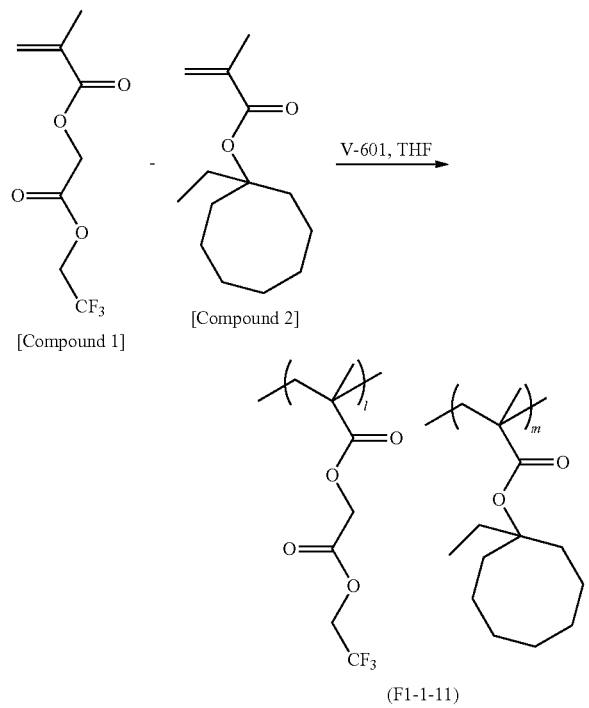

<Evaluation of Solubility of Resin Component (A) in Alcohol-Based Organic Solvent—(1)>

Evaluations of the solubility of a resin component (A) in an alcohol-based organic solvent were conducted in accordance with the evaluation method described below, using the aforementioned copolymers and the following alcohol-based organic solvents.

Alcohol-Based Organic Solvent:
(S)-1: 1-butoxy-2-propanol (boiling point: 170° C.)
(S)-2: isobutanol (boiling point: 108° C.)
(S)-3: 4-methyl-2-pentanol (boiling point: 132° C.)
(S)-11: cyclohexane methanol (boiling point: 183° C.)

[Evaluation Method]

0.1 g of each copolymer powder was added to 0.3 g of an alcohol-based organic solvent, and the resultant was mixed so as to achieve a copolymer solution with a solid content of 25% by weight, and an evaluation of whether the copolymer powder was dissolved or not at room temperature (i.e., 23° C.) was performed.

When the copolymer powder did not dissolve in the above conditions, 0.6 g of an alcohol-based organic solvent was further added and mixed so as to achieve a copolymer solution with a solid content of 10% by weight, and an evaluation of whether the copolymer powder was dissolved or not under the aforementioned condition was performed.

When the copolymer powder still did not dissolve in the above conditions, 1.0 g of an alcohol-based organic solvent was further added and mixed so as to achieve a copolymer solution with a solid content of 5% by weight, and an evaluation of whether the copolymer powder was dissolved or not under the aforementioned condition was performed.

When the copolymer powder still did not dissolve in the above conditions, 3.0 g of an alcohol-based organic solvent was further added and mixed so as to achieve a copolymer solution with a solid content of 2% by weight, and an evaluation of whether the copolymer powder was dissolved or not under the aforementioned condition was performed.

When the copolymer powder did not dissolve in the above conditions, 5.0 g of an alcohol-based organic solvent was further added and mixed so as to achieve a copolymer solution with a solid content of 1% by weight, and an evaluation of whether the copolymer powder was dissolved or not under the aforementioned condition was performed.

The obtained evaluation results are shown in Table 2.

In Table 2, the symbol A indicates that the copolymer powder was dissolved, whereas the symbol B indicates that the copolymer powder was not dissolved, respectively.

TABLE 2

| Copolymer | Organic solvent | Solid Content of Polymer (% by weight) | | | | |
|---|---|---|---|---|---|---|
| | | 1 | 2 | 5 | 10 | 25 |
| (A1-1-11) | (S)-1 | A | A | A | A | A |
| | (S)-2 | B | B | B | B | B |
| | (S)-3 | B | B | B | B | B |
| | (S)-11 | A | A | A | A | A |
| (A1-1-12) | (S)-1 | A | A | B | B | B |
| | (S)-2 | B | B | B | B | B |
| | (S)-3 | B | B | B | B | B |
| | (S)-11 | A | A | B | B | B |
| (A1-1-14) | (S)-1 | A | A | A | A | B |
| | (S)-2 | A | B | B | B | B |
| | (S)-3 | A | B | B | B | B |
| | (S)-11 | A | A | A | A | B |
| (A1-1-15) | (S)-1 | A | A | A | A | A |
| | (S)-2 | A | A | A | B | B |
| | (S)-3 | A | A | A | B | B |
| | (S)-11 | A | A | A | A | A |
| (A1-1-16) | (S)-1 | A | A | A | A | A |
| | (S)-11 | A | A | A | A | A |
| (A1-1-17) | (S)-1 | A | A | A | A | B |
| | (S)-11 | A | A | A | A | B |
| (A1-1-18) | (S)-1 | A | A | A | A | A |
| | (S)-11 | A | A | A | A | A |
| (A1-1-22) | (S)-1 | A | A | A | A | A |
| | (S)-11 | A | A | A | A | A |

TABLE 2-continued

| Copolymer | Organic solvent | Solid Content of Polymer (% by weight) | | | | |
|---|---|---|---|---|---|---|
| | | 1 | 2 | 5 | 10 | 25 |
| (A1-2-1) | (S)-1 | A | A | B | B | B |
| | (S)-11 | A | A | B | B | B |
| (A1-3-1) | (S)-1 | A | A | A | A | B |
| | (S)-11 | A | A | A | A | B |
| (A1-4-1) | (S)-1 | A | A | A | B | B |
| | (S)-11 | A | A | A | B | B |
| (A1-5-1) | (S)-1 | A | A | A | A | B |
| | (S)-11 | A | A | A | A | B |

From the results shown in Table 2, it was confirmed that solubility of the resin component (A) as a resist material was more satisfactory in 1-butoxy-2-propanol and cyclohexane methanol, which had boiling points of at least 150° C., than in isobutanol and 4-methyl-2-pentanol, which had boiling points of lower than 150° C.

<Preparation of Positive Resist Composition Solution—(1)>

Examples 1 to 3, Comparative Examples 1 to 3 and Test Example 1

The components shown in Table 3 were mixed together and dissolved to obtain positive resist composition solutions.

TABLE 3

| | Component (A) | Component (B) | Component (D) | Component (S) |
|---|---|---|---|---|
| Test Example 1 | (A)-1 [100] | (B)-1 [15.0] | (D)-1 [0.35] | (S)-6 [2,400] |
| Comparative Example 1 | (A)-1 [100] | (B)-1 [15.0] | (D)-1 [0.35] | (S)-2 [2,400] |
| Comparative Example 2 | (A)-1 [100] | (B)-1 [15.0] | (D)-1 [0.35] | (S)-3 [2,400] |
| Example 1 | (A)-1 [100] | (B)-1 [15.0] | (D)-1 [0.35] | (S)-1 [2,400] |
| Example 2 | (A)-1 [100] | (B)-1 [15.0] | (D)-1 [0.35] | (S)-4 [2,400] |
| Comparative Example 3 | (A)-1 [100] | (B)-1 [20.0] | (D)-2 [1.20] | (S)-5 [2,400] |
| Example 3 | (A)-1 [100] | (B)-1 [20.0] | (D)-2 [1.20] | (S)-1 [2,400] |
| First Positive Resist Composition | (A)-2 [100] | (B)-2 [8.0] | (D)-2 [1.20] | (S)-6 [3,200] |

The meanings of the abbreviations used in Table 3 are as shown below. The numerical values within the brackets [ ] represent blend quantities (parts by weight).

(A)-1: the aforementioned copolymer (A1-1-15).

(A)-2: a copolymer represented by chemical formula (A1'-11-1) shown below with Mw=7,000 and Mw/Mn=1.7. In the formula, the subscript numerals shown to the bottom right of the parentheses ( ) indicate the percentage (mol %) of the respective structural units within the copolymer.

[Chemical Formula 95.]

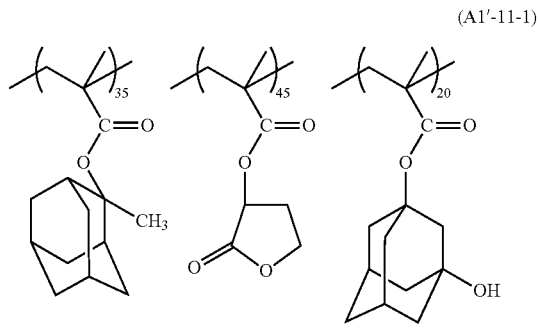

(A1'-11-1)

(B)-1: a compound represented by chemical formula (B)-1 shown below.

[Chemical Formula 96.]

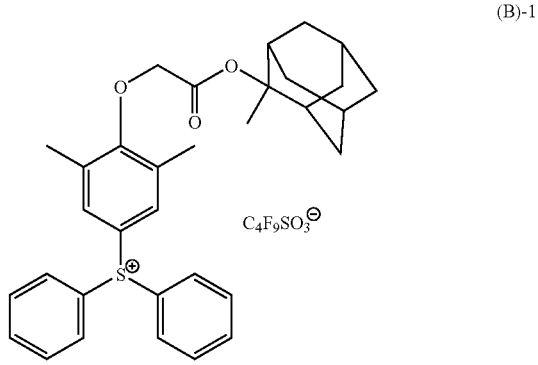

(B)-1

(B)-2: (4-methylphenyl)diphenylsulfonium nonafluoro-n-butane sulfonate.

(D)-1: triethanolamine.

(D)-2: tri-n-pentylamine.

(S)-1: 1-butoxy-2-propanol (boiling point: 170° C.).

(S)-2: isobutanol (boiling point: 108° C.).

(S)-3: 4-methyl-2-pentanol (boiling point: 132° C.).

(S)-4: a mixed solvent of 1-butoxy-2-propanol/isobutanol=5/5 (weight ratio).

(S)-5: PGME (boiling point: 120° C.).

(S)-6: a mixed solvent of PGMEA (boiling point: 146° C.)/PGME=6/4 (weight ratio).

<Preparation of Resin Component Solution>

Powder of the copolymer (A1-1-15) was dissolved in the organic solvents (S)-1 to (S)-4 and (S)-6 so as to achieve copolymer solutions with a solid content of 3.0% by weight, thereby preparing the respective resin component solutions.

<Evaluation of Storage Stability of Resin Component Solutions and Resist Compositions>

The resin component solutions and resist composition solutions were stored under the temperature conditions of refrigeration (−20° C.) and room temperature (23° C.), and storage stability was evaluated by visually observing the appearance of liquids after one day and after one week of storage. The obtained evaluation results are shown in Tables 4 and 5.

Table 4 shows evaluation results for the resin component solutions, and Table 5 shows evaluation results for the resist composition solutions, respectively.

In Tables 4 and 5, the symbol A indicates that the solutions appeared transparent and uniform after one day of storage or after one week of storage, whereas the symbol B indicates that precipitate formation was observed when the appearance of solutions were inspected after one day of storage or after one week of storage, respectively.

TABLE 4

| Copolymer | Organic Solvent | After 1 Day | | After 1 Week | |
| --- | --- | --- | --- | --- | --- |
| | | Refrigeration | Room Temperature | Refrigeration | Room Temperature |
| (A1-1-15) | (S)-1 | A | A | A | A |
| | (S)-2 | B | A | B | A |
| | (S)-3 | B | A | B | A |
| | (S)-4 | A | A | A | A |
| | (S)-6 | A | A | A | A |

From the results shown in Table 4, it was confirmed that the solution of 1-butoxy-2-propanol having a boiling point of 150° C. or higher appeared transparent and uniform in all cases under various temperature conditions, and thus the storage stability of the solution was excellent, as was observed for the mixed solvent of PGMEA and PGME.

On the other hand, although the solutions of isobutanol and 4-methyl-2-pentanol having a boiling point of less than 150° C. appeared transparent and uniform in all cases at room temperature, formation of precipitates was observed in all cases under refrigeration conditions, and thus it was confirmed that these solutions exhibited unsatisfactory storage stability.

TABLE 5

| | Organic Solvent | After 1 Day | | After 1 Week | |
| --- | --- | --- | --- | --- | --- |
| | | Refrigeration | Room Temperature | Refrigeration | Room Temperature |
| Example 1 | (S)-1 | A | A | A | A |
| Comparative Example 1 | (S)-2 | B | A | B | A |
| Comparative Example 2 | (S)-3 | B | A | B | A |
| Example 2 | (S)-4 | A | A | A | A |
| Test Example 1 | (S)-6 | A | A | A | A |

From the results shown in Table 5, it was confirmed that the positive resist composition solution of Example 1 which contained 1-butoxy-2-propanol having a boiling point of at least 150° C. appeared transparent and uniform in all cases under various temperature conditions, and thus the storage stability of the composition solution was excellent, as was observed for the positive resist composition solution of Test Example 1 which contained the mixed solvent of PGMEA and PGME.

On the other hand, although the positive resist composition solutions of Comparative Examples 1 and 2, which contained isobutanol and 4-methyl-2-pentanol having a boiling point of lower than 150° C., respectively, appeared transparent and uniform in all cases at room temperature, formation of precipitates was observed in all cases under refrigeration conditions, and thus it was confirmed that these composition solutions exhibited unsatisfactory storage stability.

<Evaluation of Resist Film Formability>

Using the positive resist compositions of Example 3 and Comparative Example 3, the resist film formability was evaluated.

Each positive resist composition solution obtained in Example 3 and Comparative Example 3 was applied onto an 8-inch silicon wafer using a spinner, and the composition was then prebaked (PAB) and dried on a hotplate at 90° C. for 60 seconds.

As a result, it was confirmed that a resist film having a film thickness of 100 nm was formed when the positive resist composition of Example 3 was used, which contained 1-butoxy-2-propanol having a boiling point of at least 150° C.

On the other hand, it was confirmed that the positive resist composition of Comparative Example 3 which contained PGME having a boiling point of lower than 150° C. was not capable of forming a resist film, resulting in a state where the resin component (A) precipitated.

<Evaluation of Lithographic Properties—(1)>

[Formation of Resist Pattern]

An organic antireflection film composition (product name: ARC-29, manufactured by Brewer Science Ltd.) was applied onto an 8-inch silicon wafer using a spinner, and the composition was then baked and dried on a hotplate at 205° C. for 60 seconds, thereby forming an organic antireflection film having a film thickness of 82 nm.

Then, each positive resist composition solution obtained in Example 1, Comparative Examples 1 and 2 and Test Example 1 was applied onto the antireflection film using a spinner (1,500 rpm), and was then prebaked (PAB) and dried on a hotplate at 90° C. for 60 seconds, thereby forming a resist film having a film thickness of 100 nm.

Subsequently, the resist film was selectively irradiated with an ArF excimer laser (193 nm) through a mask pattern, using an ArF exposure apparatus NSR-S302 (manufactured by Nikon Corporation; NA (numerical aperture)=0.60, 2/3 annular illumination).

Thereafter, a post exposure bake (PEB) treatment was conducted at 90° C. for 60 seconds, followed by development for 30 seconds at 23° C. in a 2.38% by weight aqueous solution of tetramethylammonium hydroxide (TMAH). Then, the resist film was washed for 30 seconds with pure water, followed by drying by shaking. Then the films were further heated and dried at 100° C. for 60 seconds.

[Resolution]

As a result of the above-mentioned resist pattern formation, in each of the examples, (1) a line and space pattern with a line width of 130 nm and a pitch of 260 nm; and (2) a line and space pattern with a line width of 120 nm and a pitch of 480 nm were formed on the resist film.

[Sensitivity]

The optimum exposure dose Eop (mJ/cm$^2$; the sensitivity) for formation of the aforementioned line and space pattern (1) was 21.54 (mJ/cm$^2$), 21.87 (mJ/cm$^2$), 20.58 (mJ/cm$^2$) and 21.63 (mJ/cm$^2$) for Example 1, Comparative Example 1, Comparative Example 2 and Test Example 1, respectively.

The optimum exposure dose Eop (mJ/cm$^2$; the sensitivity) for formation of the aforementioned line and space pattern (2) was 14.60 (mJ/cm$^2$), 14.82 (mJ/cm$^2$), 13.96 (mJ/cm$^2$) and 14.52 (mJ/cm$^2$) for Example 1, Comparative Example 1, Comparative Example 2 and Test Example 1, respectively.

[Coatability on a Substrate]

The coatability on a substrate was evaluated using the resist composition obtained in each Example. As a result, it was confirmed that coating irregularities and striations were suppressed when the positive resist composition of Example 1 was used, as compared to the case where the compositions of Comparative Examples 1 and 2 were used, and thus the positive resist composition of Example 1 exhibited satisfactory coatability when applied onto a substrate, which was comparable to the level of coatability achieved in Test Example 1.

[Exposure Margin and Collapse Margin]

Further, when the exposure margin and collapse margin were evaluated for the aforementioned line and space patterns (1) and (2), it was confirmed that all the positive resist compositions obtained in each Examples exhibited satisfactory results which were almost comparable to each other.

In the present Example, the exposure margin was evaluated by determining the exposure dose when forming a line and space pattern within ±10% of the target size [i.e., a line width of 130 nm in the pattern (1), and a line width of 120 nm in the pattern (2)].

The "exposure margin" is the range of the exposure dose in which a resist pattern can be formed with a size within a predetermined range of variation from a target size, when exposure is conducted by changing the exposure dose, i.e., the range of the exposure dose in which a resist pattern faithful to the mask pattern can be formed. The larger the exposure margin, the smaller the variation in the pattern size depending on the change in the exposure dose, thereby resulting in favorable improvement in the process margin.

Further, in the present Example, the exposure time of the selective exposure was gradually increased to make the exposure dose larger than the Eop in the formation of L/S patterns with a target size, and the collapse margin was evaluated by determining the exposure dose and pattern dimension (CD) at the time when pattern collapse started to occur.

The "collapse margin" describes the resistance of a resist pattern to collapse when a fine resist pattern is resolved.

<Evaluation of Dimensional Variation in the First Resist Pattern Due to Double Patterning Process—(1)>

Resist patterns were formed by the following double patterning process by using, as described above in Table 3, the first positive resist composition for forming a first resist film and the positive resist compositions obtained in Example 1 and Comparative Examples 1 and 2 for forming a second resist film, and dimensional variation in the first resist pattern was evaluated.

[Double Patterning Process—1]

First, an organic antireflection film composition (product name: ARC-29, manufactured by Brewer Science Ltd.) was applied onto an 8-inch silicon wafer using a spinner, and the composition was then baked and dried on a hotplate at 205° C. for 60 seconds, thereby forming an organic antireflection film having a thickness of 82 nm.

Then, the first resist composition solution as a positive resist composition solution for forming a first resist film was applied onto the antireflection film using a spinner, and was then prebaked (PAB) and dried on a hotplate at 110° C. for 60 seconds, thereby forming a resist film (the first resist film) having a film thickness of 100 nm.

Subsequently, the first resist film was selectively irradiated with an ArF excimer laser (193 nm) through a mask pattern (6% half tone) while changing the exposure dose among 11 points from 20.0 to 30.0 (mJ/cm$^2$) with a 1.0 mJ/cm$^2$ interval, using an ArF exposure apparatus NSR-S302 (manufactured by Nikon Corporation; NA (numerical aperture)=0.60, 2/3 annular illumination).

Thereafter, a post exposure bake (PEB) treatment was conducted at 110° C. for 60 seconds, followed by development for 30 seconds at 23° C. in a 2.38% by weight aqueous solution of tetramethylammonium hydroxide (TMAH). Then, the resist film was washed for 30 seconds with pure water, followed by drying by shaking.

In the formation of the first resist pattern, the optimum exposure dose (Eop) for formation of a line and space pattern with a line width of 120 nm and a pitch of 240 nm (hereafter, referred to as "L/S pattern (3)") was 25.0 (mJ/cm$^2$).

Then, on the substrate where the L/S pattern (3) was formed, each of the positive resist composition solutions obtained in Example 1 and Comparative Examples 1 and 2 for forming a second resist film was applied using a spinner, and was then prebaked (PAB) and dried on a hotplate at 90° C. for 60 seconds, thereby forming a positive resist film (the second resist film) having a film thickness of 100 nm.

Subsequently, an open frame exposure (exposure without a mask) was conducted on the second resist film with an ArF excimer laser (193 nm) while changing the exposure dose among 11 points from 20.0 to 30.0 (mJ/cm$^2$) with a 1.0 mJ/cm$^2$ interval, using an ArF exposure apparatus NSR-S302 (manufactured by Nikon Corporation; NA (numerical aperture)=0.60, 2/3 annular illumination).

Thereafter, a post exposure bake (PEB) treatment was conducted at 90° C. for 60 seconds, followed by development for 30 seconds at 23° C. in a 2.38% by weight aqueous solution of tetramethylammonium hydroxide (TMAH). Then, the resist film was washed for 30 seconds with pure water, followed by drying by shaking.

[Double Patterning Process—2]

Patterning was conducted in the same manner as that described above in [Double patterning process—1], apart from the following conditions:

that is, the exposure dose was changed among 7 points from 14.0 to 20.0 (mJ/cm$^2$) with a 1.0 mJ/cm$^2$ interval; a line and space pattern with a line width of 120 nm and a pitch of 480 nm was formed [optimum exposure dose (Eop): 16.0 (mJ/cm$^2$)]; and an open frame exposure (exposure without a mask) was conducted on the second resist film with an ArF excimer laser (193 nm), while changing the exposure dose among 7 points from 14.0 to 20.0 (mJ/cm$^2$) with a 1.0 mJ/cm$^2$ interval.

In the above-mentioned double patterning process, a measuring device (product name: SEM S-9220, manufactured by Hitachi, Ltd.) was used to measure a line width (a) (nm) of the first resist pattern and a line width (b) (nm) of the L/S patterns, which were formed by the application of positive resist composition solutions obtained in each Example and the patterning of resulting resist films by an open frame exposure etc. while changing the exposure dose (mJ/cm$^2$). From the above measurements, the difference between the line width (a) and line width (b) (namely, the dimensional variation (nm)) was calculated, and the average of dimensional variation values was determined to evaluate the dimensional variation in the first resist pattern. The obtained results are shown in Tables 6 and 7.

TABLE 6

[Double Patterning process-(1)]

| | | | | | | | | | | | | | |
|---|---|---|---|---|---|---|---|---|---|---|---|---|---|
| Comp. Ex. 1 | Exposure dose | 20.0 | 21.0 | 22.0 | 23.0 | 24.0 | 25.0 | 26.0 | 27.0 | 28.0 | 29.0 | 30.0 | |
| | Line width (a) | 160.0 | 155.4 | 142.8 | 135.5 | 127.0 | 122.0 | 116.0 | 109.9 | 102.9 | 96.5 | 92.6 | |
| | Line width (b) | 156.1 | 145.3 | 136.8 | 124.0 | 117.9 | 110.6 | 106.7 | 97.6 | 91.6 | 88.0 | 85.0 | Avg. |
| | Dimensional variation | 3.9 | 10.1 | 6.0 | 11.5 | 9.1 | 11.4 | 9.3 | 12.3 | 11.3 | 8.5 | 7.6 | 9.2 |
| Comp. Ex. 2 | Exposure dose | 20.0 | 21.0 | 22.0 | 23.0 | 24.0 | 25.0 | 26.0 | 27.0 | 28.0 | 29.0 | 30.0 | |
| | Line width (a) | 160.0 | 155.4 | 142.8 | 135.5 | 127.0 | 122.0 | 116.0 | 109.9 | 102.9 | 96.5 | 92.6 | |
| | Line width (b) | 158.0 | 143.2 | 131.8 | 125.9 | 116.3 | 112.1 | 106.6 | 99.9 | 94.3 | 86.2 | 83.7 | Avg. |
| | Dimensional variation | 2.0 | 12.2 | 11.0 | 9.6 | 10.7 | 9.9 | 9.4 | 10.0 | 8.6 | 10.3 | 8.9 | 9.3 |
| Ex. 1 | Exposure dose | 20.0 | 21.0 | 22.0 | 23.0 | 24.0 | 25.0 | 26.0 | 27.0 | 28.0 | 29.0 | 30.0 | |
| | Line width (a) | 160.0 | 155.4 | 142.8 | 135.5 | 127.0 | 122.0 | 116.0 | 109.9 | 102.9 | 96.5 | 92.6 | |
| | Line width (b) | 154.2 | 144.1 | 135.7 | 127.0 | 121.4 | 111.7 | 103.0 | 99.1 | 93.9 | 85.7 | 82.6 | Avg. |
| | Dimensional variation | 5.8 | 11.3 | 7.1 | 8.5 | 5.6 | 10.3 | 13.0 | 10.8 | 9.0 | 10.8 | 10.0 | 9.3 |

TABLE 7

[Double Patterning process-(2)]

| | | | | | | | | | |
|---|---|---|---|---|---|---|---|---|---|
| Comp. Ex. 1 | Exposure dose | 14.0 | 15.0 | 16.0 | 17.0 | 18.0 | 19.0 | 20.0 | |
| | Line width (a) | 155.2 | 143.8 | 126.3 | 113.1 | 96.3 | 89.9 | 78.3 | |
| | Line width (b) | 145.8 | 127.1 | 116.0 | 105.0 | 97.9 | 85.4 | 76.6 | Avg. |
| | Dimensional variation | 9.4 | 16.7 | 10.3 | 8.1 | −1.6 | 4.5 | 1.7 | 7.0 |
| Comp. Ex. 2 | Exposure dose | 14.0 | 15.0 | 16.0 | 17.0 | 18.0 | 19.0 | 20.0 | |
| | Line width (a) | 155.2 | 143.8 | 126.3 | 113.1 | 96.3 | 89.9 | 78.3 | |
| | Line width (b) | 149.9 | 137.2 | 121.0 | 104.3 | 94.0 | 83.2 | 76.0 | Avg. |
| | Dimensional variation | 5.3 | 6.6 | 5.3 | 8.8 | 2.3 | 6.7 | 2.3 | 5.3 |
| Ex. 1 | Exposure dose | 14.0 | 15.0 | 16.0 | 17.0 | 18.0 | 19.0 | 20.0 | |
| | Line width (a) | 155.2 | 143.8 | 126.3 | 113.1 | 96.3 | 89.9 | 78.3 | |
| | Line width (b) | 151.4 | 134.7 | 119.7 | 105.9 | 92.2 | 84.6 | 72.5 | Avg. |
| | Dimensional variation | 3.8 | 9.1 | 6.6 | 7.2 | 4.1 | 5.3 | 5.8 | 6.0 |

From the results shown in Tables 6 and 7, it was confirmed that by employing the method of forming a resist pattern using the positive resist composition of Example 1 according to the present invention, adverse effects on the first resist pattern during the double patterning process were minimal, which was comparable to the level achieved when using the compositions of Comparative Examples 1 and 2 which contained alcohol-based organic solvents.

Therefore, it is evident that by using the positive resist composition of the present invention for forming a second resist film, a resist pattern can be stably formed by the double patterning process without dissolving the first resist pattern formed on a substrate.

<Evaluation of Solubility of Resin Component (A) in Alcohol-Based Organic Solvent—(2)>

Evaluations of the solubility of a resin component (A) in an alcohol-based organic solvent were conducted in accordance with the evaluation method described below, using the following resin components (A) and alcohol-based organic solvents.

Resin Component (A):

Copolymers (A1-6-1), (A1-7-1), (A1-7-2), (A1-8-1), (A1-1-19) and (A1-1-20).

Alcohol-based organic solvent:

(S)-1: 1-butoxy-2-propanol (boiling point: 170° C.)

(S)-11: cyclohexane methanol (boiling point: 183° C.)

[Evaluation Method]

Evaluations were made in the same manner as that described above in <Evaluation of solubility of resin component (A) in alcohol-based organic solvent—(1)> (evaluations were made for copolymer solutions with a solid content of 5, 10, and 25% by weight).

The obtained evaluation results are shown in Table 8.

TABLE 8

| Copolymer | Organic solvent | Solid Content of Polymer (% by weight) | | |
|---|---|---|---|---|
| | | 5 | 10 | 25 |
| (A1-6-1) | (S)-1 | A | A | A |
| | (S)-11 | A | A | A |
| (A1-7-1) | (S)-1 | A | A | A |
| | (S)-11 | A | A | A |
| (A1-7-2) | (S)-1 | A | A | A |
| | (S)-11 | A | A | A |
| (A1-8-1) | (S)-1 | A | A | A |
| | (S)-11 | A | A | A |
| (A1-1-19) | (S)-1 | A | A | A |
| | (S)-11 | A | A | A |
| (A1-1-20) | (S)-1 | A | A | A |
| | (S)-11 | A | A | A |

From the results shown in Table 8, it was confirmed that solubility of the resin component (A) as a resist material was satisfactory in 1-butoxy-2-propanol and cyclohexane methanol, both of which have a boiling point of at least 150° C.

<Preparation of Positive Resist Composition Solution—(2)>

Examples 4 to 11

The components shown in Table 9 were mixed together and dissolved to obtain positive resist composition solutions.

TABLE 9

| | Component (A) | Component (B) | Component (D) | Component (S) | Sensitivity (mJ/cm$^2$) L/S = 1/1 | Sensitivity (mJ/cm$^2$) L/S = 1/3 |
|---|---|---|---|---|---|---|
| Ex. 4 | (A)-3 [100] | (B)-1 [15.0] | (D)-1 [0.35] | (S)-1 [3000] | 27.5 | 18.5 |
| Ex. 5 | (A)-4 [100] | (B)-1 [15.0] | (D)-1 [0.35] | (S)-4 [3000] | 30.5 | 20.0 |
| Ex. 6 | (A)-5 [100] | (B)-1 [15.0] | (D)-1 [0.35] | (S)-1 [3000] | 18.5 | 12.5 |
| Ex. 7 | (A)-7 [100] | (B)-1 [20.0] | (D)-2 [1.6] | (S)-1 [3000] | 29.0 | 17.0 |
| Ex. 8 | (A)-6 [100] | (B)-1 [15.0] | (D)-2 [1.6] | (S)-1 [3000] | 27.5 | 17.0 |
| Ex. 9 | (A)-8 [100] | (B)-1 [15.0] | (D)-2 [1.6] | (S)-1 [3000] | 29.0 | 17.0 |
| Ex. 10 | (A)-1 [100] | (B)-1 [15.0] | (D)-2 [15.0] | (S)-7 [3000] | 21.5 | 15.5 |
| Ex. 11 | (A)-1 [100] | (B)-1 [15.0] | (D)-2 [15.0] | (S)-8 [3000] | 18.5 | 12.5 |

The meanings of the abbreviations used in Table 9 are as shown below. The numerical values within the brackets [ ] represent blend quantities (parts by weight).

(A)-1: the aforementioned copolymer (A1-1-15).
(A)-3: the aforementioned copolymer (A1-6-1).
(A)-4: the aforementioned copolymer (A1-7-1).
(A)-5: the aforementioned copolymer (A1-7-2).
(A)-6: the aforementioned copolymer (A1-8-1).
(A)-7: the aforementioned copolymer (A1-1-19).
(A)-8: the aforementioned copolymer (A1-1-20).
(B)-1: the compound represented by the above-mentioned chemical formula (B)-1.
(D)-1: triethanolamine.
(D)-2: tri-n-pentylamine.
(S)-1: 1-butoxy-2-propanol (boiling point: 170° C.).
(S)-4: a mixed solvent of 1-butoxy-2-propanol/isobutanol=5/5 (weight ratio).
(S)-7: a mixed solvent of 1-butoxy-2-propanol/isobutanol=1/9 (weight ratio).
(S)-8: a mixed solvent of cyclohexane methanol/isobutanol=1/9 (weight ratio).

<Evaluation of Lithographic Properties—(2)>

[Formation of Resist Pattern]

Resist patterns were formed and evaluated, using the above-mentioned positive resist composition solutions of Test Example 1 and Examples 4 to 11, in the same manner as that described above in the section [Formation of resist pattern] in <Evaluation of lithographic properties—(1)>.

[Resolution and Sensitivity]

As a result of the above-mentioned resist pattern formation, in each of the examples, (3) a line and space pattern with a line width of 120 nm and a pitch of 240 nm (L/S=1/1); and (4) a line and space pattern with a line width of 120 nm and a pitch of 480 nm (L/S=1/3) were formed on the resist film. The sensitivity values (mJ/cm$^2$) during formation of the above line and space patterns are shown in Table 9.

[Coatability on a Substrate]

The coatability on a substrate was evaluated using the resist composition obtained in each Example. As a result, it was confirmed that the positive resist compositions of Examples 4 to 11 exhibited satisfactory coatability when applied onto a substrate, as was the case for the positive resist composition of Test Example 1.

[Exposure Margin and Collapse Margin]

Further, when the exposure margin and collapse margin were evaluated for the aforementioned line and space patterns (3) and (4), it was confirmed that all the positive resist compositions obtained in Examples 4 to 11 exhibited satisfactory results, as was the case for the positive resist composition of Test Example 1.

In the present Example, the exposure margin was evaluated by determining the exposure dose when forming a line and space pattern within ±10% of the target size [i.e., a line width of 120 nm in the patterns (3) and (4)].

The collapse margin was evaluated, in the same manner as the method described above for evaluating collapse margin, by determining the exposure dose and pattern dimension (CD) at the time when pattern collapse started to occur.

<Evaluation of Dimensional Variation in the First Resist Pattern Due to Double Patterning Process—(2)>

Resist patterns were formed by the double patterning process by using the first positive resist composition (described above in Table 3) for forming a first resist film and the positive resist compositions obtained in Examples 4 to 11 for forming a second resist film, and dimensional variation in the first resist pattern was evaluated in the same manner as that described above in <Evaluation of dimensional variation in the first resist pattern due to double patterning process—(1)>.

As a result, it was confirmed that when the positive resist compositions of Examples 4 to 11 were used, adverse effects on the first resist pattern during the double patterning process were minimal, which was comparable to the level achieved when using the positive resist composition of Example 1.

Therefore, it is evident that by using the positive resist composition of the present invention for forming a second resist film, a resist pattern can be stably formed by the double patterning process without dissolving the first resist pattern formed on a substrate.

<Preparation of Positive Resist Composition Solution—(3)>

Example 12

The components shown in Table 10 were mixed together and dissolved to obtain positive resist composition solutions.

TABLE 10

|  | Component (A) | Component (B) | Component (D) | Component (E) | Component (F) | Component (S) |
|---|---|---|---|---|---|---|
| Example 12 | (A)-9 [100] | (B)-1 [15.0] | (D)-2 [1.60] | (E)-1 [3.0] | (F)-1 [5.0] | (S)-1 [2400] |

The meanings of the abbreviations used in Table 10 are as shown below. The numerical values within the brackets [ ] represent blend quantities (parts by weight).

(A)-9: the aforementioned copolymer (A1-1-23).
(B)-1: the compound represented by the above-mentioned chemical formula (B)-1.
(D)-2: tri-n-pentylamine.
(E)-1: salicylic acid.
(F)-1: the aforementioned fluorine-containing resin (F1-1-11).
(S)-1: 1-butoxy-2-propanol (boiling point: 170° C.).

<Crossline Patterning by Double Patterning Process—(1)>

As shown in FIG. 1, after forming a first L/S pattern 1 substantially in parallel to the X-axis using the first positive resist composition, a second resist film was formed by applying the positive resist composition of Example 12 onto the substrate where the first L/S pattern 1 was formed, and the second resist film was then subjected to exposure and alkali developing so as to form an L/S pattern 2 substantially in parallel to the Y-axis which is orthogonal to the first L/S pattern 1, thereby ultimately forming a hole pattern. More specifically, the crossline patterning process was conducted as follows.

[Formation of First L/S Pattern]

First, an organic antireflection film composition (product name: ARC-29, manufactured by Brewer Science Ltd.) was applied onto a 12-inch silicon wafer using a spinner, and the composition was then baked and dried on a hotplate at 205° C. for 60 seconds, thereby forming an organic antireflection film having a thickness of 95 nm.

Then, the first positive resist composition solution as a positive resist composition solution for forming a first resist film was applied onto the organic antireflection film using a spinner, and was then prebaked (PAB) and dried on a hotplate at 120° C. for 60 seconds, thereby forming a resist film (the first resist film) having a film thickness of 90 nm.

Subsequently, a coating solution for forming a protection film (product name: TILC-035; manufactured by Tokyo Ohka Kogyo Co., Ltd.) was applied onto the resist film using a spinner, and then heated at 90° C. for 60 seconds, thereby forming a top coat with a film thickness of 35 nm.

Then, the first resist film was selectively irradiated with an ArF excimer laser (193 nm) through a mask pattern, using an ArF exposure apparatus NSR-609B (manufactured by Nikon Corporation, NA (numerical aperture)=1.07, Dipole-X).

Thereafter, a post exposure bake (PEB) treatment was conducted at 110° C. for 60 seconds, followed by development for 20 seconds at 23° C. in a 2.38% by weight aqueous solution of tetramethylammonium hydroxide (TMAH).

As a result, a line and space pattern (a first L/S pattern) having a line width of 55 nm and a pitch of 110 nm was formed on the resist film. The sensitivity (Eop) was 18 mJ/cm$^2$.

[Crossline Patterning Process]

Next, the positive resist composition of Example 12 was applied onto the first L/S pattern formed as described above, and was then prebaked (PAB) and dried on a hotplate at 120° C. for 60 seconds, thereby forming a resist film having a film thickness of 90 nm.

Subsequently, the resist film was selectively irradiated with an ArF excimer laser (193 nm) through a mask pattern, using an ArF immersion exposure apparatus NSR-S609B (manufactured by Nikon Corporation, NA (numerical aperture)=1.07, Dipole-X). Direction of the L/S pattern of the mask was orthogonal to that of the first L/S pattern, and latent image of the L/S pattern formed on the second resist film was an L/S pattern having a line width of 55 nm and a pitch of 110 nm. The sensitivity (Eop) was 28 mJ/cm$^2$.

Thereafter, a post exposure bake (PEB) treatment was conducted at 90° C. for 60 seconds, followed by development for 20 seconds at 23° C. in a 2.38% by weight aqueous solution of tetramethylammonium hydroxide (TMAH).

Figure 2:
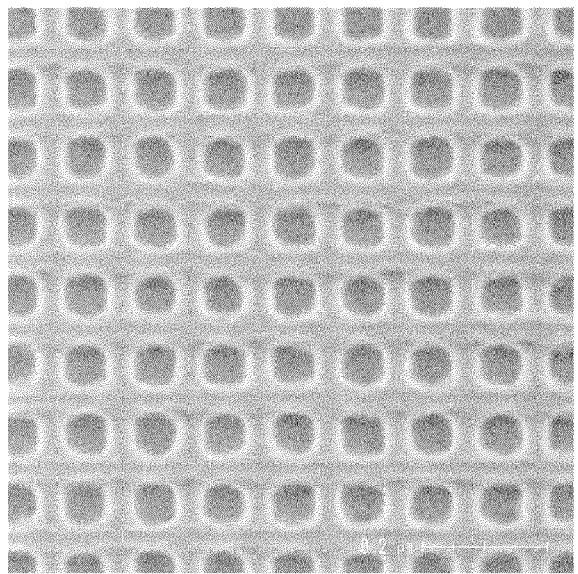
FIG. 2 is a photograph showing an image of a contact hole pattern formed by a crossline patterning process.

As a result, a contact hole pattern having a hole diameter of 65 nm and a pitch of 110 nm was formed on the second resist film. As shown in FIG. 2, the obtained contact hole pattern film exhibited satisfactory uniformity in terms of the shape of the holes. In the photograph shown in FIG. 2, the horizontal direction corresponds to the direction in which an L/S pattern was formed using the first positive resist composition, whereas the vertical direction corresponds to the direction in which a latent image of an L/S pattern was formed using the second positive resist composition.

As a result of the above-mentioned crossline patterning process, it was confirmed that by using the positive resist composition of Example 12 according to the present invention, even without conducting a freezing treatment after the formation of the first resist pattern, a resist pattern having an excellent shape with fine dimensions can be formed without adversely affecting the first resist pattern.

<Preparation of Positive Resist Composition Solution—(4)>

Examples 13 and 14

The components shown in Table 11 were mixed together and dissolved to obtain positive resist composition solutions.

TABLE 11

|  | | Component (A) | Component (B) | Component (B) | Component (D) | Component (E) | Component (F) | Component (S) |
|---|---|---|---|---|---|---|---|---|
| First Resist Composition (a) | | (A)-2 [100] | (B)-3 [8.0] | — | (D)-2 [0.40] | (E)-1 [0.22] | — | (S)-6 [3000] |
| First Resist Composition (b) | | (A)-2 [100] | (B)-4 [10.0] | (B)-5 [1.0] | (D)-2 [1.0] | (E)-1 [1.82] | — | (S)-6 [3000] |
| Second Resist Composition | Example 13 | (A)-10 [100] | (B)-1 [15.0] | — | (D)-2 [1.60] | (E)-1 [3.00] | (F)-1 [5.0] | (S)-1 [2400] |
| | Example 14 | (A)-10 [100] | (B)-1 [5.0] | (B)-6 [10.5] | (D)-2 [1.60] | (E)-1 [3.00] | (F)-1 [5.0] | (S)-1 [2400] |

The meanings of the abbreviations used in Table 11 are as shown below. The numerical values within the brackets [ ] represent blend quantities (parts by weight).

(A)-2: the copolymer represented by the aforementioned chemical formula (A1'-11-1) with Mw=7,000 and Mw/Mn=1.7.

(A)-10: the aforementioned copolymer (A1-1-21).

(B)-1: the compound represented by the above-mentioned chemical formula (B)-1.

(B)-3: (4-methylphenyl)diphenylsulfonium nonafluoro-n-propane sulfonate.

(B)-4: a compound represented by chemical formula (B)-4 shown below.

(B)-5: a compound represented by chemical formula (B)-5 shown below.

[Chemical Formula 97.]

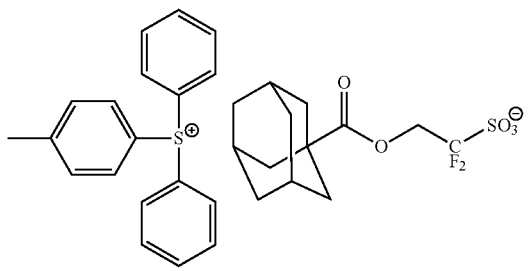

(B)-4

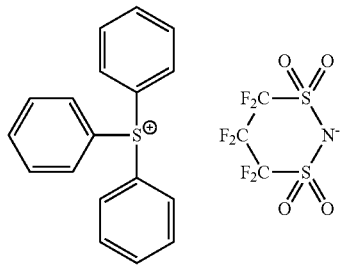

(B)-5

(B)-6: a compound represented by chemical formula (B)-6 shown below.

The compound was synthesized by the method of synthesizing acid-generator component (B) described later.

[Chemical Formula 98.]

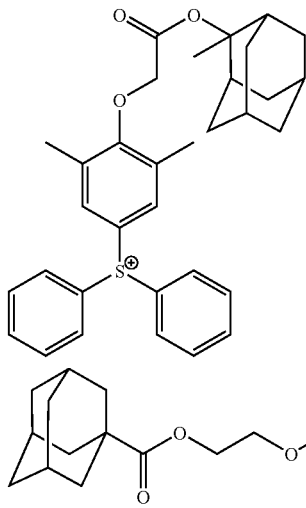

(B)-6

(D)-2: tri-n-pentylamine.

(E)-1: salicylic acid.

(F)-1: the aforementioned fluorine-containing resin (F1-1-11).

(S)-1: 1-butoxy-2-propanol (boiling point: 70° C.).

(S)-6: a mixed solvent of PGMEA (boiling point: 146° C.)/PGME=6/4 (weight ratio).

<Synthesis of Acid-Generator Component (B)>

Synthesis Example 1

4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction liquid was filtered, and 20 g of hexane was added to the residue and stirred. Thereafter, the resultant was filtered, and the residue was dried, thereby obtaining 1.41 g of a compound (III) (yield: 43.1%).

[Chemical Formula 99.]

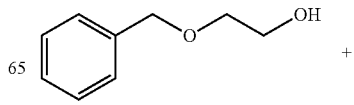

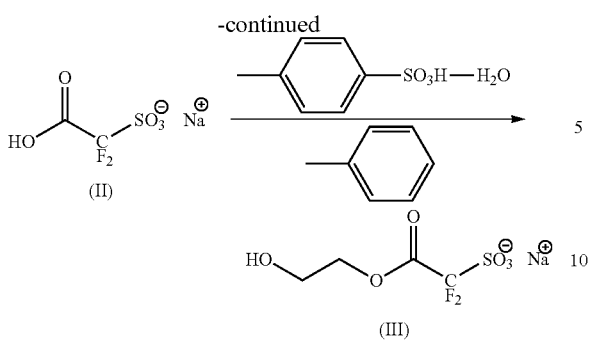

$^1$H-NMR (DMSO-d6, 400 MHz): δ (ppm)=4.74-4.83 (t, 1H, OH), 4.18-4.22 (t, 2H, H$^a$), 3.59-3.64 (q, 2H, H$^b$)

$^{19}$F-NMR (DMSO-d6, 376 MHz): δ (ppm)=−106.6.

From the results shown above, it was confirmed that the compound (III) had a structure shown below.

[Chemical Formula 100]

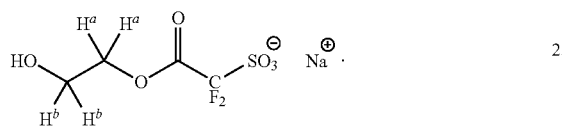

Synthesis Example 2

1.00 g of the compound (III) and 3.00 g of acetonitrile were prepared, and 0.82 g of 1-adamantanecarbonyl chloride and 0.397 g of triethylamine were dropwise added thereto upon cooling in ice. Following completion of the dropwise addition, the resultant was stirred at room temperature for 20 hours and was then filtered. The obtained filtrate was concentrated and solidified, and was then dissolved in 30 g of dichloromethane, followed by washing with water three times. Thereafter, the resulting organic layer was concentrated and dried, thereby obtaining 0.82 g of a compound (IV) (yield: 41%).

[Chemical Formula 101.]

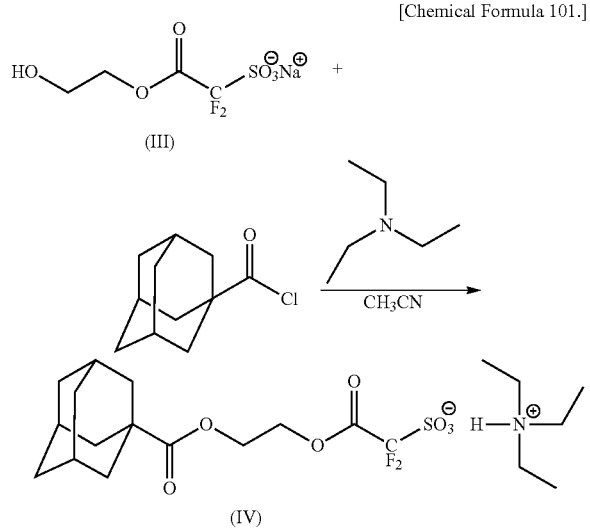

The obtained compound (IV) was analyzed by NMR.

$^1$H-NMR (DMSO-d6, 400 MHz): δ (ppm)=8.81 (s, 1H, H$^c$), 4.37-4.44 (t, 2H, H$^d$), 4.17-4.26 (t, 2H, H$^e$), 3.03-3.15 (q, 6H, H$^b$), 1.61-1.98 (m, 15H, Adamantane), 1.10-1.24 (t, 9H, H$^a$).

$^{19}$F-NMR (DMSO-d6, 376 MHz): δ (ppm)=−106.61.

From the results shown above, it was confirmed that the compound (IV) had a structure shown below.

[Chemical Formula 102]

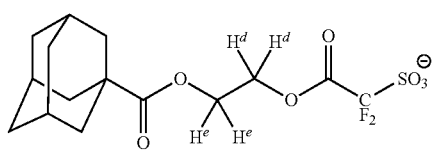

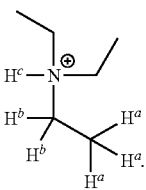

Synthesis Example 3

Synthesis of Compound (B)-6

To 60.75 g of methanesulfonic acid controlled to 20° C. or lower was added 8.53 g of phosphorus oxide, 8.81 g of 2,5-dimethylphenol and 12.2 g of diphenylsulfoxide in small amounts. The resultant was matured for 30 minutes while maintaining the temperature at 15 to 20° C., followed by elevating the temperature to 40° C. and maturing for 2 hours. Then, the reaction liquid was dropwise added to 109.35 g of pure water cooled to 15° C. or lower. Thereafter, 54.68 g of dichloromethane was added and stirred, and the dichloromethane layer was collected.

386.86 g of hexane at a temperature of 20 to 25° C. was added to a separate vessel, and the dichloromethane layer was dropwise added thereto. Then, the resultant was matured at 20 to 25° C. for 30 minutes, followed by filtration, thereby obtaining 17.14 g of an objective compound (VI) (yield: 70.9%).

The obtained compound (VI) was analyzed by NMR.

$^1$H-NMR (DMSO-d6, 600 MHz): δ (ppm)=7.61-7.72 (m, 10H, phenyl), 7.14 (s, 2H, H$^c$), 3.12 (s, 3H, H$^b$), 2.22 (s, 6H, H$^a$).

From the results shown above, it was confirmed that the compound (VI) had a structure shown below.

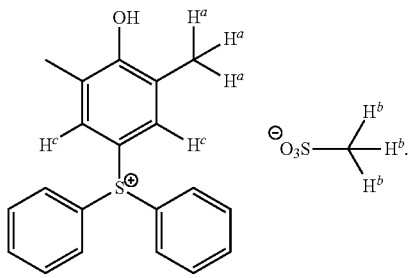

[Chemical Formula 103]

4 g of the compound (VI) was dissolved in 79.8 g of dichloromethane. After confirming that the compound (VI) had dissolved in dichloromethane, 6.87 g of potassium carbonate was added thereto, and 3.42 g of bromoacetic acid methyl adamantane was further added. A reaction was effected under reflux for 24 hours, followed by filtration, washing with water, and crystallization with hexane. The resulting powder was dried under reduced pressure, thereby obtaining 3.98 g of an objective compound (VII) (yield: 66%).

The obtained compound (VII) was analyzed by NMR.

$^1$H-NMR (CDCl$_3$, 400 MHz): δ (ppm)=7.83-7.86 (m, 4H, Phenyl), 7.69-7.78 (m, 6H, Phenyl), 7.51 (s, 2H, H$^d$), 4.46 (s, 2H, H$^c$), 2.39 (s, 6H, H$^a$), 2.33 (s, 2H, Adamantane), 2.17 (s, 2H, Adamantane), 1.71-1.98 (m, 11H, Adamantane), 1.68 (s, 3H, H$^b$), 1.57-1.61 (m, 2H, Adamantane).

From the results shown above, it was confirmed that the compound (VII) had a structure shown below.

[Chemical Formula 104]

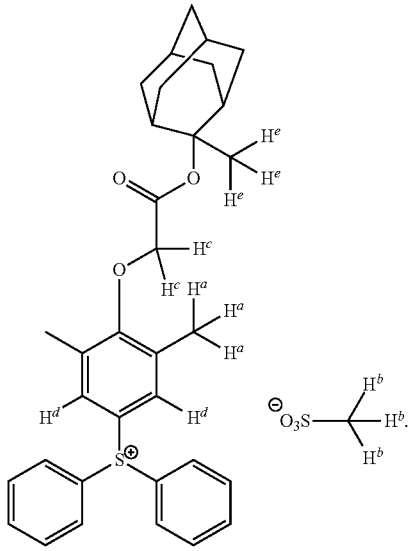

4.77 g of the compound (VII) was dissolved in 23.83 g of dichloromethane and 23.83 g of pure water, and 3.22 g of the compound (IV) was then added to the resulting solution. The resultant was stirred for 1 hour, and was then subjected to liquid separation to collect an organic layer. The obtained organic layer was washed three times with 3.84 g of water. Thereafter, the resulting organic layer was concentrated and solidified, thereby obtaining 4.98 g of a compound (B)-6 (yield: 87%).

[Chemical Formula 105.]

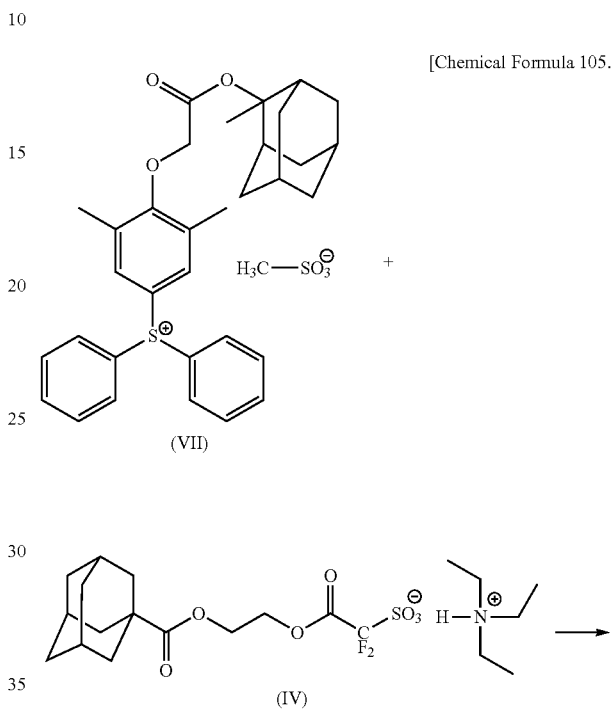

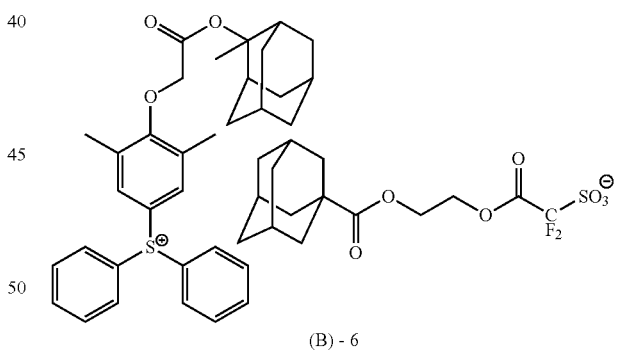

(B) - 6

The obtained compound (B)-6 was analyzed by NMR.

$^1$H-NMR (DMSO-d6, 400 MHz): δ (ppm)=7.76-7.88 (m, 10H, Phenyl), 7.62 (s, 2H, Phenyl), 4.64 (s, 2H, H$^b$), 4.43-4.44 (t, 2H, H$^e$), 4.22-4.23 (t, 2H, H$^d$), 1.51-2.36 (m, 38H, Adamantane+H$^a$+H$^c$).

$^{19}$F-NMR (DMSO-d6, 376 MHz): δ (ppm)=−106.7.

From the results shown above, it was confirmed that the compound (B)-6 had a structure shown below.

[Chemical Formula 106]

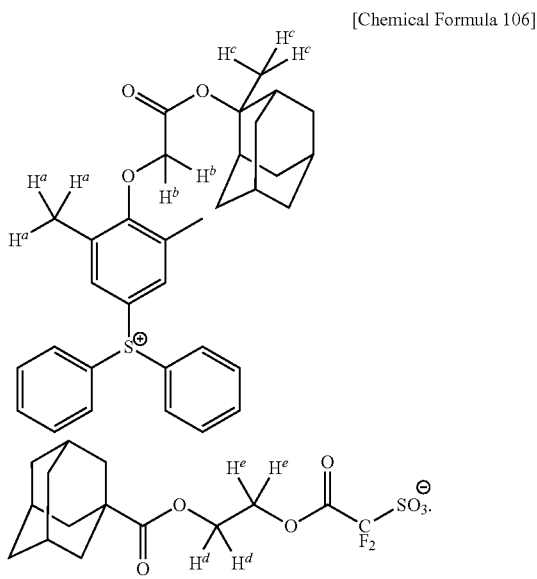

<Crossline Patterning by Double Patterning Process—(2)>

A crossline patterning process was conducted as follows by combining the first resist composition and the second resist composition.

Combination of a first resist composition (a) and the second resist composition of Example 13

Combination of a first resist composition (a) and the second resist composition of Example 14

Combination of a first resist composition (b) and the second resist composition of Example 13

Combination of a first resist composition (b) and the second resist composition of Example 14

As shown in FIG. 1, after forming a first L/S pattern 1 substantially in parallel to the X-axis using the first positive resist composition (a) or (b), a second resist film was formed by applying the second resist composition obtained in Example 13 or Example 14 onto the substrate where the first L/S pattern 1 was formed, and the second resist film was then subjected to exposure and alkali developing so as to form an L/S pattern 2 substantially in parallel to the Y-axis which is orthogonal to the first L/S pattern 1, thereby ultimately forming a hole-like (or lattice-like) resist pattern. More specifically, the crossline patterning process was conducted as follows.

[Formation of First L/S Pattern]

First, an organic antireflection film composition (product name: ARC29SR, manufactured by Brewer Science Ltd.) was applied onto an 8-inch silicon wafer using a spinner, and the composition was then baked and dried on a hotplate at 205° C. for 60 seconds, thereby forming an organic antireflection film having a thickness of 95 nm.

Then, the first positive resist composition (a) or (b) as a first resist composition was applied onto the organic antireflection film using a spinner, and was then prebaked (PAB) and dried on a hotplate at 120° C. for 60 seconds, thereby forming resist films (the first resist films) having the respective film thicknesses shown in Table 12.

Subsequently, the first resist film was selectively irradiated with an ArF excimer laser (193 nm) through a mask pattern, using an immersion exposure apparatus XT1900Gi (manufactured by ASML, NA (numerical aperture)=1.35, Dipole40X, sigma 0.98/0.81).

Thereafter, a post exposure bake (PEB) treatment was conducted at 110° C. for 60 seconds, followed by development for 10 seconds at 23° C. in a 2.38% by weight aqueous solution of tetramethylammonium hydroxide (TMAH).

As a result, a line and space pattern (a first L/S pattern) having a line width of 40 nm and a pitch of 80 nm as a target size was formed on the resist film. The sensitivity values (Eop (1)) during this step are shown in Table 12.

[Crossline Patterning Process]

Then, the resist composition obtained in Example 13 or Example 14 as a second resist composition was applied onto the first L/S pattern formed as described above, and was then prebaked (PAB) and dried on a hotplate at 130° C. for 60 seconds, thereby forming resist films having the respective film thicknesses shown in Table 12.

Subsequently, the resist film was selectively irradiated with an ArF excimer laser (193 nm) through a mask pattern, using an immersion exposure apparatus XT1900Gi (manufactured by ASML, NA (numerical aperture)=1.35, Dipole40X, sigma 0.98/0.81). Direction of the L/S pattern of the mask was orthogonal to that of the first L/S pattern, and a latent image of the L/S pattern formed on the second resist film was an L/S pattern having a line width of 40 nm and a pitch of 80 nm. The sensitivity values (Eop (2)) during this step are shown in Table 12.

Thereafter, a post exposure bake (PEB) treatment was conducted at 90° C. for 60 seconds, followed by development for 10 seconds at 23° C. in a 2.38% by weight aqueous solution of tetramethylammonium hydroxide (TMAH).

As a result, a hole-like resist pattern was formed.

Figure 3:
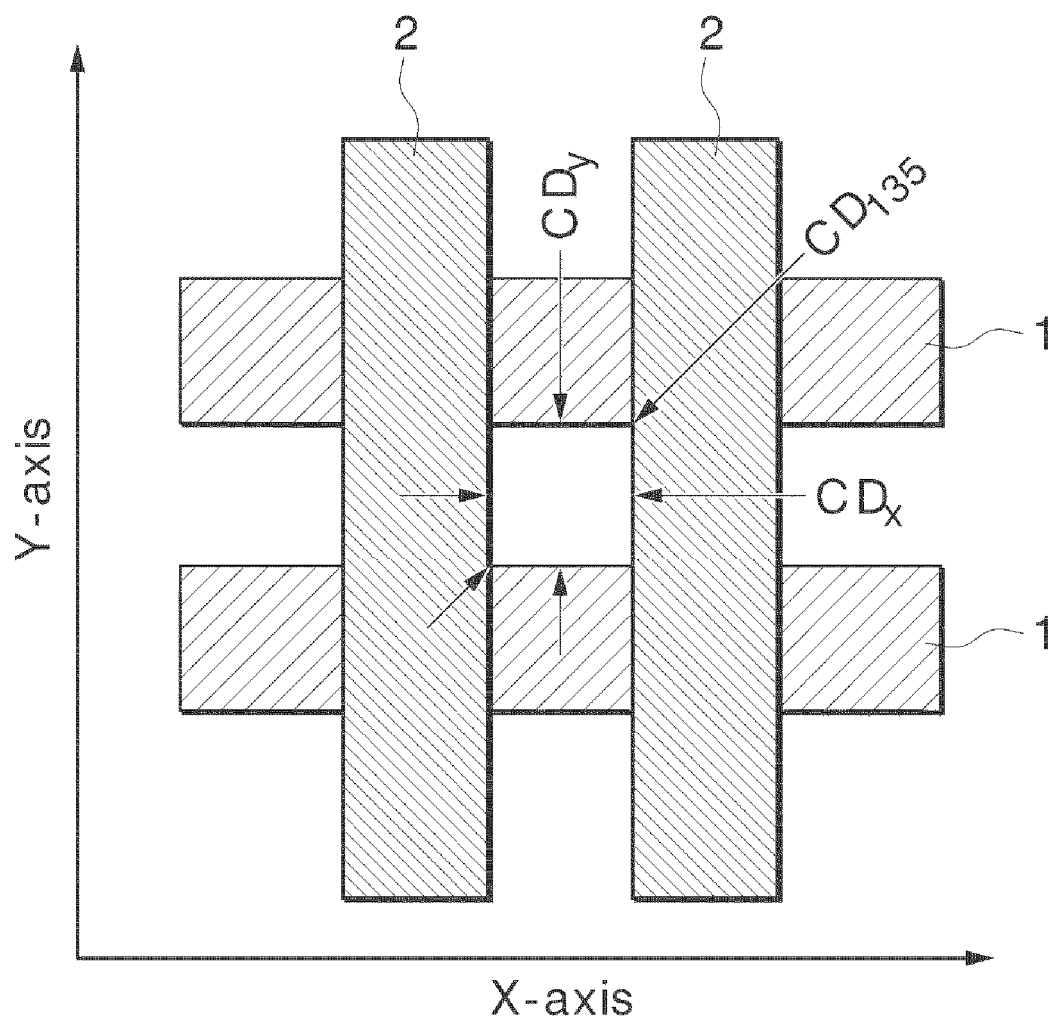
FIG. 3 is a schematic diagram showing the dimensions of a hole portion in the resist pattern, formed by a crossline patterning process, in the X-axis direction ($CD_x$) and the Y-axis direction ($CD_y$), and the length of a diagonal line ($CD_{135}$).

FIG. 3 is a schematic diagram showing the dimensions of a hole portion in the resist pattern, which is formed by a crossline patterning process, in the X-axis direction ($CD_x$) and the Y-axis direction ($CD_y$), and the length of a diagonal line ($CD_{135}$).

With respect to the hole portion in the formed resist pattern, dimensions in the X-axis direction ($CD_x$) and in the Y-axis direction ($CD_y$), and the length of a diagonal line ($CD_{135}$) shown in FIG. 3 were measured using a scanning electron microscope (product name: S 9380, manufactured by Hitachi, Ltd.). The results are shown in Table 12.

TABLE 12

| First Resist Composition | Second Resist Composition | Film Thickness (nm) | | Sensitivity (mJ/cm$^2$) | | | | Average of $CD_y$ and $CD_x$ | $CD_{135}$ (nm) |
| | | First Resist | Second Resist | Eop (1) | Eop (2) | $CD_y$ (nm) | $CD_x$ (nm) | | |
|---|---|---|---|---|---|---|---|---|---|
| (a) | Example 13 | 85 | 80 | 20 | 24 | 42.2 | 38.9 | 40.55 | 40.6 |
| (a) | Example 14 | 85 | 80 | 19 | 28 | 39.6 | 38.2 | 38.9 | 40.1 |
| (b) | Example 13 | 80 | 80 | 14 | 23 | 41.1 | 38.3 | 39.7 | 40.0 |
| (b) | Example 14 | 80 | 80 | 14 | 29 | 39.0 | 38.3 | 38.65 | 40.2 |

From the results shown in Table 12, it was confirmed that by using any of the above combinations of resist compositions, a hole-like resist pattern can be formed satisfactorily with a high level of resolution and minute dimensions.

Further, when the resist composition of Example 14 containing an acid-generator component having an anion moiety that included a bulky substituent (namely, the compound represented by the aforementioned formula (B)-6), was used as the second resist composition, it was confirmed that a "$CD_{135}$ value relative to the average of $CD_x$ and $CD_y$" was large, as compared to the case where the resist composition of Example 13 was used, which did not contain the compound represented by the aforementioned formula (B)-6. From the above results, when using the resist composition of Example 14, it is evident that more rectangular-shaped holes were formed, as compared to the case where the resist composition of Example 13 was used. Because it is thought that this is a result of resolution faithful to irradiated light, it can be concluded that the resist composition of Example 14 exhibits a higher level of resolution as compared to the resist composition of Example 13. It is assumed that such effects can be achieved because an acid-generator component having an anion moiety that includes a bulky substituent has a short diffusion length.

Furthermore, when the resist composition of Example 14 was used as the second resist composition, it was confirmed that a "$CD_{135}$ value relative to the average of $CD_x$ and $CD_y$" was larger when the first resist composition (b) containing an acid-generator component having an anion moiety that included a bulky substituent was used as the first resist composition, as compared to the case where the first resist composition (a) was used, which did not contain an acid-generator component having an anion moiety that included a bulky substituent. From these results, it was confirmed that an even higher level of resolution can be achieved when an acid-generator component having an anion moiety that included a bulky substituent was used in both of the first and second resist compositions.

<Synthesis of Resin Component (A):—No. 2>

Copolymers (A1-1-24) to (A1-1-26) and (A1-9-1) used in the following evaluations were synthesized by using the aforementioned monomers (1), (4), (6) and (8) and a monomer (11) obtained in the following synthesis example.

[Synthesis Example of Monomer (11)]

18.50 g of a compound (11-1) was dissolved in 150 ml of tetrahydrofuran, and 18.55 g of triethylamine was added thereto, followed by stirring for 5 minutes. Then, 40 g of a compound (11-2) and 1.79 g of 4-dimethylaminopyridine were added to the resultant and stirred at room temperature for 16 hours. After the completion of the reaction, the reaction mixture was concentrated under reduced pressure, and extraction was conducted with a water/heptane mixed solvent, a hydrochloric acid aqueous solution/heptane mixed solvent, and a water/heptane mixed solvent in this order. The resulting heptane solution was concentrated under reduced pressure, thereby obtaining 30.81 g of a monomer (11) as an objective compound (yield: 93%).

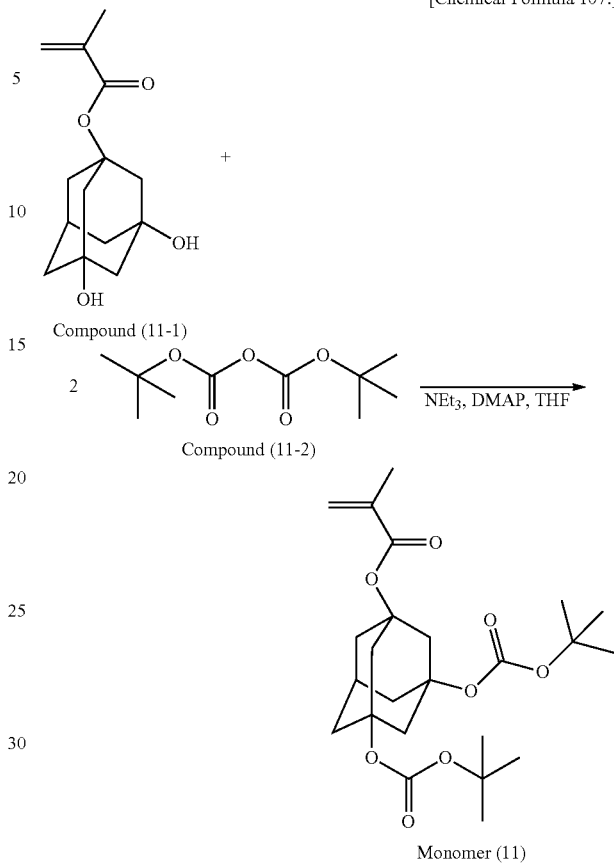

[Chemical Formula 107.]

The results of instrumental analysis of the obtained compound were as follows.

$^1$H-NMR (solvent: DMSO, 400 MHz, internal standard: tetramethylsilane): δ(ppm)=5.98 (s, 1H, Ha), 5.63 (s, 1H, Ha), 2.51-1.88 (m, 13H, Hb), 1.84 (s, 3H, Hc), 1.40 (s, 18H, Hd).

From the results shown above, it was confirmed that the obtained monomer (11) had a structure shown below

[Chemical Formula 108.]

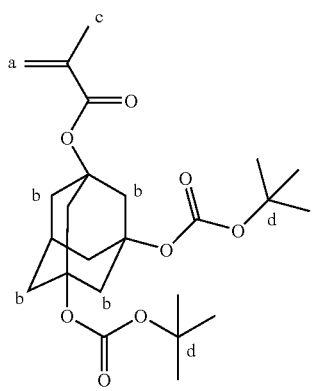

Monomer (11)

[Synthesis Example of Copolymer (A1-9-1)]

12.00 g (79.59 mmol) of a monomer (4), 31.26 g (125.94 mmol) of a monomer (1), 7.25 g (30.72 mmol) of a monomer (6) and 12.08 g (26.66 mmol) of a monomer (11) were placed in a three-necked flask equipped with a thermometer and a refulx tube and were dissolved by adding 111.94 g of PGMEA thereto. Then, 17.3 mmol of dimethyl 2,2'-azobis (isobutyrate) (product name: V-601) as a polymerization initiator was added and dissolved in the resulting solution.

Subsequently, the obtained solution was dropwise added to 64.17 g of PGMEA heated to 80° C. over 6 hours in a nitrogen atmosphere. Then, the reaction mixture was heated while stirring for 1 hour, and then cooled to room temperature. The resulting polymer solution was dropwise added to an excess amount of a methanol/water mixed solvent to precipitate a polymer. Then, the precipitated polymer was separated by filtration, followed by washing with a methanol/water nixed solvent and methanol in this order and drying, thereby obtaining 40 g of a copolymer (A1-9-1) as an objective compound.

With respect to the copolymer (A1-9-1), the weight average molecular weight (Mw) and the dispersity (Mw/Mn) were determined by the polystyrene equivalent value as measured by gel permeation chromatography (GPC). As a result, it was found that the weight average molecular weight was 8,400, and the dispersity was 1.66.

Further, the copolymer (A1-9-1) was analyzed by carbon 13 nuclear magnetic resonance spectroscopy (600 MHz, $^{13}$C-NMR) to determine the composition of the copolymer (ratio 1/m (molar ratio) of the respective structural units within the structural formula). As a result, it was found that the composition of the copolymer was 1/m/n/o=38.5/33.6/14.5/13.4 (molar ratio).

[Synthesis Example of Copolymers (A1-1-24) to (A1-1-26)]

Copolymers (A1-1-24) to (A1-1-26) were synthesized in substantially the same manner as in the above method for synthesizing the copolymer (A1-1-11), except that monomers for deriving the structural units of the respective copolymers were used in a predetermined molar ratio.

The weight average molecular weight (Mw) and dispersity (Mw/Mn) of the copolymers obtained in the above-mentioned synthesis examples were determined by the polystyrene equivalent value as measured by gel permeation chromatography (GPC). Further, the compositional ratio indicating the percentage (mol %) of structural units derived from the respective monomers within the copolymers was determined by carbon NMR.

The compositional ratio indicating the percentage (mol %) of structural units derived from the respective monomers within the copolymers, and weight average molecular weight (Mw) and dispersity (Mw/Mn) of the copolymers are shown in Table 13.

[Chemical Formula 109.]

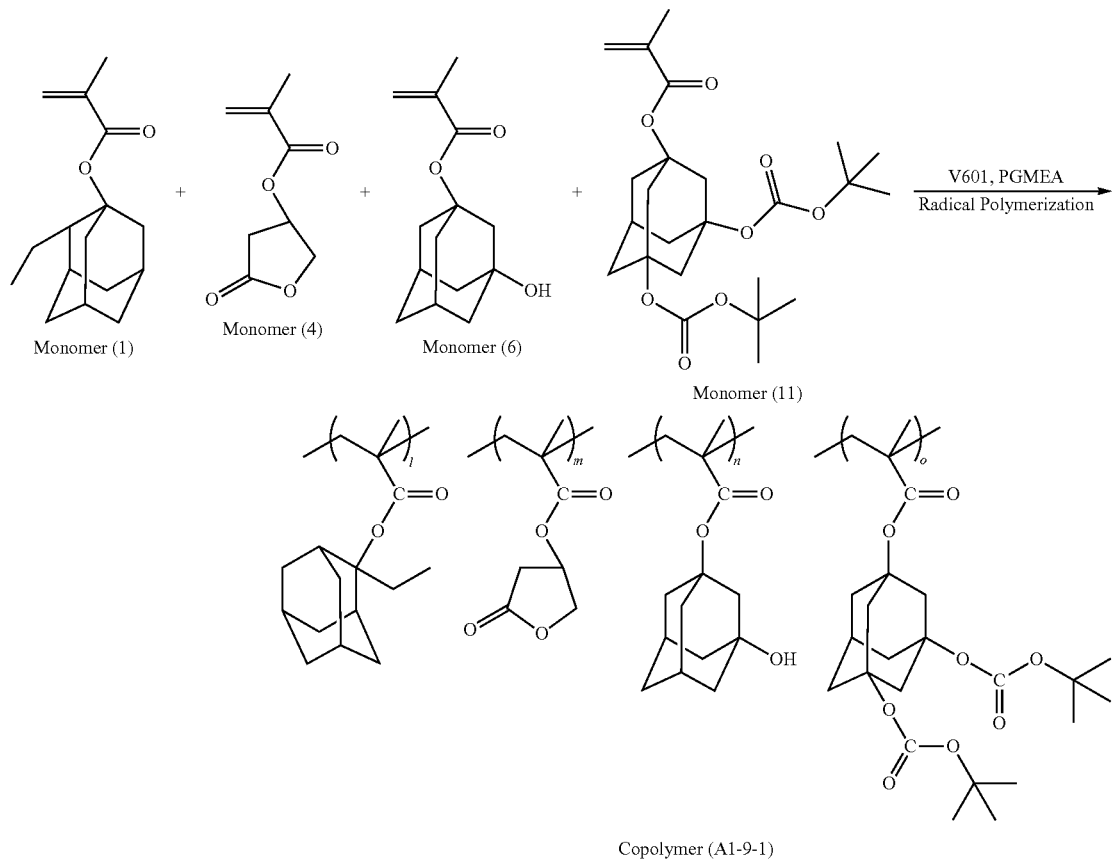

Copolymer (A1-9-1)

TABLE 13

| Copolymer | Percentage of structural units derived from the respective monomers (mol %) | | | | Mw | Mw/Mn |
|---|---|---|---|---|---|---|
| | (1) | (4) | (6) | (8) | | |
| (A1-1-24) | 45 | 30 | 15 | 10 | 7000 | 1.65 |
| (A1-1-25) | 35 | 35 | 15 | 15 | 7000 | 1.65 |
| (A1-1-26) | 40 | 35 | 15 | 10 | 7000 | 1.65 |

[Chemical Formula 110.]

(A1-1-24) ~ (A1-1-26)

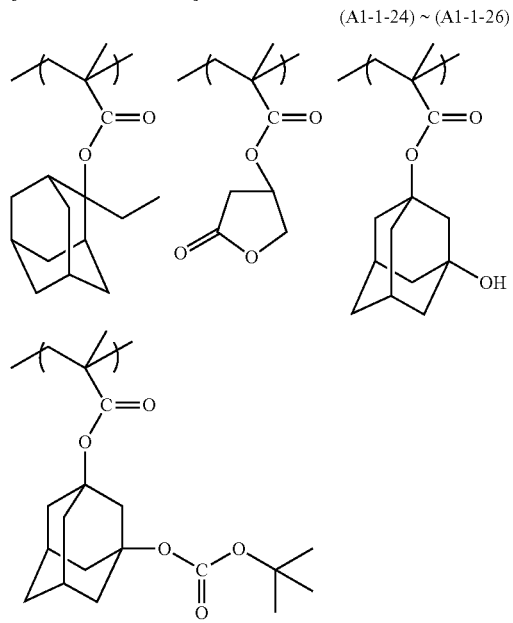

TABLE 14

| Copolymer | Organic solvent | Solid Content of Copolymer (% by weight) | | |
|---|---|---|---|---|
| | | 5 | 10 | 25 |
| (A1-9-1) | (S)-9 | A | A | A |
| (A1-1-24) | (S)-9 | A | A | B |
| (A1-1-25) | (S)-9 | A | A | B |
| (A1-1-26) | (S)-9 | A | B | B |

From the results shown above, it was confirmed that the copolymer (A1-9-1) in particular exhibited excellent solubility in an organic solvent containing 1-butoxy-2-propanol which has a boiling point of 150° C. or higher.

The reason for the results above is presumed as follows. The copolymer (A1-9-1) and the copolymer (A1-1-26) have almost the same compositional ratio and have the same structural units, except that the copolymer (A1-9-1) has a structural unit derived from the monomer (11), whereas the copolymer (A1-1-26) has a structural unit derived from the monomer (8). Therefore, it is presumed that the excellent solubility of the copolymer (A1-9-1) in a solvent is due to the structural unit derived from the monomer (11).

<Preparation of Positive Resist Composition Solution—(5)>

Examples 15 to 17

The components shown in Table 15 were mixed together and dissolved to obtain positive resist composition solutions.

TABLE 15

| | Component (A) | Component (B) | | | Component (E) | Component (S) | Sensitivity (5) | Sensitivity (6) | Collapse margin |
|---|---|---|---|---|---|---|---|---|---|
| Ex. 15 | (A)-11 [100] | (B)-7 [14.0] | (B)-2 [2.0] | (B)-8 [3.5] | (E)-1 [1.0] | (S)-9 [2400] | 24.0 | 15.0 | 50% |
| Ex. 16 | (A)-12 [100] | (B)-7 [14.0] | (B)-2 [2.0] | (B)-8 [3.5] | (E)-1 [1.0] | (S)-9 [2400] | 23.0 | 15.0 | 44% |
| Ex. 17 | (A)-13 [100] | (B)-7 [14.0] | (B)-2 [2.0] | (B)-8 [3.5] | (E)-1 [1.0] | (S)-9 [2400] | 25.0 | 16.0 | 45% |

Sensitivity (mJ/cm$^2$)

<Evaluation of Solubility of Resin Component (A) in Alcohol-Based Organic Solvent—(3)>

Evaluations of the solubility of a resin component (A) in an alcohol-based organic solvent were conducted in accordance with the evaluation method described below, using the following resin components (A) and alcohol-based organic solvents.

Resin component (A):
Copolymers (A1-1-24) to (A1-1-26) and (A1-9-1).
Alcohol-based organic solvent:
(S)-9: 1-butoxy-2-propanol/PGMEA=9/1 (weight ratio)
[Evaluation Method]
Evaluations were made in the same manner as that described above in <Evaluation of solubility of resin component (A) in alcohol-based organic solvent—(1)> (evaluations were made for copolymer solutions with a solid content of 5, 10, and 25% by weight).

The obtained evaluation results are shown in Table 14.

The meanings of the abbreviations used in Table 15 are as shown below. The numerical values within the brackets [ ] represent blend quantities (parts by weight).

(A)-11: the aforementioned copolymer (A1-1-25)

(A)-12: the aforementioned copolymer (A1-1-26)

(A)-13: the aforementioned copolymer (A1-9-1)

(B)-2: (4-methylphenyl)diphenylsulfonium nonafluorobutanesulfonate (B)-7: a compound represented by chemical formula (B)-7 shown below, which was synthesized by a method described below in the synthesis example of acid generator component (B)

[Chemical Formula 111.]

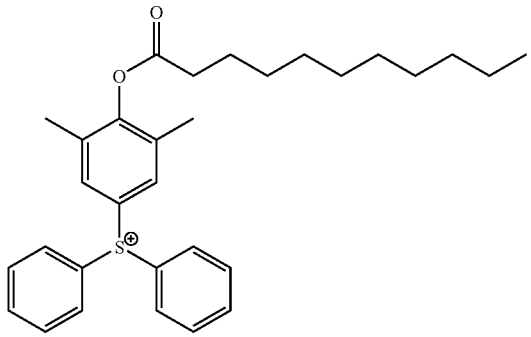

(B)-7

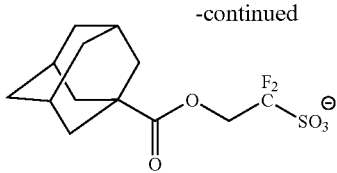

(B)-8: triphenylsulfonium d-camphor-10-sulfonate
(E)-1: salicylic acid (S)-9: a mixed solvent of 1-butoxy-2-propanol/PGMEA=9/1 (weight ratio)

<Synthesis of Acid Generator Component (B): Synthesis of Compound (B)-7>

(i) Synthesis of Compound (VIII)

28.98 g of the aforementioned compound (VI), 289.80 g of dichloromethane and 9.47 g of triethylamine were mixed together and cooled to 10° C. while stirring. Then, 17.69 g of undecylic acid chloride was dropwise added thereto, and the temperature of the resultant was elevated to room temperature, followed by stirring for 1 hour. Thereafter, the reaction mixture was washed twice with 109.36 g of a saturated sodium bromide aqueous solution and four times with 109.36 g of pure water, followed by concentrating the organic phase, thereby obtaining 38 g of a compound (VIII).

[Chemical Formula 112.]

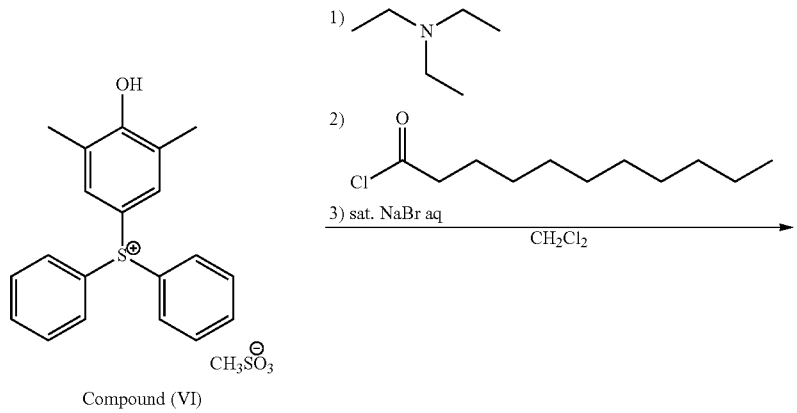

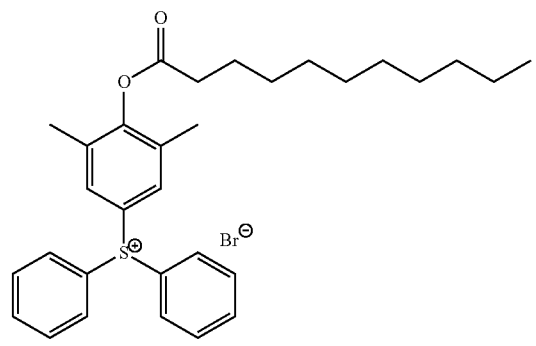

Compound (VIII)

The obtained compound (VIII) was analyzed by NMR.
$^1$H-NMR(DMSO-d6, 400 MHz):δ(ppm)=7.79-7.93 (m, 12H, Ar), 2.73 (t, 2H, —CO—CH$_2$—), 2.19 (s, 6H, Ar—CH$_3$), 1.65-1.72 (m, 2H, —CH$_2$—), 1.25-1.38 (m, 14H, —CH$_2$—), 0.85 (t, 3H, —CH$_3$)

From the results, it was confirmed that the compound (VIII) had a structure shown above.

(ii) Synthesis of Compound (B)-7

2 g of the compound (VIII) was added to 20 g of dichloromethane and 20 g of water, followed by stirring. Then, 1.76 g of a compound (IX) was added thereto, followed by stirring for 1 hour. The reaction mixture was subjected to liquid separation, and the resultant was washed four times with 20 g of water. The organic solvent phase was concentrated and solidified, thereby obtaining 2.40 g of a compound (B)-7.

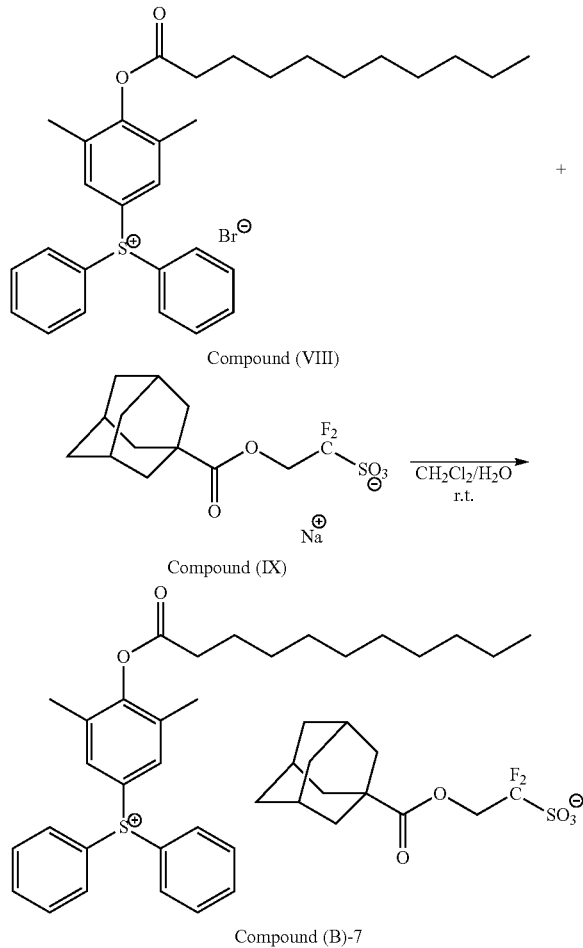

Compound (VIII)

Compound (IX)

Compound (B)-7

The obtained compound (B)-7 was analyzed by NMR.

$^1$H-NMR(DMSO-d6, 400 MHz):δ(ppm)=7.79-7.93 (m, 12H, Ar), 4.55 (t, 2H, CF$_2$CH$_2$), 2.73 (t, 2H, —CO—CH$_2$—), 2.19 (s, 6H, Ar—CH$_3$), 1.94 (m, 3H, Ad), 1.82 (m, 6H, Ad), 1.64-1.72 (m, 8H, Ad, —CH$_2$—), 1.25-1.38 (m, 14H, —CH$_2$—), 0.85 (t, 3H, —CH$_3$)

$^{19}$F-NMR(DMSO-d6, 376 MHz): δ(ppm)=−111.2

From the results, it was confirmed that the compound (B)-7 had a structure shown above.

<Evaluation of Lithographic Properties—(3)>

[Formation of Resist Pattern]

Resist patterns were formed and evaluated, using the above-mentioned positive resist composition solutions of Examples 15 to 17, in the same manner as that described above in the section [Formation of resist pattern] in <Evaluation of lithographic properties—(1)>.

[Resolution and Sensitivity]

As a result of the above-mentioned resist pattern formation, in each of the examples, (5) an L/S pattern with a line width of 120 nm and a pitch of 240 nm (L/S=1/1); and (6) an L/S pattern with a line width of 120 nm and a pitch of 480 nm (L/S=1/3) were formed on the resist film. The sensitivity values (5) and (6) (mJ/cm$^2$) during formation of the above line and space patterns are shown in Table 15.

[Collapse Margin]

With respect to the L/S pattern (5), collapse margin was evaluated. The results are shown in Table 15.

In the evaluation of the collapse margin, an L/S pattern was formed in the same manner as described above, except that the exposure dose was changed, and the line width of the pattern just before collapsing was measured. The change in size was calculated as the percentage of the "line width of the pattern just before collapsing", based on the "target line width (i.e., 120 nm)". The smaller this value is, the more resistant is the resist pattern to a pattern collapse.

<Preparation of Positive Resist Composition Solution—(6)>

Examples 18 to 20

The components shown in Table 16 were mixed together and dissolved to obtain positive resist composition solutions.

TABLE 16

| | | Component (A) | Component (B) | | | Component (D) | Component (E) | Component (F) | Component (S) |
|---|---|---|---|---|---|---|---|---|---|
| First resist composition (C) | | (A)-2 [100] | (B)-9 [3.0] | (B)-4 [5.0] | (B)-8 [1.2] | (D)-2 [0.15] | (E)-1 [0.40] | — | (S)-10 [3025] |
| Second resist composition | Ex. 18 | (A)-10 [100] | (B)-1 [15.0] | — | — | (D)-2 [1.60] | (E)-1 [3.00] | (F)-1 [5.0] | (S)-9 [2400] |
| | Ex. 19 | (A)-11 [100] | (B)-7 [14.0] | (B)-2 [2.0] | (B)-8 [3.5] | — | (E)-1 [1.00] | (F)-1 [5.0] | (S)-9 [2400] |
| | Ex. 20 | (A)-13 [100] | (B)-7 [14.0] | (B)-2 [2.0] | (B)-8 [3.5] | — | (E)-1 [1.00] | (F)-1 [5.0] | (S)-9 [2400] |

The meanings of the abbreviations used in Table 16 are as shown below. The numerical values within the brackets [ ] represent blend quantities (parts by weight).

(A)-2: a copolymer represented by the aforementioned chemical formula (A1'-11-1) having a molecular weight (Mw) of 7,000 and a dispersity (Mw/Mn) of 1.7

(A)-10: the aforementioned copolymer (A1-1-21)

(A)-11: the aforementioned copolymer (A1-1-25)

(A)-13: the aforementioned copolymer (A1-9-1)

(B)-1: a compound represented by the aforementioned chemical formula (B)-1

(B)-2: (4-methylphenyl)diphenylsulfonium nonafluorobutanesulfonate (B)-4: a compound represented by the aforementioned chemical formula (B)-4

(B)-7: a compound represented by the aforementioned chemical formula (B)-7

(B)-8: triphenylsulfonium d-camphor-10-sulfonate (B)-9: a compound represented by chemical formula (B)-9 shown below

[Chemical Formula 114.]

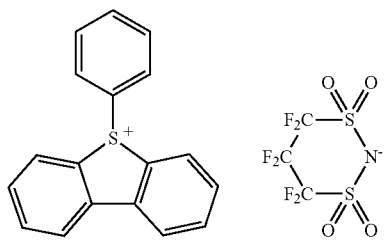

(B)-9

(D)-2: tri-n-pentylamine.

(E)-1: salicylic acid.

(F)-1: the aforementioned fluorine-containing resin (F1-1-11).

(S)-9: a mixed solvent of 1-butoxy-2-propanol/PGMEA=9/1 (weight ratio)

(S)-10: a mixed solvent of PGMEA/PGME/γ-butyrolactone=1800/1200/25 (weight ratio)

<Crossline Patterning by Double Patterning Process—(3)>

A crossline patterning process was conducted in the same manner as in the <Crossline patterning by double patterning process—(1)> by combining the first resist composition and the second resist composition.

Combination of a first resist composition (c) and the second resist composition of Example 18

Combination of a first resist composition (c) and the second resist composition of Example 19

Combination of a first resist composition (c) and the second resist composition of Example 20

[Formation of First L/S Pattern]

First, an organic antireflection film composition (product name: ARC29, manufactured by Brewer Science Ltd.) was applied onto a 12-inch silicon wafer using a spinner, and the composition was then baked and dried on a hotplate at 205° C. for 60 seconds, thereby forming an organic antireflection film having a thickness of 95 nm.

Then, the first positive resist composition (c) was applied onto the organic antireflection film using a spinner, and was then prebaked (PAB) and dried on a hotplate at 120° C. for 60 seconds, thereby forming resist films (the first resist films) having the film thickness shown in Table 17.

Subsequently, a coating solution for forming a protection film (product name: TILC-035; manufactured by Tokyo Ohka Kogyo Co., Ltd.) was applied onto the resist film using a spinner, and then heated at 90° C. for 60 seconds, thereby forming a top coat with a film thickness of 35 nm.

Then, the resist film was selectively irradiated with an ArF excimer laser (193 nm) through a mask pattern, using an ArF exposure apparatus NSR-609B (manufactured by Nikon Corporation, NA (numerical aperture)=1.07, Dipole-X).

Thereafter, a post exposure bake (PEB) treatment was conducted at 110° C. for 60 seconds, followed by development for 20 seconds at 23° C. in a 2.38% by weight aqueous solution of tetramethylammonium hydroxide (TMAH).

As a result, a line and space pattern (a first L/S pattern) having a line width of 55 nm and a pitch of 110 nm as a target size was formed on the resist film. The sensitivity values (Eop (7)) during this step are shown in Table 17.

[Crossline Patterning Process]

Then, each of the positive resist compositions of Examples 18 to 20 was applied onto the first L/S pattern formed as described above, and was then prebaked (PAB) and dried on a hotplate at 120° C. for 60 seconds, thereby forming a resist film (second resist film) having a film thickness indicated in Table 17.

Subsequently, the resist film was selectively irradiated with an ArF excimer laser (193 nm) through a mask pattern, using an ArF immersion exposure apparatus NSR-S609B (manufactured by Nikon Corporation, NA (numerical aperture)= 1.07, Dipole-X). Direction of the L/S pattern of the mask was orthogonal to that of the first L/S pattern, and a latent image of the L/S pattern formed on the second resist film was an L/S pattern having a line width of 55 nm and a pitch of 110 nm. The sensitivity values (Eop (8)) during this step are shown in Table 17.

Thereafter, a post exposure bake (PEB) treatment was conducted at 90° C. for 60 seconds, followed by development for 20 seconds at 23° C. in a 2.38% by weight aqueous solution of tetramethylammonium hydroxide (TMAH). As a result, a hole-like resist pattern was formed.

With respect to the hole portion of the resist pattern formed, dimensions in the X-axis direction ($CD_x$) and in the Y-axis direction ($CD_y$), and the length of a diagonal line ($CD_{135}$) were measured in the same manner as in the <Crossline patterning by double patterning process—(2)> using a scanning electron microscope (product name: S 9380, manufactured by Hitachi, Ltd.). The results are shown in Table 17.

TABLE 17

| First Resist Composition | Second Resist Composition | Film Thickness (nm) | | Sensitivity (mJ/cm²) | | $CD_y$ (nm) | $CD_x$ (nm) | Average of $CD_y$ and $CD_x$ | $CD_{135}$ (nm) |
|---|---|---|---|---|---|---|---|---|---|
| | | First Resist | Second Resist | Eop (7) | Eop (8) | | | | |
| (c) | Example 18 | 100 | 80 | 16 | 24 | 56.3 | 57.4 | 56.85 | 65.0 |
| (c) | Example 19 | 100 | 80 | 16 | 16 | 54.2 | 54.6 | 54.40 | 67.0 |
| (c) | Example 20 | 100 | 80 | 16 | 15 | 56.6 | 59.1 | 57.85 | 73.1 |

From the results shown in Table 17, it was confirmed that by using any of the above combinations of resist compositions, a hole-like resist pattern can be formed satisfactorily with a high level of resolution and minute dimensions.

Further, when the resist compositions of Examples 19 and 20 containing an acid-generator component having an anion moiety that included a bulky substituent (namely, the compound represented by the aforementioned formula (B)-7), was used as the second resist composition, it was confirmed that a "$CD_{135}$ value relative to the average of $CD_x$ and $CD_y$" was large, as compared to the case where the resist composition of Example 18 was used, which did not contain the compound represented by the aforementioned formula (B)-7.

From the above results, as in the case of the <Crossline patterning by double patterning process—(2)>, the resist composition of Examples 19 and 20 exhibit higher resolution than the resist composition of Example 18.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A positive resist composition comprising:
a base component (A) which exhibits increased solubility in an alkali developing solution under the action of acid; and
an acid-generator component (B) which generates acid upon exposure; dissolved in an organic solvent (S),
said base component (A) comprising a resin component (A1) which exhibits increased solubility in an alkali developing solution under the action of acid,
said resin component (A1) comprising a structural unit (a1) derived from an acrylate ester containing an acid dissociable, dissolution inhibiting group, and said organic solvent (S) comprising an alcohol-based organic solvent having a boiling point of at least 150° C., wherein
said alcohol-based organic solvent is at least one solvent selected from the group consisting of propylene glycol, 1-butoxy-2-propanol, n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol 2-(2-butoxyethoxy)ethanol and an alcohol-based organic solvent having a ring structure.

2. The positive resist composition according to claim 1 which is used for forming a second resist film in a method of forming a positive resist pattern,
the method comprising:
applying a positive resist composition to a substrate to form a first resist film on the substrate;
subjecting the first resist film to selective exposure and alkali developing to form a first resist pattern;
applying a positive resist composition on the substrate on which the first resist pattern is formed to form a second resist film; and
subjecting the second resist film to selective exposure and alkali developing to form a resist pattern.

3. The positive resist composition according to claim 1, wherein said resin component (A1) further comprises a structural unit (a2) derived from an acrylate ester containing a lactone-containing cyclic group.

4. The positive resist composition according to claim 3, wherein the amount of said structural unit (a2) within said resin component (A1), based on the combined total of all structural units constituting said resin component (A1) is within a range from 1 to 30 mol %.

5. The positive resist composition according to claim 1, wherein said resin component (A1) further comprises a structural unit (a0-1) represented by general formula (a0-1) shown below:

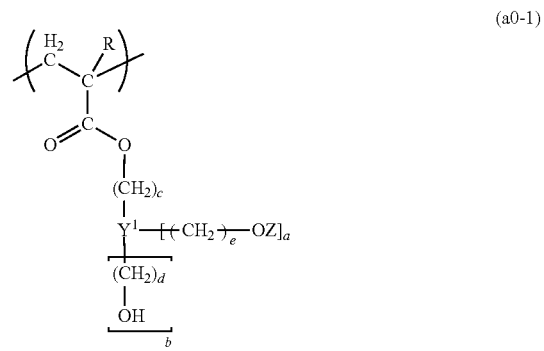

(a0-1)

wherein R represents a hydrogen atom, a lower alkyl group of 1 to 5 carbon atoms or a halogenated lower alkyl group of 1 to 5 carbon atoms; $Y^1$ represents an aliphatic cyclic group; Z represents a tertiary alkyl group-containing group or an alkoxyalkyl group; a represents an integer of 1 to 3, and b represents an integer of 0 to 2, with the provision that a+b=1 to 3; and each of c, d and e independently represents an integer of 0 to 3.

6. The positive resist composition according to claim 1, wherein said resin component (A1) further comprises a structural unit (a0-2) represented by general formula (a0-2) shown below:

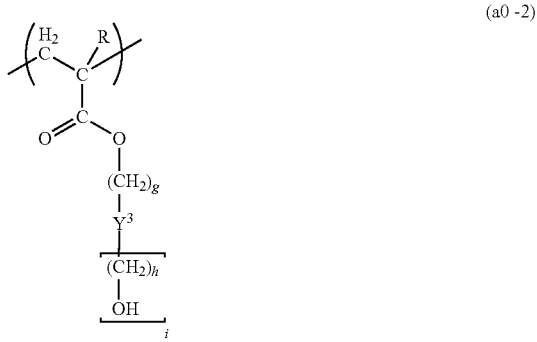

(a0-2)

wherein R represents a hydrogen atom, a lower alkyl group of 1 to 5 carbon atoms or a halogenated lower alkyl group of 1 to 5 carbon atoms; $Y^3$ represents an alkylene group or an aliphatic cyclic group; each of g and h independently represents an integer of 0 to 3; and i represents an integer of 1 to 3.

7. The positive resist composition according to claim 1, which further comprises a nitrogen-containing organic compound (D).

8. A method of forming a resist pattern comprising:
applying a positive resist composition on a substrate to form a first resist film on the substrate;
subjecting the first resist film to selective exposure and alkali developing to form a first resist pattern;
applying the positive resist composition of claim 1 on the substrate on which the first resist pattern is formed to form a second resist film; and
subjecting the second resist film to selective exposure and alkali developing to form a resist pattern.

9. The method of forming a resist pattern according to claim 8, the method comprising:
applying a positive resist composition on a substrate to form a first resist film on the substrate;
subjecting the first resist film to selective exposure and alkali developing to form a first line and space resist pattern;
applying the positive resist composition of any one of claim 1, 2, 4, 5, 6, 7 or 8 on the substrate on which the first line and space resist pattern is formed to form a second resist film; and
subjecting the second resist film to selective exposure and alkali developing so as to form a resist pattern that intersects with the first line and space resist pattern.

* * * * *

UNITED STATES PATENT AND TRADEMARK OFFICE
CERTIFICATE OF CORRECTION

PATENT NO. : 8,338,075 B2
APPLICATION NO. : 12/534735
DATED : December 25, 2012
INVENTOR(S) : Masaru Takeshita et al.

It is certified that error appears in the above-identified patent and that said Letters Patent is hereby corrected as shown below:

In the Specification

At Column 14, Line 44, Change "Y the" to --Y, the--.

At Column 57, Line 52 (Approx.), Change "1 to6." to --1 to 6.--.

At Column 61, Line 35 (Approx.), Change "(hereafter" to --(hereafter,--.

At Column 62, Lines 6-11 (Approx.),

Change " 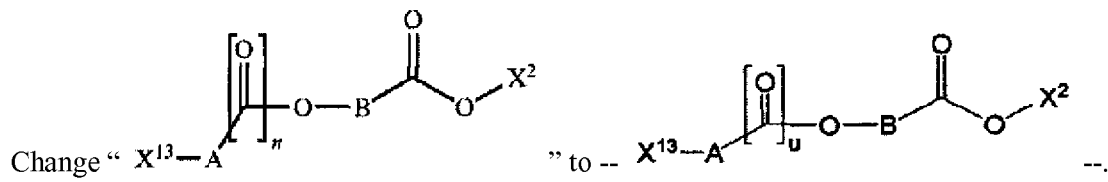 --.

At Column 73, Line 58, Change "mono cycloalkane" to --monocycloalkane--.

At Column 75, Line 55, Change "mono cycloalkane" to --monocycloalkane--.

At Column 80, Line 29 (Approx.), Change "rectangulart" to --rectangularity--.

At Column 81, Line 11 (Approx.), Change "adamantane" to --adamantane,--.

At Column 82, Line 5, Change "2-norbonyl" to --2-norbornyl--.

At Column 82, Line 6, Change "3-norbonyl" to --3-norbornyl--.

At Column 82, Line 24, Change "3-acrylolyloxy" to --3-acryloyloxy--.

At Column 95, Line 42, Change "triphenyl sulfonium," to --triphenylsulfonium,--.

Signed and Sealed this
Twenty-seventh Day of August, 2013

Teresa Stanek Rea
*Acting Director of the United States Patent and Trademark Office*

CERTIFICATE OF CORRECTION (continued)
U.S. Pat. No. 8,338,075 B2

At Column 95, Line 43, Change "diphenyl sulfonium," to --diphenylsulfonium,--.

At Column 95, Lines 55-56, Change "(4-methoxphenyl)" to --(4-methoxyphenyl)--.

At Column 104, Line 50, Change "above," to --above;--.

At Column 104, Line 51, Change "represent" to --represents--.

At Column 104, Line 64, Change "$CF_2$—." to --$CF_2$—,--.

At Column 106, Lines 46-51 (Approx.), Change

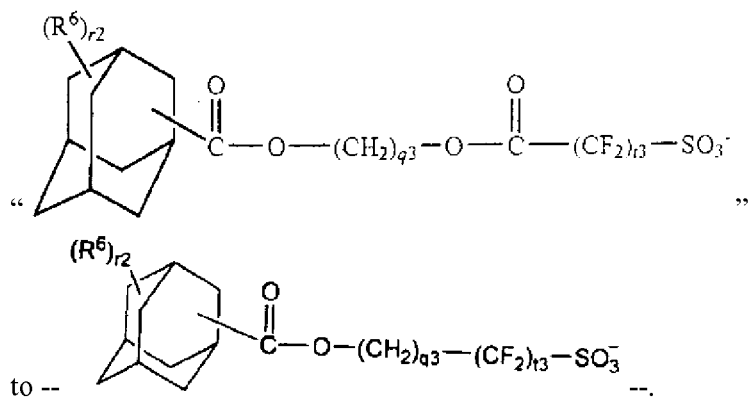

" " to -- -- .

At Column 108, Line 32, Change "1-adamantanecarboxylix" to --1-adamantanecarboxylic--.

At Column 114, Lines 1-6 (Approx.), Change "

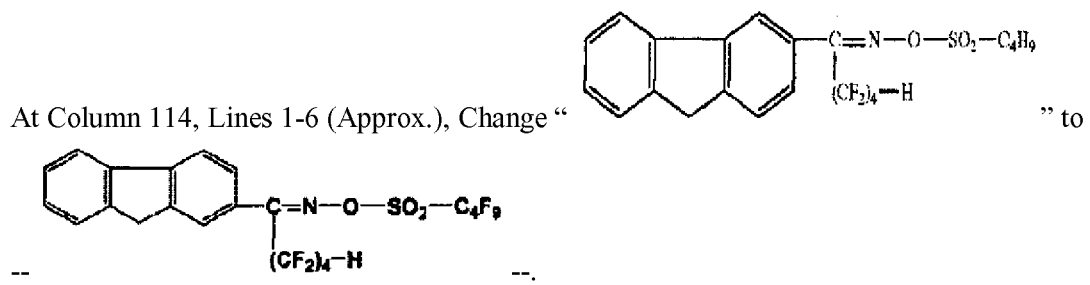

" to -- --.

At Column 114, Lines 12-13, Change "diazo methane." to --diazomethane.--.

At Column 115, Line 56, Change "(CM," to --(CM;--.

At Column 120, Line 2, Change "(F)")" to --(E)")--.

At Column 121, Line 5, Change "group," to --group;--.

At Column 123, Line 2, Change "group" to --group,--.

At Column 124, Line 52, Change "of7" to --of 7--.

CERTIFICATE OF CORRECTION (continued)
U.S. Pat. No. 8,338,075 B2

At Column 132, Line 58, Change "1 or2." to --1 or 2.--.

At Column 132, Line 61, Change "1 or2." to --1 or 2.--.

At Column 136, Lines 5-25 (Approx.), Change

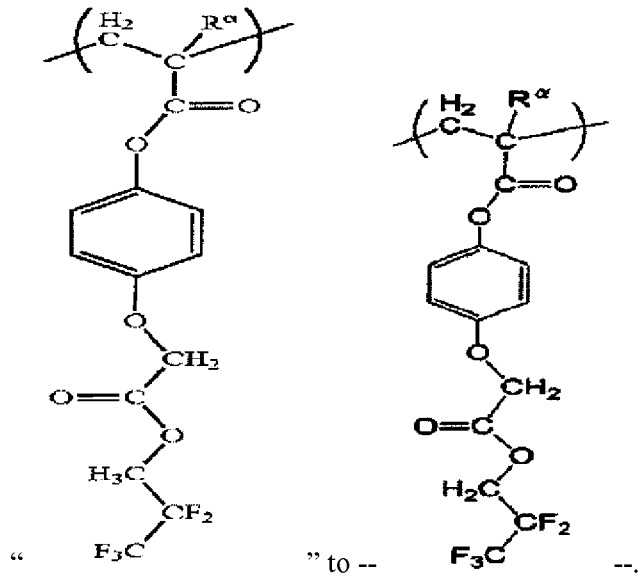

" to -- --.

At Column 143, Line 23, Change "at" to --as--.

At Column 143, Line 60, Change "words" to --words,--.

At Column 145, Line 40, Change "(A1)")," to --(A1')"),--.

At Column 146, Line 29, Change "acryl ate" to --acrylate--.

At Column 151, Line 31 (Approx.), Change "is" to --is a--.

At Column 154, Line 55, Change "ML" to --mL--.

At Column 157, Line 40, Change "(A-4-1)" to --(A1-4-1)--.

At Column 159, Lines 9-17, Change " 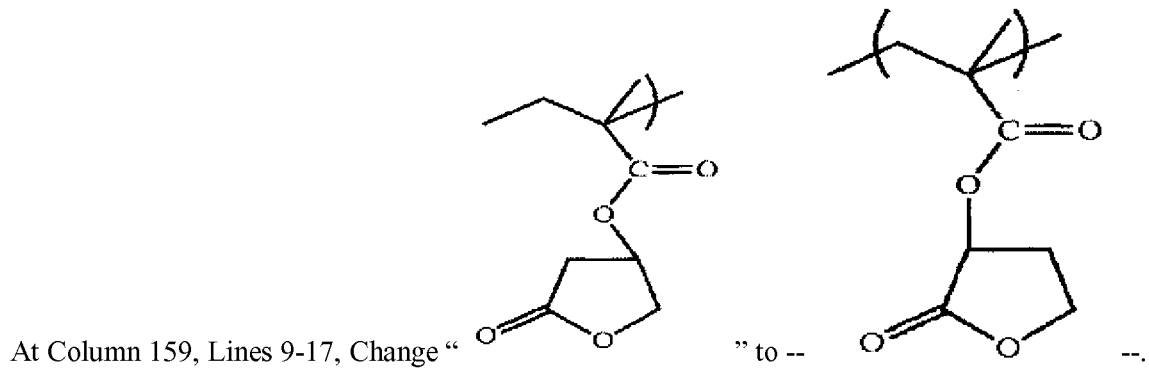 " to -- --.

At Column 160, Lines 5-14, Change " 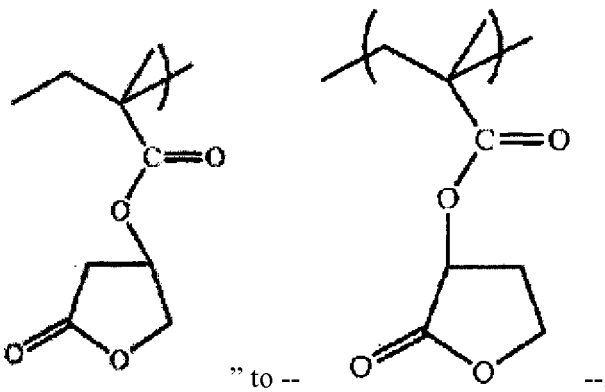 " to -- --.
At Column 161, Line 22, Change "Further" to --Further,--.
At Column 176, Line 43, Change "70° C.)." to --170° C.).--.
At Column 177, Line 16, Change "H$^b$)" to --H$^b$).--.
At Column 184, Line 44, Change "below" to --below.--.
At Column 185, Line 3, Change "refulx" to --reflux--.
At Column 185, Line 14, Change "nixed" to --mixed--.
In the Claims
At Column 195, Line 66 (Approx.), In Claim 1, change "1-hexanol" to --1-hexanol,--.